(12) United States Patent
Zhang et al.

(10) Patent No.: US 12,074,713 B2
(45) Date of Patent: Aug. 27, 2024

(54) POLAR CODE ENCODING METHOD, POLAR CODE DECODING METHOD, AND APPARATUSES THEREOF

(71) Applicant: HUAWEI TECHNOLOGIES CO., LTD., Guangdong (CN)

(72) Inventors: Huazi Zhang, Hangzhou (CN); Jiajie Tong, Hangzhou (CN); Gongzheng Zhang, Hangzhou (CN); Shengchen Dai, Hangzhou (CN); Xianbin Wang, Hangzhou (CN); Rong Li, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/067,513

(22) Filed: Dec. 16, 2022

(65) Prior Publication Data

US 2023/0124664 A1 Apr. 20, 2023

Related U.S. Application Data

(63) Continuation of application No. PCT/CN2021/100530, filed on Jun. 17, 2021.

(30) Foreign Application Priority Data

Jun. 17, 2020 (CN) .......................... 202010554839.5

(51) Int. Cl.
*H04L 1/1812* (2023.01)
*H03M 13/00* (2006.01)
(Continued)

(52) U.S. Cl.
CPC ........ *H04L 1/1819* (2013.01); *H03M 13/033* (2013.01); *H03M 13/13* (2013.01);
(Continued)

(58) Field of Classification Search
CPC ................. H04L 1/1819; H04L 1/1867; H04L 1/0057; H03M 13/033; H03M 13/611; H03M 13/6306; H03M 13/13
See application file for complete search history.

(56) References Cited

U.S. PATENT DOCUMENTS

2008/0059867 A1 3/2008 Lin et al.
2017/0132125 A1* 5/2017 Cai ..................... G06F 12/0261
(Continued)

FOREIGN PATENT DOCUMENTS

CN 108282249 A 7/2018
CN 109412608 A 3/2019
(Continued)

OTHER PUBLICATIONS

Y. Zhou, R. Li, H. Zhang, H. Luo and J. Wang, "Polarization Weight Family Methods for Polar Code Construction," 2018 IEEE 87th Vehicular Technology Conference (VTC Spring), Porto, Portugal, 2018, pp. 1-5, (Year: 2018).*
(Continued)

*Primary Examiner* — Cynthia Britt
(74) *Attorney, Agent, or Firm* — Fish & Richardson P.C.

(57) ABSTRACT

Embodiments of this application disclose a example polar code encoding methods, example polar code decoding methods, and example apparatuses thereof. One example method in embodiments of this application includes generating an input vector, where the input vector includes T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer greater than or equal to 2. Polar encoding can then be performed on the input vector to obtain an encoded bit.

20 Claims, 33 Drawing Sheets

(51) Int. Cl.
*H03M 13/03* (2006.01)
*H03M 13/13* (2006.01)
*H04L 1/00* (2006.01)
*H04L 1/1867* (2023.01)

(52) U.S. Cl.
CPC ..... *H03M 13/611* (2013.01); *H03M 13/6306* (2013.01); *H04L 1/0057* (2013.01); *H04L 1/1867* (2013.01)

(56) References Cited

U.S. PATENT DOCUMENTS

| | | | |
|---|---|---|---|
| 2017/0214416 A1 | 7/2017 | Ge et al. | |
| 2017/0366199 A1* | 12/2017 | Ge | H03M 13/09 |
| 2018/0323804 A1 | 11/2018 | Sadiq et al. | |
| 2019/0028119 A1* | 1/2019 | Yang | H03M 13/6306 |
| 2019/0393986 A1 | 12/2019 | Wang et al. | |
| 2020/0099471 A1 | 3/2020 | Ye et al. | |
| 2021/0099213 A1* | 4/2021 | Chen | H04L 1/0009 |
| 2022/0123767 A1* | 4/2022 | Bioglio | H03M 13/13 |

FOREIGN PATENT DOCUMENTS

| | | |
|---|---|---|
| CN | 110447187 A | 11/2019 |
| CN | 110945814 A | 3/2020 |
| WO | 2019158112 A1 | 8/2019 |
| WO | 2019192461 A1 | 10/2019 |
| WO | 2019239467 A1 | 12/2019 |

OTHER PUBLICATIONS

Qualcomm Incorporated, "Sequence construction of Polar codes for control channel," 3GPP TSG-RAN WG1 #90, R1-1713468, Prague, Czech Republic, Aug. 21-25, 2017, 15 pages.

Li et al., "Capacity-achieving rateless polar codes," 2016 IEEE International Symposium on In-formation Theory (ISIT), Barcelona, Spain, Jul. 10-15, 2016, 5 pages.

Jung et al., "Construction of Rate-Compatible Punctured Polar Codes Using Hierarchical Puncturing," 2018 IEEE International Symposium on Information Theory (ISIT), Vail, CO, USA, Jun. 17-22, 2018, 5 pages.

International Search Report and Written Opinion in International Appln. No. PCT/CN2021/100530, mailed on Sep. 15, 2021, 16 pages (with English translation).

* cited by examiner

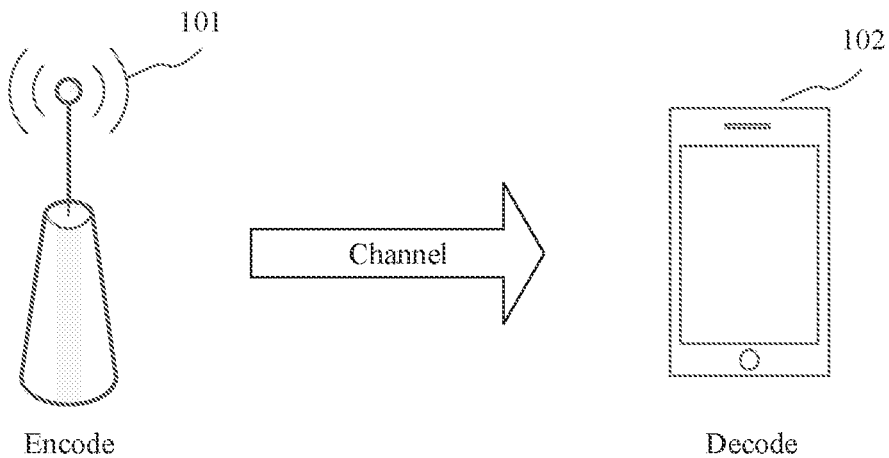
FIG. 1
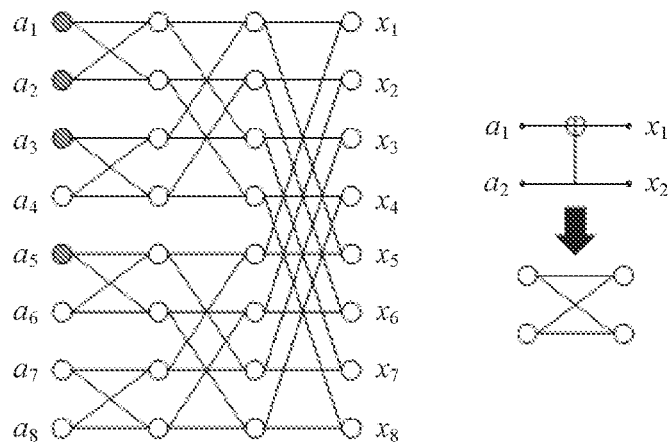
FIG. 2
FIG. 3

```
┌─────────────────────────────────────────────────────────────────┐ ─ 403
│                  Obtain K to-be-encoded bits                    │
└─────────────────────────────────────────────────────────────────┘
                                │
                                ▼
┌─────────────────────────────────────────────────────────────────┐ ─ 401
│ Generate an input vector, where the input vector includes T subblocks, a │
│ first information bit of a first subblock is obtained by replicating a second │
│             information bit of a second subblock                │
└─────────────────────────────────────────────────────────────────┘
                                │
                                ▼
┌─────────────────────────────────────────────────────────────────┐ ─ 402
│    Perform polar encoding on the input vector to obtain an encoded bit    │
└─────────────────────────────────────────────────────────────────┘
```

FIG. 4A

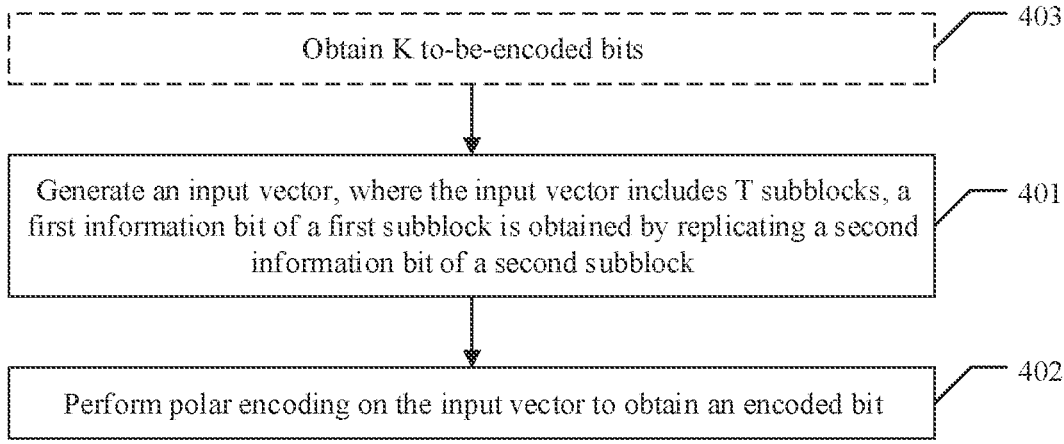

Input vector    First generator matrix

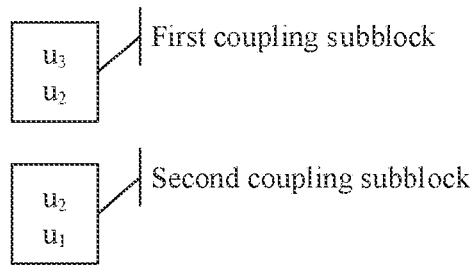
FIG. 4G
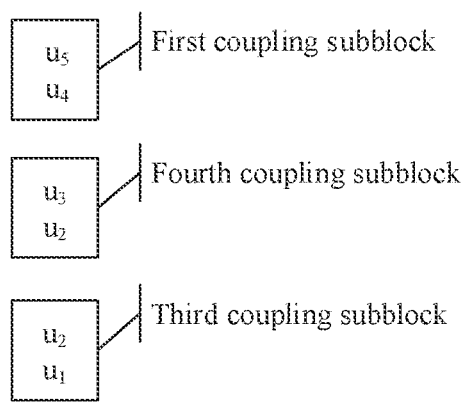
FIG. 4H
FIG. 4I

FIG. 8A

FIG. 8B

POLAR CODE ENCODING METHOD, POLAR CODE DECODING METHOD, AND APPARATUSES THEREOF

CROSS-REFERENCE TO RELATED APPLICATIONS

This application is a continuation of International Application No. PCT/CN2021/100530, filed on Jun. 17, 2021, which claims priority to Chinese Patent Application No. 202010554839.5, filed on Jun. 17, 2020. The disclosures of the aforementioned applications are hereby incorporated by reference in their entireties.

TECHNICAL FIELD

This application relates to the field of communication technologies, and in particular, to a polar code encoding method, a polar code decoding method, and apparatuses thereof.

BACKGROUND

In the field of communication technologies, a communication device (for example, a terminal device or a base station) may perform channel encoding and decoding by using polar code (polar code). When a decoder device fails in decoding, an encoder device performs retransmission to the decoder device by using a hybrid automatic repeat request (hybrid automatic repeat request, HARQ) mode to improve system performance.

Currently, the HARQ retransmission mode mainly includes incremental redundancy (incremental redundancy hybrid automatic repeat request, IR-HARQ), incremental freezing (incremental freezing hybrid automatic repeat request, IF-HARQ), and the like. Herein, the IR-HARQ is used as an example for description. In the IR-HARQ, there is an information coupling relationship between information bits in subblocks transmitted by a transmitting device for a plurality of times. In this way, although an encoding gain and decoding performance can be improved, encoding and decoding complexity are also increased. This results in high encoding and decoding complexity.

SUMMARY

Embodiments of this application provide an encoding method, a decoding method, and apparatuses thereof, to reduce encoding and decoding complexity.

A first aspect of an embodiment of this application provides an encoding method, where the method includes:
generating an input vector, where the input vector includes T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer greater than or equal to 2; and performing polar encoding on the input vector to obtain an encoded bit.

In this embodiment, in an encoding process, the first information bit of the first subblock is obtained by replicating the second information bit of the second subblock, which is equivalent to setting a coupling relationship between the information bit of the first subblock and the information bit of the second subblock. In this way, a check relationship exists between the first information bit of the first subblock and the second information bit of the second subblock. Therefore, in an encoding/decoding process, encoding/decoding may be performed based on the coupling relationship between the information bit of the first subblock and the information bit of the second subblock. In this way, encoding/decoding complexity is reduced.

In a possible implementation, the information bit of the first subblock is obtained by replicating the second information bit of the second subblock according to a mapping relationship, and the mapping relationship includes a mapping relationship between a subchannel that is of the first subblock and that carries the first information bit and a subchannel that is of the second subblock and that carries the second information bit.

In this implementation, an information bit is replicated according to a mapping relationship between subchannels to implement an information coupling relationship between the first information bit of the first subblock and the second information bit of the second subblock.

In another possible implementation, the method further includes: determining, based on a first code rate allocation table, a quantity of first information bits carried by the first subblock; and determining, based on a preset first reliability sequence, a sequence number of the subchannel that is of the first subblock and that carries the first information bit, where the first reliability sequence includes a reliability ranking of subchannels of the first subblock.

In this possible implementation, a specific manner of how to determine a quantity of information bits carried by each subblock is provided, and a subchannel that is of each subblock and that carries an information bit is determined based on a reliability sequence of subchannels of each subblock. A subchannel with high reliability is selected to carry the information bit. This helps improve transmission performance of retransmission.

In another possible implementation, the method further includes: determining, based on a second code rate allocation table, a quantity of information bits that are carried by a first coupling subblock and that are related to a second coupling subblock, where the first coupling subblock and the second coupling subblock each include at least two subblocks, the first coupling subblock is obtained by performing an exclusive OR operation on encoded bit sequences corresponding to the at least two subblocks, and the second coupling subblock is obtained by performing the exclusive OR operation on encoded bit sequences corresponding to the at least two subblocks; and determining, based on a preset second reliability sequence, a sequence number of a subchannel of an information bit that is carried by the first coupling subblock and that is related to the second coupling subblock, where the second reliability sequence includes a reliability ranking of subchannels of the first coupling subblock.

In this possible implementation, a manner of determining a quantity of information bits carried by each coupling subblock is provided, and a subchannel that is of each coupling subblock and that carries an information bit is determined by using a reliability sequence of each coupling subblock. The coupling subblock includes at least two subblocks, and the subchannel carrying the information bit is selected from the coupling subblock. In this way, reliability of subchannels can be compared in a large range, and a subchannel with high reliability is selected to carry the information bit. This helps improve transmission performance of retransmission.

In another possible implementation, the method further includes: determining, based on a preset third reliability sequence, a sequence number of the subchannel that is of the first subblock and that carries the first information bit, where the third reliability sequence includes a reliability ranking of subchannels of the T subblocks.

In this possible implementation, reliabilities of the subchannels of the T subblocks are sorted, and corresponding subchannels on the subblocks are selected from the subchannels to carry information bits (for example, subchannels with high reliability on the subblocks are selected). This helps improve transmission performance of retransmission.

In another possible implementation, the second subblock includes a third subblock, the first information bit of the first subblock is obtained by replicating an information bit of the third subblock, the first coupling subblock and the second coupling subblock include the same third subblock, and the third subblock includes a first subchannel; and the method further includes: when the first subchannel corresponds to a plurality of reliabilities, determining reliability of the first subchannel based on a first preset rule. That the first subchannel corresponds to a plurality of reliabilities includes: the first subchannel corresponds to first reliability in the first coupling subblock, and the first subchannel corresponds to second reliability in the second coupling subblock; and the first preset rule includes: when the first reliability is greater than or equal to the second reliability, the first reliability is used as the reliability of the first subchannel; when a sequence number of the first coupling subblock is after a sequence number of the second coupling subblock, the first reliability is used as the reliability of the first subchannel; when the first reliability is less than or equal to the second reliability, the second reliability is used as the reliability of the first subchannel; or when a sequence number of the first coupling subblock is before a sequence number of the second coupling subblock, the second reliability is used as the reliability of the first subchannel.

In this possible implementation, for a subchannel that belongs to subblocks of both of two different coupling subblocks, when the subchannel has a plurality of reliabilities, a specific manner of determining the reliability of the subchannel is provided. This facilitates implementation of the solution and improves integrity of the solution.

In another possible implementation, the second subblock includes a fourth subblock and a fifth subblock, the first information bits of the first subblock are obtained by replicating an information bit of the fourth subblock and an information bit of the fifth subblock, the first reliability sequence indicates a reliability ranking of subchannels of each subblock, the fourth subblock includes a second subchannel, and the fifth subblock includes a third subchannel; and the method further includes: when the second subchannel and the third subchannel have same reliability, determining the reliability of the second subchannel and the reliability of the third subchannel based on a second preset rule. That the second subchannel and the third subchannel have same reliability includes: the second subchannel corresponds to third reliability in the first reliability sequence, and the third subchannel corresponds to the third reliability in the first reliability sequence; and the second preset rule includes: when a sequence number of the fourth subblock is after a sequence number of the fifth subblock, determining that the reliability of the second subchannel is greater than the reliability of the third subchannel; or when a sequence number of the fourth subblock is before a sequence number of the fifth subblock, determining that the reliability of the third subchannel is greater than the reliability of the second subchannel.

In this possible implementation, for a case in which a plurality of subchannels have same reliability, a manner of determining the reliability of the plurality of subchannels is provided. For example, when one subchannel is selected from the plurality of subchannels, a subchannel with highest reliability may be selected, and an information bit is replicated. In this case, the reliability of the plurality of subchannels may be determined in this implementation. This improves implementability and integrity of the solution.

In another possible implementation, the second subblock includes M subblocks that are adjacent to the first subblock, or the second subblock includes M subblocks that are not adjacent to the first subblock, where M is an integer greater than or equal to 1 and less than T−1.

In this possible implementation, an information coupling degree between subblocks is configurable. Encoding and decoding complexity, and a performance gain are balanced. In addition, two subblocks in an information coupling relationship may be adjacent or non-adjacent. In this way, the information coupling degree can be set based on an actual requirement, and this helps improve transmission performance of retransmission.

In another possible implementation, the method further includes: determining the M subblocks based on a preset mapping sequence, where the first information bit of the first subblock is obtained by directly replicating an information bit of the M subblocks, and the mapping sequence indicates a mapping relationship between the T subblocks.

In this possible implementation, a specific manner of determining the M subblocks is provided, and is implemented by using the preset mapping sequence. This facilitates implementation and execution of the solution.

In another possible implementation, when T=8, the mapping relationship includes:
  a mapping relationship exists between a first subblock and a second subblock,
  a mapping relationship exists between the second subblock and a third subblock,
  a mapping relationship exists between the first subblock and a fourth subblock,
  a mapping relationship exists between the first subblock and a fifth subblock,
  a mapping relationship exists between the first subblock and a sixth subblock,
  a mapping relationship exists between the first subblock and a seventh subblock, and
  a mapping relationship exists between the first subblock and an eighth subblock; or
  the mapping sequence of the T subblocks includes:
  a mapping relationship exists between a first subblock and a second subblock,
  a mapping relationship exists between the second subblock and a third subblock,
  a mapping relationship exists between the third subblock and a fifth subblock,
  a mapping relationship exists between the fifth subblock and a sixth subblock,
  a mapping relationship exists between the sixth subblock and a seventh subblock, and
  a mapping relationship exists between the seventh subblock and an eighth subblock; or
  the mapping sequence of the T subblocks includes:
  a mapping relationship exists between a first subblock and a second subblock,
  a mapping relationship exists between the second subblock and a third subblock, a mapping relationship exists between the third subblock and a fourth subblock, a mapping relationship exists between the third subblock and a fifth subblock, a mapping relationship exists between the fifth subblock and a sixth subblock, a mapping relationship exists between the sixth subblock and a seventh subblock, and a mapping relationship exists between the seventh subblock and an eighth subblock; or the mapping sequence of the T subblocks includes:

a mapping relationship exists between a first subblock and a second subblock, a mapping relationship exists between the second subblock and a third subblock, a mapping relationship exists between the first subblock and a fourth subblock, a mapping relationship exists between the third subblock and a fifth subblock, a mapping relationship exists between the fifth subblock and a sixth subblock, a mapping relationship exists between the sixth subblock and a seventh subblock, and a mapping relationship exists between the seventh subblock and an eighth subblock.

In another possible implementation, the performing polar encoding on the input vector to obtain an encoded bit includes:

performing polar encoding on the input vector by using a first generator matrix.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer.

In an implementation, a codeword coupling degree is set by using the first generator matrix. With reference to the first aspect, an embodiment of this application provides a flexible code construction framework. In a code construction process, an appropriate information coupling degree and codeword coupling degree may be set to obtain a performance gain similar to a performance gain of an IR-HARQ. Encoding and decoding complexity, and the performance gain are balanced. A small information coupling degree may be set to reduce hardware overheads and avoid a switching network that has a complex information replication process.

In another possible implementation, a code length of each of the T subblocks is the same as a dimension of the first generator matrix core.

In another possible implementation, the location relationship between two adjacent matrix blocks in the A matrix blocks is the same as the preset location relationship.

In another possible implementation, the at least two matrix blocks overlap.

In this implementation, because the two matrix subblocks overlap, a codeword coupling relationship can exist between different subblocks.

In another possible implementation, the first generator matrix core is included on a first diagonal of the matrix block.

In another possible implementation, the plurality of first generator matrix cores in the matrix block are distributed in a lower triangular form.

In another possible implementation, distribution of the first generator matrix cores in the matrix block is the same as distribution of first elements of a second generator matrix core, a quantity of elements included in the second generator matrix core is the same as a quantity of matrix units included in the matrix block, and the matrix unit included in the matrix block is the first generator matrix core or a zero matrix.

In the foregoing process, because the distribution of the first generator matrix cores in the matrix block is the same as the distribution of the first elements of the second generator matrix core, a codeword coupling relationship between subblocks is similar to an existing encoding scheme, and encoding complexity is low.

In another possible implementation, the performing polar encoding on the input vector to obtain an encoded bit includes:

performing polar encoding on the input vector by using a first generator matrix.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2.

In this implementation, a codeword coupling degree is set by using the first generator matrix. With reference to the first aspect, an embodiment of this application provides a flexible code construction framework. In a code construction process, an appropriate information coupling degree and codeword coupling degree may be set to obtain a performance gain similar to a performance gain of an IR-HARQ. Encoding and decoding complexity, and the performance gain are balanced. A small information coupling degree may be set to reduce hardware overheads and avoid a switching network that has a complex information replication process.

In another possible implementation, the first submatrix block and the second submatrix block do not have an overlapping element.

In another possible implementation, a size of the second generator matrix is v×v, and an element of the second generator matrix satisfies: $a_{i,j}=a_{i+u,j+u}$, where i is an integer, j is an integer, v is a positive integer, u is an integer, $1 \le i<v$, $1 \le j<v$, $1<i+u \le v$, and $1<j+u \le v$.

In this possible implementation, when the second generator matrix satisfies $a_{i,j}=a_{i+u,j+u}$, the second generator matrix satisfies self-similarity. In this way, a codeword coupling degree can be set by using the first generator matrix. In a code construction process, an appropriate information coupling degree and codeword coupling degree may be set to obtain a performance gain similar to a performance gain of an IR-HARQ. Encoding and decoding complexity, and the performance gain are balanced.

In another possible implementation, elements of the second generator matrix are symmetrical along a secondary diagonal of the second generator matrix. It can be learned from this implementation that the elements of the second generator matrix are symmetrical along the diagonal of the second generator matrix. In this way, encoding complexity is low.

In another possible implementation, A is a minimum integer that enables a first condition to be satisfied, and the first condition is that a size of the first generator matrix is greater than or equal to a code length M of the T subblocks included in the input vector.

In another possible implementation, A satisfies the following relationship: $v+(A-2)*u<M\leq v+(A-1)*u$.

v is a size of the second generator matrix, M is the code length M of the T subblocks included in the input vector, and M is an integer greater than 1.

A second aspect of an embodiment of this application provides a decoding method, where the method includes:

receiving to-be-decoded bit information, where the to-be-decoded bit information includes information about a bit of a first subblock and information about a bit of a second subblock, the bit of the first subblock is obtained by replicating the bit of the second subblock, and a sequence number of the second subblock is after a sequence number of the first subblock; and performing polar decoding based on the to-be-decoded bit information to obtain a polar decoded bit.

In this embodiment, because the bit of the first subblock is obtained by replicating the bit of the second subblock, which is equivalent to setting an information coupling relationship between the bit of the first subblock and the bit of the second subblock, a check relationship exists between the bit of the first subblock and the bit of the second subblock. Therefore, in a decoding process, decoding may be performed based on the information coupling relationship between the bit of the first subblock and the bit of the second subblock. In this way, encoding/decoding complexity is reduced.

In a possible implementation, that the bit of the first subblock is obtained by replicating the bit of the second subblock includes: obtaining a first information bit of the first subblock by replicating a second information bit of the second subblock according to a mapping relationship, where the mapping relationship includes a mapping relationship between a subchannel that is of the first subblock and that carries the first information bit and a subchannel that is of the second subblock and that carries the second information bit.

In this possible implementation, an information bit is replicated according to a mapping relationship between subchannels to implement an information coupling relationship between the first information bit of the first subblock and the second information bit of the second subblock.

In another possible implementation, the performing polar decoding based on the to-be-decoded bit information to obtain a polar decoded bit includes: performing polar decoding on the to-be-decoded bit information based on a first generator matrix and according to the mapping relationship, to obtain the polar decoded bit.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer. The mapping relationship includes the mapping relationship between the subchannel that is of the first subblock and that carries the first information bit and the subchannel that is of the second subblock and that carries the second information bit, and T is an integer greater than or equal to 2.

In an implementation, a codeword coupling degree is set by using the first generator matrix. With reference to the first aspect, an embodiment of this application provides a flexible code construction framework. In a code construction process, an appropriate information coupling degree and codeword coupling degree may be set to obtain a performance gain similar to a performance gain of an IR-HARQ. Encoding and decoding complexity, and the performance gain are balanced. Correspondingly, in a decoding process, polar decoding is performed with reference to the first generator matrix and the mapping relationship.

In another possible implementation, the to-be-decoded bit information includes Q first log likelihood ratios LLR, and Q is a positive integer.

In another possible implementation, the Q first LLRs include P first LLR sequences, the first LLR sequence includes at least two first LLRs, and P is an integer greater than or equal to 2; and the performing polar decoding on the to-be-decoded bit information based on a first generator matrix and according to the mapping relationship, to obtain the polar decoded bit includes: determining P second LLR sequences corresponding to the P first LLR sequences, where one first LLR sequence corresponds to one subblock, and one second LLR sequence corresponds to one subblock; determining, based on a $P^{th}$ second LLR sequence to obtain a codeword decoding result of a $P^{th}$ subblock and an information decoding result of the $P^{th}$ subblock; and determining, based on at least one codeword decoding result of a subblock from a codeword decoding result of an $(i+1)^{th}$ subblock to the codeword decoding result of the $P^{th}$ subblock, at least one information decoding result of a subblock from an information decoding result of the $(i+1)^{th}$ subblock to the information decoding result of the $P^{th}$ subblock, and an $i^{th}$ second LLR sequence, a codeword decoding result of an $i^{th}$ subblock and an information decoding result of the $i^{th}$ subblock, where i is an integer ranging from 1 to P−1.

In this possible implementation, the appropriate information coupling degree and codeword coupling degree may be set in the code construction process based on the code construction framework in this embodiment of this application. Therefore, in the decoding process, an information decoding result and a codeword decoding result of another subblock may be combined to assist in decoding information of a current subblock, to reduce decoding complexity.

In another possible implementation, the location relationship between two adjacent matrix blocks in the A matrix blocks is the same as the preset location relationship.

In another possible implementation, the performing polar decoding based on the to-be-decoded bit information to obtain a polar decoded bit includes: performing polar decoding on the to-be-decoded bit information based on a first generator matrix and according to the mapping relationship, to obtain the polar decoded bit.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2. The mapping relationship includes the mapping relationship between the subchannel that is of the first subblock and that carries the first information bit and the subchannel that is of the second subblock and that carries the second information bit, and T is an integer greater than or equal to 2.

In an implementation, a codeword coupling degree is set by using the first generator matrix. With reference to the first aspect, an embodiment of this application provides a flexible code construction framework. In a code construction process, an appropriate information coupling degree and codeword coupling degree may be set to obtain a performance gain similar to a performance gain of an IR-HARQ. Encoding and decoding complexity, and the performance gain are balanced. Correspondingly, in a decoding process, polar decoding is performed with reference to the first generator matrix and the mapping relationship.

A third aspect of an embodiment of this application provides an encoding apparatus, where the encoding apparatus includes:

a generation unit, configured to generate an input vector, where the input vector includes T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer greater than or equal to 2; and an encoding unit, configured to perform polar encoding on the input vector to obtain an encoded bit.

In a possible implementation, the information bit of the first subblock is obtained by replicating the second information bit of the second subblock according to a mapping relationship, and the mapping relationship includes a mapping relationship between a subchannel that is of the first subblock and that carries the first information bit and a subchannel that is of the second subblock and that carries the second information bit.

In another possible implementation, the encoding apparatus further includes a determining unit.

The determining unit is configured to: determine, based on a first code rate allocation table, a quantity of first information bits carried by the first subblock; and determine, based on a preset first reliability sequence, a sequence number of the subchannel that is of the first subblock and that carries the first information bit, where the first reliability sequence includes a reliability ranking of subchannels of the first subblock.

In another possible implementation, the encoding apparatus further includes a determining unit.

The determining unit is configured to: determine, based on a second code rate allocation table, a quantity of information bits that are carried by a first coupling subblock and that are related to a second coupling subblock, where the first coupling subblock and the second coupling subblock each include at least two subblocks, the first coupling subblock is obtained by performing an exclusive OR operation on encoded bit sequences corresponding to the at least two subblocks, and the second coupling subblock is obtained by performing the exclusive OR operation on encoded bit sequences corresponding to the at least two subblocks; and determine, based on a preset second reliability sequence, a sequence number of a subchannel of an information bit that is carried by the first coupling subblock and that is related to the second coupling subblock, where the second reliability sequence includes a reliability ranking of subchannels of the first coupling subblock.

In another possible implementation, the encoding apparatus further includes a determining unit.

The determining unit is configured to: determine, based on a preset third reliability sequence, a sequence number of the subchannel that is of the first subblock and that carries the first information bit, where the third reliability sequence includes a reliability ranking of subchannels of the T subblocks.

In another possible implementation, the second subblock includes a third subblock, the first information bit of the first subblock is obtained by replicating an information bit of the third subblock, the first coupling subblock and the second coupling subblock include the same third subblock, and the third subblock includes a first subchannel; and the determining unit is further configured to:

when the first subchannel corresponds to a plurality of reliabilities, determine reliability of the first subchannel based on a first preset rule.

That the first subchannel corresponds to a plurality of reliabilities includes: the first subchannel corresponds to first reliability in the first coupling subblock, and the first subchannel corresponds to second reliability in the second coupling subblock; and the first preset rule includes: when the first reliability is greater than or equal to the second reliability, the first reliability is used as the reliability of the first subchannel; when a sequence number of the first coupling subblock is after a sequence number of the second coupling subblock, the first reliability is used as the reliability of the first subchannel; when the first reliability is less than or equal to the second reliability, the second reliability is used as the reliability of the first subchannel; or when a sequence number of the first coupling subblock is before a sequence number of the second coupling subblock, the second reliability is used as the reliability of the first subchannel.

In another possible implementation, the second subblock includes a fourth subblock and a fifth subblock, the first information bits of the first subblock are obtained by replicating an information bit of the fourth subblock and an information bit of the fifth subblock, the first reliability sequence indicates a reliability ranking of subchannels of each subblock, the fourth subblock includes a second subchannel, and the fifth subblock includes a third subchannel; and the determining unit is further configured to:

when the second subchannel and the third subchannel have same reliability, determine the reliability of the second subchannel and the reliability of the third subchannel based on a second preset rule.

That the second subchannel and the third subchannel have same reliability includes: the second subchannel corresponds to third reliability in the first reliability sequence, and the third subchannel corresponds to the third reliability in the first reliability sequence; and the second preset rule includes: when a sequence number of the fourth subblock is after a sequence number of the fifth subblock, it is determined that the reliability of the second subchannel is greater than the reliability of the third subchannel; or when a sequence number of the fourth subblock is before a sequence number of the fifth subblock, it is determined that the reliability of the third subchannel is greater than the reliability of the second subchannel.

In another possible implementation, the second subblock includes M subblocks that are adjacent to the first subblock, or the second subblock includes M subblocks that are not adjacent to the first subblock, where M is an integer greater than or equal to 1 and less than T−1.

In another possible implementation, the determining unit is further configured to:
  determine the M subblocks based on a preset mapping sequence, where the first information bit of the first subblock is obtained by directly replicating an information bit of the M subblocks, and the mapping sequence indicates a mapping relationship between the T subblocks.

In another possible implementation, when T=8, the mapping relationship includes:
  a mapping relationship exists between a first subblock and a second subblock,
  a mapping relationship exists between the second subblock and a third subblock,
  a mapping relationship exists between the first subblock and a fourth subblock,
  a mapping relationship exists between the first subblock and a fifth subblock,
  a mapping relationship exists between the first subblock and a sixth subblock,
  a mapping relationship exists between the first subblock and a seventh subblock, and
  a mapping relationship exists between the first subblock and an eighth subblock; or
  the mapping sequence of the T subblocks includes:
  a mapping relationship exists between a first subblock and a second subblock,
  a mapping relationship exists between the second subblock and a third subblock,
  a mapping relationship exists between the third subblock and a fifth subblock,
  a mapping relationship exists between the fifth subblock and a sixth subblock,
  a mapping relationship exists between the sixth subblock and a seventh subblock, and
  a mapping relationship exists between the seventh subblock and an eighth subblock; or
  the mapping sequence of the T subblocks includes:
  a mapping relationship exists between a first subblock and a second subblock,
  a mapping relationship exists between the second subblock and a third subblock,
  a mapping relationship exists between the third subblock and a fourth subblock,
  a mapping relationship exists between the third subblock and a fifth subblock,
  a mapping relationship exists between the fifth subblock and a sixth subblock,
  a mapping relationship exists between the sixth subblock and a seventh subblock, and
  a mapping relationship exists between the seventh subblock and an eighth subblock; or
  the mapping sequence of the T subblocks includes:
  a mapping relationship exists between a first subblock and a second subblock,
  a mapping relationship exists between the second subblock and a third subblock,
  a mapping relationship exists between the first subblock and a fourth subblock,
  a mapping relationship exists between the third subblock and a fifth subblock,
  a mapping relationship exists between the fifth subblock and a sixth subblock,
  a mapping relationship exists between the sixth subblock and a seventh subblock, and
  a mapping relationship exists between the seventh subblock and an eighth subblock.

In another possible implementation, the encoding unit is specifically configured to:
  perform polar encoding on the input vector by using a first generator matrix.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer.

In another possible implementation, a code length of each of the T subblocks is the same as a dimension of the first generator matrix core.

In another possible implementation, the location relationship between two adjacent matrix blocks in the A matrix blocks is the same as the preset location relationship.

In another possible implementation, the at least two matrix blocks overlap.

In another possible implementation, the first generator matrix core is included on a first diagonal of the matrix block.

In another possible implementation, the plurality of first generator matrix cores in the matrix block are distributed in a lower triangular form.

In another possible implementation, distribution of the first generator matrix cores in the matrix block is the same as distribution of first elements of a second generator matrix core, a quantity of elements included in the second generator matrix core is the same as a quantity of matrix units included in the matrix block, and the matrix unit included in the matrix block is the first generator matrix core or a zero matrix.

In another possible implementation, the encoding unit is specifically configured to:
  perform polar encoding on the input vector by using a first generator matrix.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2.

In another possible implementation, the first submatrix block and the second submatrix block do not have an overlapping element.

In another possible implementation, a size of the second generator matrix is v×v, and an element of the second generator matrix satisfies: $a_{i,j}=a_{i+u,j+u}$, where i is an integer, j is an integer, v is a positive integer, u is an integer, $1 \leq i < v$, $1 \leq j < v$, $1 < i+u \leq v$, and $1 < j+u \leq v$.

In another possible implementation, elements of the second generator matrix are symmetrical along a secondary diagonal of the second generator matrix.

In another possible implementation, A is a minimum integer that enables a first condition to be satisfied, and the first condition is that a size of the first generator matrix is greater than or equal to a code length M of the T subblocks included in the input vector.

In another possible implementation, A satisfies the following relationship: $v+(A-2)*u < M \leq v+(A-1)*u$.

v is a size of the second generator matrix, M is the code length M of the T subblocks included in the input vector, and M is an integer greater than 1.

A fourth aspect of an embodiment of this application provides a decoding apparatus, where the decoding apparatus includes:

a receiving unit, configured to receive to-be-decoded bit information, where the to-be-decoded bit information includes information about a bit of a first subblock and information about a bit of a second subblock, the bit of the first subblock is obtained by replicating the bit of the second subblock, and a sequence number of the second subblock is after a sequence number of the first subblock; and a decoding unit, configured to perform polar decoding based on the to-be-decoded bit information to obtain a polar decoded bit.

In a possible implementation, that the bit of the first subblock is obtained by replicating the bit of the second subblock includes: obtaining a first information bit of the first subblock by replicating a second information bit of the second subblock according to a mapping relationship, where the mapping relationship includes a mapping relationship between a subchannel that is of the first subblock and that carries the first information bit and a subchannel that is of the second subblock and that carries the second information bit.

In another possible implementation, the decoding unit is specifically configured to:

perform polar decoding on the to-be-decoded bit information based on a first generator matrix and according to the mapping relationship, to obtain the polar decoded bit.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer. The mapping relationship includes the mapping relationship between the subchannel that is of the first subblock and that carries the first information bit and the subchannel that is of the second subblock and that carries the second information bit, and T is an integer greater than or equal to 2.

In another possible implementation, the to-be-decoded bit information includes Q first log likelihood ratios LLR, and Q is a positive integer.

In another possible implementation, the Q first LLRs include P first LLR sequences, the first LLR sequence includes at least two first LLRs, and P is an integer greater than or equal to 2; and the decoding unit is specifically configured to:

determine P second LLR sequences corresponding to the P first LLR sequences, where one first LLR sequence corresponds to one subblock, and one second LLR sequence corresponds to one subblock;

determine, based on a $P^{th}$ second LLR sequence to obtain a codeword decoding result of a $P^{th}$ subblock and an information decoding result of the $P^{th}$ subblock; and determine, based on at least one codeword decoding result of a subblock from a codeword decoding result of an $(i+1)^{th}$ subblock to the codeword decoding result of the $P^{th}$ subblock, at least one information decoding result of a subblock from an information decoding result of the $(i+1)^{th}$ subblock to the information decoding result of the $P^{th}$ subblock, and an $i^{th}$ second LLR sequence, a codeword decoding result of an $i^{th}$ subblock and an information decoding result of the $i^{th}$ subblock, where i is an integer ranging from 1 to P−1.

In another possible implementation, the location relationship between two adjacent matrix blocks in the A matrix blocks is the same as the preset location relationship.

In another possible implementation, the decoding unit is specifically configured to:

perform polar decoding on the to-be-decoded bit information based on a first generator matrix and according to the mapping relationship, to obtain the polar decoded bit.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2. The mapping relationship includes the mapping relationship between the subchannel that is of the first subblock and that carries the first information bit and the subchannel that is of the second subblock and that carries the second information bit, and T is an integer greater than or equal to 2.

A fifth aspect of an embodiment of this application provides an encoding apparatus, including a memory, a processor, and a computer program. The computer program is stored in the memory, and the processor runs the computer program to perform the encoding method according to any implementation of the first aspect.

A sixth aspect of an embodiment of this application provides a decoding apparatus, including a memory, a processor, and a computer program. The computer program is stored in the memory, and the processor runs the computer program to perform the decoding method according to any implementation of the second aspect.

A seventh aspect of an embodiment of this application provides a storage medium, where the storage medium includes a computer program, and the computer program is used to perform the encoding method according to any implementation of the first aspect.

An eighth aspect of an embodiment of this application provides a storage medium, where the storage medium includes a computer program, and the computer program is used to perform the decoding method according to any implementation of the second aspect.

A ninth aspect of an embodiment of this application provides an encoding apparatus, where the encoding apparatus may include a communication interface and a logic circuit.

The logic circuit is configured to: generate an input vector, where the input vector includes T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer greater than or equal to 2; and perform polar encoding on the input vector to obtain an encoded bit.

The communication interface is configured to output the encoded bit.

In a possible implementation, the logic circuit may further perform the encoding method according to any implementation of the first aspect.

A tenth aspect of an embodiment of this application provides a decoding apparatus, where the decoding apparatus may include an input interface and a logic circuit.

The input interface is configured to receive to-be-decoded bit information, where the to-be-decoded bit information includes information about a bit of a first subblock and information about a bit of a second subblock, the bit of the first subblock is obtained by replicating the bit of the second subblock, and a sequence number of the second subblock is after a sequence number of the first subblock.

The logic circuit is configured to perform polar decoding based on the to-be-decoded bit information to obtain a polar decoded bit.

In a possible implementation, the logic circuit may further perform the decoding method according to any implementation of the second aspect.

According to the foregoing technical solutions, it can be learned that embodiments of this application have the following advantages.

It can be learned from the foregoing solution that the input vector is generated, where the input vector includes the T subblocks, the first information bit of the first subblock is obtained by replicating the second information bit of the second subblock, the first subblock and the second subblock are the subblocks of the T subblocks, the sequence number of the first subblock is after the sequence number of the second subblock, and T is an integer ranging from 2 to T. Polar encoding is performed on the input vector to obtain the encoded bit. It can be learned that, in the encoding process, the first information bit of the first subblock is obtained by replicating the second information bit of the second subblock, which is equivalent to setting the coupling relationship between the information bit of the first subblock and the information bit of the second subblock. In this way, the check relationship exists between the first information bit of the first subblock and the second information bit of the second subblock. Therefore, in the encoding/decoding process, encoding/decoding may be performed based on the coupling relationship between the information bit of the first subblock and the information bit of the second subblock. In this way, encoding/decoding complexity is reduced.

BRIEF DESCRIPTION OF DRAWINGS

FIG. 1 is a diagram of an architecture of a communication system according to an embodiment of this application;

FIG. 2 is a coding diagram according to an embodiment of this application;

FIG. 3 is a schematic diagram of a scenario of an encoding method according to an embodiment of this application;

FIG. 4A is a schematic flowchart of an encoding method according to an embodiment of this application;

FIG. 4B is a schematic diagram of another scenario of an encoding method according to an embodiment of this application;

FIG. 4C is a schematic diagram of another scenario of an encoding method according to an embodiment of this application;

FIG. 4G is a schematic diagram of another scenario of an encoding method according to an embodiment of this application;

FIG. 4H is a schematic diagram of another scenario of an encoding method according to an embodiment of this application;

FIG. 4I is a schematic diagram of another scenario of an encoding method according to an embodiment of this application;

FIG. 8A is a schematic diagram of a third generator matrix according to an embodiment of this application;

FIG. 8B is another schematic diagram of a third generator matrix according to an embodiment of this application;

DESCRIPTION OF EMBODIMENTS

Figure 4D:
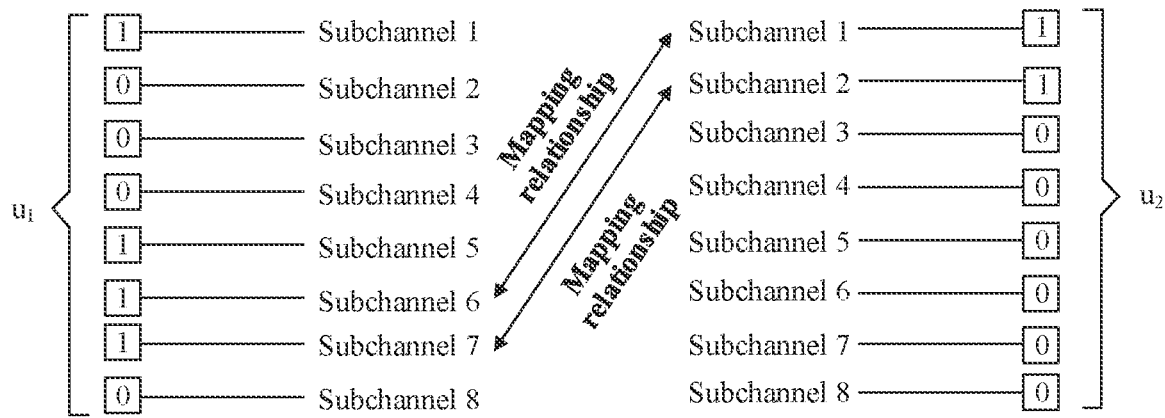
FIG. 4D is a schematic diagram of another scenario of an encoding method according to an embodiment of this application.

Embodiments of this application provide an encoding method, a decoding method, and apparatuses thereof, to reduce encoding and decoding complexity.

Embodiments of this application are used in various fields in which polar encoding is used, for example, a data storage field, an optical network communication field, a wireless communication field, and the like. A wireless communication system mentioned in embodiments of this application includes but is not limited to a narrowband Internet of things (narrow band-internet of things, NB-IoT) system, a WiMAX system, a long term evolution (long term evolution, LTE) system, and three application scenarios of next-generation 5G mobile communication system new radio (new radio, NR): enhanced mobile broadband (enhanced mobile broad band, eMBB), ultra-reliable low-latency communication (ultra reliable low latency communication, URLLC), and massive machine-type communication (massive machine-type communications, mMTC). Certainly, there may be another field in which polar encoding is used. This is not specifically limited in this application. Embodiments of this application are applicable to a hybrid automatic repeat request (hybrid automatic repeat request, HARQ) scenario in a communication system, to adapt to channel fading and changes. In embodiments of this application, an information coupling relationship between some subblocks is implemented by using a replication relationship of information bits between the some subblocks of T subblocks in an input vector. Further, a codeword coupling relationship exists between the some subblocks of the T subblocks. In this way, encoding and decoding complexity are reduced while ensuring original IR-HARQ performance.

For ease of understanding, the following describes, with reference to FIG. 1, a diagram of an architecture of a communication system to which embodiments of this application are applicable.

FIG. 1 is a diagram of an architecture of a communication system according to this application. Refer to FIG. 1. A sending device 101 and a receiving device 102 are included.

Optionally, when the sending device 101 is a terminal device, the receiving device 102 is a network device. When the sending device 101 is a network device, the receiving device 102 is a terminal device.

Refer to FIG. 1. The sending device 101 includes an encoder, so that the sending device 101 can perform polar encoding and output an encoded sequence. After rate matching, interleaving, and modulation are performed on the encoded sequence, the encoded sequence is transmitted to the receiving device 102 through a channel. The receiving device 102 includes a decoder. The receiving device 102 may receive a signal sent by the sending device 101, and decode the received signal.

It should be noted that FIG. 1 is merely an example of a diagram of an architecture of a communication system, and does not limit the diagram of the architecture of the communication system.

For ease of understanding, the following describes concepts in embodiments of this application.

A terminal device includes but is not limited to a mobile station (mobile station, MS), a mobile terminal (mobile terminal, MT), a mobile phone (mobile telephone, MT), a handset (handset), portable equipment (portable equipment), and the like. The terminal device may communicate with one or more core networks through a radio access network (radio access network, RAN). For example, the terminal device may be a mobile phone (or referred to as a "cellular" phone), a computer having a wireless communication function, or the like. Alternatively, the terminal device may be a portable, pocket-sized, handheld, computer built-in, or vehicle-mounted mobile apparatus or device.

A network device may be an evolved NodeB (evolved node B, eNB or eNodeB) in an LTE system; a network device may be a gNB, a transmission reception point (transmission reception point, TRP), a micro base station, or the like in a 5G communication system; a network device may be a relay station, an access point, a vehicle-mounted device, a wearable device, or a network device in a future evolved public land mobile network (public land mobile network, PLMN), a base station in another network integrating a plurality of technologies, a base station in various other evolved networks, or the like.

Polar encoding may alternatively be polar coding, and polar encoding may be described in the following two manners.

In a manner, an encoding process may be expressed by using a generator matrix, that is, $x_1^N = a_1^N G_N$.

$a_1^N$ is a row vector, $a_1^N = (a_1, a_2, a_N)$, N is a code length, and N is an integer greater than or equal to 1. $a_i$ is an unencoded bit, i is an integer ranging from 1 to N. $a_1^N$ includes information bits and/or frozen bits, that is, $a_i$ may be the information bit or the frozen bit. The information bit is a bit used to carry information, and the information bit may include a cyclic redundancy check (Cyclic Redundancy Check, CRC) bit and/or a parity check (Parity Check, PC) bit. The frozen bit is a padding bit, and the frozen bit may be usually 0.

$G_N$ is a generator matrix, $G_N$ is an N×N matrix, and $G_N = B_N F_2^{\otimes(log_2(N))}$. $B_N$ is an N×N transpose matrix, for example, $B_N$ may be a bit reversal (bit reversal) matrix.

$$F_2 = \begin{bmatrix} 1 & 0 \\ 1 & 1 \end{bmatrix},$$

and $F_2^{\otimes(log_2(N))}$ is a kronecker (kronecker) product of $log_2$(N) matrices $F_2$. Both addition and multiplication above are operations in the binary Galois field (Galois field). $G_N$ may also be referred to as a generator matrix core.

In another manner, an encoding process may be expressed by using a coding diagram.

The following describes the coding diagram with reference to FIG. 2.

FIG. 2 is a coding diagram according to an embodiment of this application. Refer to FIG. 2. An encoding length corresponding to the coding diagram is 8, each circle in a first column indicates one information bit or frozen bit, and $a_1$, $a_2$, $a_8$ shown in the first column are unencoded bits (information bits or frozen bits), where $a_4$, $a_6$, $a_7$, $a_8$ are information bits, and $a_1$, $a_2$, $a_3$, $a_5$ are frozen bits. Each circle in columns other than the first column indicates one partial sum (partial sum) bit. $x_1, x_2, \ldots, x_8$ in a last column are encoded bits. Each butterfly diagram (shown on the right side of the figure) indicates one polarization of two bits, that is, $x_1^2 = a_1^2 G_2$.

A subblock includes a plurality of information bits and/or a plurality of frozen bits. Optionally, all bits included in the subblock are information bits; all bits included in the subblock are frozen bits; or some bits included in the subblock are information bits, and some bits are frozen bits.

For example, a subblock $u_1 = (1,1,1,1,1,1,1,1)$, where "1" refers to an information bit, and "0" refers to a frozen bit. It can be learned that all bits included in the subblock $u_1$ are information bits "1". For another example, if a subblock $u_1 = (1,0,0,0,1,1,1,0)$, it can be learned that $u_1$ includes a plurality of information bits "1" and a plurality of frozen bits "0". For another example, a subblock $u_1 = (0,0,0,0,0,0,0,0)$, and it can be learned that all bits included in the subblock $u_1$ are frozen bits "0".

A sequence number of a subblock is a sequence number of the subblock sorted in sequence. Sequence numbers of subblocks indicate a location relationship between subblocks sorted in sequence. For example, as shown in FIG. 3, an input vector includes a first subblock a second subblock $u_2, \ldots$, and an eighth subblock $u_8$, that is, a sequence number of the first subblock $u_1$ is 1, a sequence number of the second subblock $u_2$ is 2, and the rest may be deduced by analogy. It may be understood that the sequence number of the second subblock $u_2$ is after the sequence number of the first subblock $u_1$, and a sequence number of the eighth subblock $u_8$ is after the sequence number of the second subblock $u_2$.

An information coupling relationship means that in an encoding process, an information bit of a subblock is obtained by directly replicating an information bit of another subblock. In this case, the information coupling relationship exists between the two subblocks. As shown in FIG. 3, in the encoding process, an information bit of the second subblock is obtained by directly replicating an information bit of the first subblock. In this case, the information coupling relationship exists between the first subblock and the second subblock.

A codeword coupling relationship means that in an encoding process, an exclusive OR operation (the exclusive OR operation is an indication manner in binary, and is indicated as an addition operation in decimal; and "+" is used in subsequent schematic diagrams to show the addition operation in decimal) is performed on encoded bit sequences corresponding to two subblocks, and the codeword coupling relationship exists between the two subblocks. For example, as shown in FIG. 3, in the encoding process, if an encoded bit sequence c1 corresponding to the first subblock and an encoded bit sequence c2 corresponding to the second subblock are added, it can be learned that the codeword coupling relationship exists between c1 and c2. It is briefly referred to as that in the following description: the codeword coupling relationship exists between the first subblock and the second subblock.

A coupling subblock includes at least two subblocks, and encoded bit sequences corresponding to the at least two subblocks are obtained by performing an exclusive OR operation. It may be briefly referred to as that a codeword coupling relationship exists between the at least two subblocks. For example, as shown in FIG. 3, in an encoding process, if an encoded bit sequence c1 corresponding to the first subblock and an encoded bit sequence c2 corresponding to the second subblock are added, it can be learned that the codeword coupling relationship exists between c1 and c2. In this case, the first subblock and the second subblock may form a coupling subblock.

A sequence number of a coupling subblock is a sequence number of a subblock with the first sequence number in at least two subblocks included in the coupling subblock, or a sequence number of a subblock with the last sequence number in the at least two subblocks included in the coupling subblock. For example, a first coupling subblock includes a third subblock $u_3$ and a fourth subblock $u_4$, a second coupling subblock includes a first subblock and a second subblock $u_2$, and a sequence number of a subblock whose sequence number is the first is a sequence number of the coupling subblock. Therefore, it can be learned that a subblock whose sequence number is the first in the first coupling subblock is the third subblock $u_3$, and a subblock whose sequence number is the last in the second coupling subblock is the first subblock $u_1$. It can be learned that the sequence number of the third subblock $u_3$ is after the sequence number of the first subblock $u_1$. In this way, the sequence number of the first coupling subblock is after the sequence number of the second coupling subblock, or the sequence number of the second coupling subblock is before the sequence number of the first coupling subblock. For another example, a first coupling subblock includes a second subblock $u_2$ and a third subblock $u_3$, a second coupling subblock includes a first subblock $u_1$ and a second subblock $u_2$, and a sequence number of a subblock whose sequence number is the last is a sequence number of the coupling subblock. Therefore, it can be learned that a subblock whose sequence number is the first in the first coupling subblock is the third subblock $u_3$, and a subblock whose sequence number is the last in the second coupling subblock is the second subblock $u_2$. It can be learned that the sequence number of the third subblock $u_3$ is after the sequence number of the second subblock $u_2$. In this way, the sequence number of the first coupling subblock is after the sequence number of the second coupling subblock, or the sequence number of the second coupling subblock is before the sequence number of the first coupling subblock.

An information decoding result means that a decoder decodes received bit information to obtain a bit sequence before encoding.

A codeword decoding result means that a decoder encodes an obtained bit sequence before encoding to obtain an encoded bit sequence.

It should be noted that, in this embodiment of this application, an example in which start coordinates (coordinates at the topmost-left corner) in a matrix are (1, 1) is used for description. Certainly, the start coordinates in the matrix may alternatively be (0, 0). This is not specifically limited in this embodiment of this application.

FIG. 4A is a schematic diagram of an embodiment of an encoding method according to an embodiment of this application. In FIG. 4A, the method includes the following steps.

401: Generate an Input Vector.

The input vector includes T subblocks, a first information bit of a first subblock of the T subblocks is obtained by replicating a second information bit of a second subblock of the T subblocks, a sequence number of the first subblock is after a sequence number of the second subblock, and T is an integer greater than or equal to 2. Optionally, first information bits are all or some information bits of the second subblock.

First, a code length of each of the T subblocks is first described. Optionally, the code length of each of the T subblocks may be the same or may be different.

For a case in which code lengths of the T subblocks are the same, a first subblock $u_1$ and a second subblock $u_2$ shown in FIG. 3 are used as an example for description herein. This is also the same for code lengths of other subblocks. For example, the first subblock $u_1$=(1,0,0,0,1,1,1,0), and the second subblock $u_2$=(1,1,0,0,0,0,0,0), where "1" refers to an information bit, and "0" refers to a frozen bit. It can be learned that a code length of the first subblock $u_1$ is 8, and a code length of the second subblock $u_2$ is also 8.

For a case in which code lengths of the T subblocks are different, a first subblock $u_1$ and a second subblock $u_2$ shown in FIG. 3 are used as an example for description herein. This is also the same for code lengths of other subblocks are also different. The first subblock $u_1$=(1,0,0,0,1,1,1,0), and the second subblock $u_2$=(1,0,0,0,0,0), where "1" refers to an information bit, and "0" refers to a frozen bit. It can be learned that a code length of the first subblock $u_1$ is 8, a code length of the second subblock $u_2$ is 6, and the code length of the first subblock $u_1$ and the code length of the second subblock $u_2$ are different.

In the following embodiment or implementation, an example in which the code length of each of the T subblocks is the same is used for description.

For example, an encoding scenario shown in FIG. 3 is used as an example. A first subblock is a first subblock $u_1$, and a second subblock is a second subblock $u_2$, that is, the second subblock $u_2$ is after the first subblock $u_1$. A first information bit of the second subblock $u_2$ is obtained by directly replicating a second information bit of the first subblock $u_1$. It should be noted that a subchannel other than a subchannel that is of the second subblock $u_2$ and that carries the first information bit may carry a frozen bit or carry a new information bit. This is not limited in this application. In the following embodiment or implementation, only an example in which a subchannel other than a subchannel that is of the first subblock and that carries a first information bit is used for description. It is described in the following description that the first information bit carried by the first subblock is briefly referred to as an information bit carried by the first subblock, and that the second information bit carried by the second subblock is briefly referred to as an information bit carried by the second subblock.

A sequence number of the first subblock is after a sequence number of the second subblock. Optionally, second subblocks are M subblocks that are adjacent to the first subblock, or second subblocks are M subblocks that are not adjacent to the first subblock, where M is an integer greater than or equal to 1 and less than T−1.

Information bits of the first subblock are obtained by directly replicating information bits of the M subblocks.

First, with reference to FIG. 3 and FIG. 4B, an example is used to describe that the second subblocks are the M subblocks that are adjacent to the first subblock.

Example 1: Refer to FIG. 3. It can be learned from an input vector shown in FIG. 3 that, starting from a second subblock, an information bit of a subblock is obtained by replicating an information bit of a previous subblock that is adjacent to the subblock. In this implementation, the second subblock is one subblock that is adjacent to a first subblock. For example, the first subblock is $u_2$, and the second subblock is $u_1$.

Example 2: Refer to FIG. 4B. It can be learned from an input vector shown in FIG. 4B that, starting from a third subblock, information bits of a subblock are obtained by replicating information bits of previous more than two subblocks that are adjacent to the subblock. In this implementation, a second subblock is one or more subblocks that are adjacent to a first subblock. For example, the first subblock is $u_3$, and second subblocks are $u_1$ and $u_2$.

With reference to FIG. 4C, the following uses an example to describe that the second subblocks are the M subblocks that are not adjacent to the first subblock.

Example 3: Refer to FIG. 4C. It can be learned from an input vector shown in FIG. 4C that an information bit of a fifth subblock is obtained by replicating an information bit of a third subblock. In this implementation, a second subblock is one subblock that is not adjacent to a first subblock. For example, the first subblock is $u_5$, and the second subblock is $u_3$.

In a possible implementation, the information bit of the first subblock is obtained by replicating the information bit of the second subblock of the T subblocks according to a mapping relationship. The mapping relationship includes a mapping relationship between a subchannel that is of the first subblock and that carries the information bit and a subchannel that is of the second subblock and that carries the information bit.

The following describes an information bit replication process by using an example in which the first subblock is the second subblock $u_2$ and the second subblock is the first subblock $u_1$. When polar encoding is performed on each subblock of the input vector, if the code length of each subblock is N, each subblock corresponds to N subchannels. As shown in FIG. 4D, the first subblock $u_1=(1,0,0,0,1,1,1,0)$, and the second subblock $u_2=(1,1,0,0,0,0,0,0)$. The mapping relationship includes a mapping relationship between subchannel 6 and $u_{2\ subchannel\ 1}$, and a mapping relationship between $u_{1\ subchannel\ 7}$ and $u_{2\ subchannel\ 2}$.

In this case, according to the mapping relationship, an information bit 1 transmitted on a subchannel 6 of the first subblock $u_1$ is replicated, and the information bit 1 is used as an information bit of a subchannel 1 of the second subblock $u_2$; and an information bit 2 of a subchannel 7 of the first subblock $u_1$ is replicated, and the information bit 2 is used as an information bit of a subchannel 2 of the second subblock $u_2$. As shown in FIG. 4D, the subchannel 1 and the subchannel 2 of the second subblock $u_2$ carry information bits "1" from the subchannel 6 and the subchannel 7 of the first subblock $u_1$, a subchannel 3 to a subchannel 8 of the second subblock $u_2$ carry frozen bits "0".

The foregoing shows an example in which the mapping relationship includes the mapping relationship between $u_{1\ subchannel\ 6}$ and $u_{2\ subchannel\ 1}$, and the mapping relationship between $u_{1\ subchannel\ 7}$ and $u_{2\ subchannel\ 2}$, and is merely the first subblock $u_1$ and the second subblock $u_2$ in the scenario shown in FIG. 3. As shown in FIG. 3, the input vector includes eight subblocks, and the mapping relationship includes a mapping relationship of subchannels of the eight subblocks. The foregoing describes the mapping relationship provided in this application by using only the mapping relationship between the subchannel of the first subblock $u_1$ and the subchannel of the second subblock $u_2$ as an example. A mapping relationship between subchannels of other subblocks is similar. Details are not described herein again.

The T subblocks include a subblock used for initial transmission and a subblock used for retransmission. For example, as shown in FIG. 3, the first subblock $u_1$ is the subblock used for initial transmission, and the second subblock $u_2$ to the eighth subblock $u_8$ are subblocks used for retransmission.

The following describes a process of establishing a mapping relationship provided in this embodiment of this application. Herein, a process of establishing a mapping relationship between a subchannel of a first subblock and a subchannel of a second subblock is used as an example for description. In a retransmission process, reliability of a subchannel of a subblock should be considered, to improve transmission performance. For example, a replicated information bit is preferentially transmitted on a subchannel with high reliability on a subblock used for retransmission. Therefore, the mapping relationship may be established based on the reliability of the subchannel of the subblock used for retransmission.

The following describes the mapping relationship between the subchannel of the first subblock and the subchannel of the second subblock with reference to step 1 to step 4.

Step 1: Determine the second subblock.

A sequence number of the second subblock is after a sequence number of the first subblock. Optionally, second subblocks are M subblocks that are adjacent to the first subblock, or second subblocks are M subblocks that are not adjacent to the first subblock. For specific description, refer to the foregoing related description.

Optionally, the M subblocks are determined based on a preset mapping sequence, where the information bit of the first subblock is obtained by directly replicating an information bit of the M subblocks, and the preset mapping sequence indicates a mapping relationship between the T subblocks.

For example, as shown in FIG. 4D, the first subblock $u_1=(1,0,0,0,1,1,1,0)$, and the second subblock $u_2=(1,1,0,0,0,0,0,0)$. The information bit "1" of $u_{1\ subchannel\ 6}$ of the first subblock $u_1$ is obtained by replicating the information bit "1" of $u_{2\ subchannel\ 1}$ of the second subblock $u_2$, and the information bit "1" of $u_{1\ subchannel\ 7}$ of the first subblock $u_1$ is obtained by replicating the information bit "1" of $u_{2\ subchannel\ 2}$ of the second subblock $u_2$. It can be learned that a replication relationship exists between the information bit of the first subblock $u_1$ and the information bit of the second subblock $u_2$, which may be understood as that a mapping relationship exists between the first subblock $u_1$ and the second subblock $u_2$.

The following shows several possible mapping sequences, where T is 8.

Example 1: A mapping sequence includes the following parts or a combination of the following parts:
a mapping relationship exists between a first subblock and a second subblock,
a mapping relationship exists between the second subblock and a third subblock,
a mapping relationship exists between the first subblock and a fourth subblock,
a mapping relationship exists between the first subblock and a fifth subblock,
a mapping relationship exists between the first subblock and a sixth subblock,
a mapping relationship exists between the first subblock and a seventh subblock, and
a mapping relationship exists between the first subblock and an eighth subblock.

Optionally, the mapping sequence in Example 1 may also be indicated as the following parts or a combination of the following parts:

$\{u_1 \leftrightarrow u_2,\ u_2 \leftrightarrow u_3,\ u_1 \leftrightarrow u_4,\ u_1 \leftrightarrow u_5,\ u_1 \leftrightarrow u_6,\ u_1 \leftrightarrow u_7,\ u_1 \leftrightarrow u_8\}$, $\{u_1 \leftrightarrow u_2,\ u_2 \leftrightarrow u_3,\ u_1 \leftrightarrow u_4,\ u_1 \leftrightarrow u_5,\ u_1 \leftrightarrow u_6,\ u_1 \leftrightarrow u_7\}$, $\{u_2 \leftrightarrow u_3, u_1 \leftrightarrow u_4, u_1 \leftrightarrow u_5, u_1 \leftrightarrow u_6, u_1 \leftrightarrow u_7, u_1 \leftrightarrow u_8\}$,
$\{u_1 \leftrightarrow u_2, u_2 \leftrightarrow u_3, u_1 \leftrightarrow u_4, u_1 \leftrightarrow u_5, u_1 \leftrightarrow u_6\}$,
$\{u_1 \leftrightarrow u_4, u_1 \leftrightarrow u_5, u_1 \leftrightarrow u_6, u_1 \leftrightarrow u_7, u_1 \leftrightarrow u_8\}$,
$\{u_1 \leftrightarrow u_5, u_1 \leftrightarrow u_6, u_1 \leftrightarrow u_7, u_1 \leftrightarrow u_8\}$,
$\{u_1 \leftrightarrow u_2, u_2 \leftrightarrow u_3, u_1 \leftrightarrow u_4, u_1 \leftrightarrow u_5\}$,
$\{u_1 \leftrightarrow u_6, u_1 \leftrightarrow u_7, u_1 \leftrightarrow u_8\}$,
$\{u_1 \leftrightarrow u_2, u_2 \leftrightarrow u_3, u_1 \leftrightarrow u_4\}$,
$\{u_1 \leftrightarrow u_2, u_2 \leftrightarrow u_3\}$,
$\{u_1 \leftrightarrow u_7, u_1 \leftrightarrow u_8\}$,
$\{u_1 \leftrightarrow u_8\}$, and
$\{u_1 \leftrightarrow u_2\}$.

$u_j$ refers to a $j^{th}$ subblock, and j is an integer greater than or equal to 1 and less than or equal to 8. "↔" indicates that a mapping relationship exists between two subblocks.

Example 2: A mapping sequence includes the following parts or a combination of the following parts:
- a mapping relationship exists between a first subblock and a second subblock,
- a mapping relationship exists between the second subblock and a third subblock,
- a mapping relationship exists between the third subblock and a fifth subblock,
- a mapping relationship exists between the fifth subblock and a sixth subblock,
- a mapping relationship exists between the sixth subblock and a seventh subblock, and
- a mapping relationship exists between the seventh subblock and an eighth subblock.

Optionally, the mapping sequence in Example 2 may also be indicated as the following parts or a combination of the following parts:

$\{u_1 \leftrightarrow u_2, u_2 \leftrightarrow u_3, u_3 \leftrightarrow u_5, u_5 \leftrightarrow u_6, u_6 \leftrightarrow u_7, u_7 \leftrightarrow u_8\}$,
$\{u_2 \leftrightarrow u_3, u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_5, u_5 \leftrightarrow u_6, u_6 \leftrightarrow u_7\}$,
$\{u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_5, u_5 \leftrightarrow u_6\}$,
$\{u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_5\}$,
$\{u_1 \leftrightarrow u_2, u_2 \leftrightarrow u_3\}$,
$\{u_6 \leftrightarrow u_7, u_7 \leftrightarrow u_8\}$,
$\{u_7 \leftrightarrow u_8\}$, and
$\{u_1 \leftrightarrow u_2\}$.

$u_j$ refers to a $j^{th}$ subblock, and j is an integer greater than or equal to 1 and less than or equal to 8. "↔" indicates that a mapping relationship exists between two subblocks.

Example 3: A mapping sequence includes the following parts or a combination of the following parts:
- a mapping relationship exists between a first subblock and a second subblock,
- a mapping relationship exists between the second subblock and a third subblock,
- a mapping relationship exists between the third subblock and a fourth subblock,
- a mapping relationship exists between the third subblock and a fifth subblock,
- a mapping relationship exists between the fifth subblock and a sixth subblock,
- a mapping relationship exists between the sixth subblock and a seventh subblock, and
- a mapping relationship exists between the seventh subblock and an eighth subblock.

Optionally, the mapping sequence in Example 3 may also be indicated as the following parts or a combination of the following parts:

$\{u_1 \leftrightarrow u_2, u_2 \leftrightarrow u_3, u_3 \leftrightarrow u_4, u_3 \leftrightarrow u_5, u_5 \leftrightarrow u_6, u_6 \leftrightarrow u_7, u_7 \leftrightarrow u_8\}$,
$\{u_2 \leftrightarrow u_3, u_3 \leftrightarrow u_4, u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_4, u_3 \leftrightarrow u_5, u_5 \leftrightarrow u_6, u_6 \leftrightarrow u_7\}$,
$\{u_3 \leftrightarrow u_4, u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_4, u_3 \leftrightarrow u_5, u_5 \leftrightarrow u_6\}$,
$\{u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_4, u_3 \leftrightarrow u_5\}$,
$\{u_5 \leftrightarrow u_6, u_6 \leftrightarrow u_7, u_7 \leftrightarrow u_8\}$,
$\{u_1 \leftrightarrow u_2, u_2 \leftrightarrow u_3, u_3 \leftrightarrow u_4\}$,
$\{u_1 \leftrightarrow u_2, u_2 \leftrightarrow u_3\}$,
$\{u_6 \leftrightarrow u_7, u_7 \leftrightarrow u_8\}$,
$\{u_1 \leftrightarrow u_2\}$, and
$\{u_7 \leftrightarrow u_8\}$.

$u_j$ refers to a $j^{th}$ subblock, and j is an integer greater than or equal to 1 and less than or equal to 8. "↔" indicates that a mapping relationship exists between subchannels of two subblocks.

Example 4: A mapping sequence includes the following parts or a combination of the following parts:
- a mapping relationship exists between a first subblock and a second subblock,
- a mapping relationship exists between the second subblock and a third subblock,
- a mapping relationship exists between the first subblock and a fourth subblock,
- a mapping relationship exists between the third subblock and a fifth subblock,
- a mapping relationship exists between the fifth subblock and a sixth subblock,
- a mapping relationship exists between the sixth subblock and a seventh subblock, and
- a mapping relationship exists between the seventh subblock and an eighth subblock.

Optionally, the mapping sequence in Example 4 may also be indicated as the following parts or a combination of the following parts:

$\{u_1 \leftrightarrow u_2, u_2 \leftrightarrow u_3, u_1 \leftrightarrow u_4, u_3 \leftrightarrow u_5, u_5 \leftrightarrow u_6, u_6 \leftrightarrow u_7, u_7 \leftrightarrow u_8\}$,
$\{u_2 \leftrightarrow u_3, u_1 \leftrightarrow u_4, u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_1 \leftrightarrow u_4, u_3 \leftrightarrow u_5, u_5 \leftrightarrow u_6, u_6 \leftrightarrow u_7\}$,
$\{u_1 \leftrightarrow u_4, u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_1 \leftrightarrow u_4, u_3 \leftrightarrow u_5, u_5 \leftrightarrow u_6\}$,
$\{u_3 \leftrightarrow u_5, u_5 \leftrightarrow u_6, u_6 \leftrightarrow u_7, u_7 \leftrightarrow u_8\}$,
$\{u_1 \leftrightarrow u_2, u_2 \leftrightarrow u_3, u_1 \leftrightarrow u_4, u_3 \leftrightarrow u_5\}$,
$\{u_1 \leftrightarrow u_2, u_2 \leftrightarrow u_3, u_1 \leftrightarrow u_4\}$,
$\{u_5 \leftrightarrow u_6, u_6 \leftrightarrow u_7, u_7 \leftrightarrow u_8\}$,
$\{u_6 \leftrightarrow u_7, u_7 \leftrightarrow u_8\}$,
$\{u_1 \leftrightarrow u_2, u_2 \leftrightarrow u_3\}$,
$\{u_1 \leftrightarrow u_2\}$, and
$\{u_7 \leftrightarrow u_8\}$.

$u_j$ refers to a $j^{th}$ subblock, and j is an integer greater than or equal to 1 and less than or equal to 8. "↔" indicates that a mapping relationship exists between two subblocks.

Step 2: Determine a sequence number of a subchannel that is of the first subblock and that carries an information bit.

There are a plurality of manners of determining the sequence number of the subchannel that is of the first subblock and that carries the information bit. The following describes the manners by using examples.

1. Implementation 1 is described with reference to step 2a and step 2b.

Step 2a: Determine, based on a first code rate allocation table, a quantity of information bits carried by the first subblock.

The following shows two implementations of determining, based on the first code rate allocation table, a quantity of information bits carried by the first subblock.

(1) An input parameter of the first code rate allocation table is a code length M of the T subblocks and a code rate of the T subblocks, and an output parameter of the first code rate allocation table is a quantity $K_j$ of information bits carried by each subblock. The code length M=T×a code length N of each subblock, j is a sequence number of the subblock, and j□{1, . . . , T}. In this manner, the quantity of information bits carried by the first subblock may be directly determined based on the first code rate allocation table.

(2) An input parameter of the first code rate allocation table is a code length M of the T subblocks and a code rate of the T subblocks, and an output parameter of the first code rate allocation table is a code rate $R_j$ of each subblock. The code length M=T×a code length N of each subblock, j is a sequence number of the subblock, and j□{1, 2, . . . , T}. In this manner, a code rate of the first subblock may be determined based on the first code rate allocation table, and the code rate of the first subblock is multiplied by the code length N of the first subblock to obtain the quantity of information bits carried by the first subblock.

Step 2b: Determine, based on a preset first reliability sequence, the sequence number of the subchannel that is of the first subblock and that carries the information bit.

Specifically, each of the T subblocks corresponds to N subchannels, and the first reliability sequence includes a reliability ranking of the N subchannels of the first subblock. In this case, the sequence number of the subchannel that is of the first subblock and that carries the information bit may be determined based on the first reliability sequence. The following shows two possible determining manners by using examples.

(1) Subchannels whose reliability ranks top X in the N subchannels of the first subblock are selected based on the first reliability sequence, and sequence numbers of the subchannels whose reliability ranks top X are used as sequence numbers of subchannels that are of the first subblock and that carry the information bits. X is the quantity of information bits carried by the first subblock.

For example, as shown in FIG. 4D, the first subblock is $u_2$, the second subblock is $u_1$ and the quantity of information bits carried by the first subblock is 2. If it is determined, based on the first reliability sequence, that reliability of the subchannel 1 of $u_2$ and reliability of the subchannel 2 of $u_2$ are higher compared with reliability of another subchannel, a sequence number of the subchannel 1 of $u_2$ and a sequence number of the subchannel 2 of $u_2$ are used as sequence numbers of subchannels that carry the first information bit.

(2) X subchannels with medium reliability in the N subchannels of the first subblock are selected based on the first reliability sequence, and sequence numbers of the X subchannels with medium reliability are used as sequence numbers of subchannels of first information bits. X is the quantity of information bits carried by the first subblock.

Figure 4E:
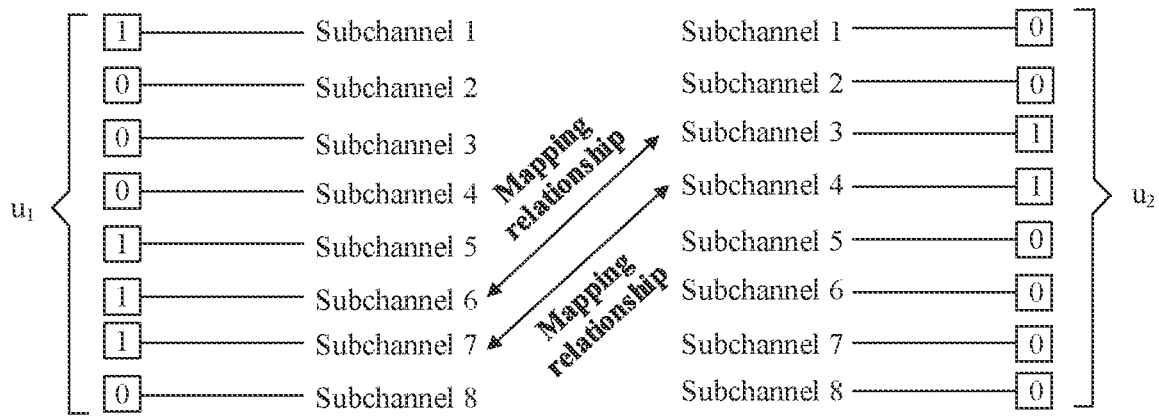
FIG. 4E is a schematic diagram of another scenario of an encoding method according to an embodiment of this application.

For example, as shown in FIG. 4E, the first subblock is $u_2$, the second subblock is $u_1$ and the quantity of information bits carried by the first subblock is 2. Reliability of the subchannel 3 of $u_2$ and reliability of the subchannel 4 of $u_2$ that are determined based on the first reliability sequence are lower than reliability of the subchannel 1 and reliability of the subchannel 2, but are higher than reliability of another subchannel. A sequence number of the subchannel 3 of $u_2$ and a sequence number of the subchannel 4 of $u_2$ are used as sequence numbers of subchannels that are of $u_1$ and that carry the information bits.

The following describes two possible indication manners of the first reliability sequence.

Indication manner 1: The first reliability sequence is r={$r_1$, $r_2$, $r_N$}. $r_i$ indicates a sequence number of a subchannel of the first subblock, and a location of the subchannel $r_i$ in an r sequence indicates a reliability ranking of the subchannel $r_i$ of the subchannels included in the first subblock. In the first reliability sequence, a subchannel with a higher ranking indicates higher reliability of the subchannel.

For example, if the first subblock includes eight subchannels, sequence numbers of the eight subchannels are sequentially: 1, 2, . . . , 7, and 8. If a ranking sequence of reliability is r={4, 5, 3, 6, 7, 2, 1, 8}, it indicates that reliability of the eight subchannels satisfies: the subchannel 4>the subchannel 5>the subchannel 3>the subchannel 6>the subchannel 7>the subchannel 2>the subchannel 1>the subchannel 8.

Indication manner 2: The first reliability sequence is w={$w_1$, $w_2$, $w_N$}. $w_i$ indicates a value of reliability of an $i^{th}$ subchannel of the first subblock. A larger value of $w_i$ indicates higher reliability of the $i^{th}$ subchannel of the first subblock. If $w_i$>$w_1$, it indicates that the reliability of the $i^{th}$ subchannel of the first subblock is greater than reliability of a $j^{th}$ subchannel of the first subblock.

For example, if the first subblock includes eight subchannels, a ranking sequence of reliability satisfies w={2.1, 3, 4.5, 5, 3.2, 2, 2.6, 7}. This indicates that reliability of the eight subchannels is separately shown in Table 1.

TABLE 1

| Subchannel of the first subblock | Reliability |
|---|---|
| Subchannel 1 | 2.1 |
| Subchannel 2 | 3 |
| Subchannel 3 | 4.5 |
| Subchannel 4 | 5 |
| Subchannel 5 | 3.2 |
| Subchannel 6 | 2 |
| Subchannel 7 | 2.6 |
| Subchannel 8 | 7 |

Optionally, reliability rankings of subchannels of different subblocks may be the same or may be different. When the reliability rankings of the subchannels of different subblocks are the same, a reliability sequence of subchannels of only one subblock may be stored.

In a possible implementation, the second subblock includes a fourth subblock and a fifth subblock, and the information bits of the first subblock are obtained by replicating an information bit of the fourth subblock and an information bit of the fifth subblock.

In this implementation, the following case exists: Reliability of a second subchannel of the fourth subblock is the same as reliability of a third subchannel of the fifth subblock. Because the information bits of the first subblock are obtained by replicating the information bit of the fourth subblock and the information bit of the fifth subblock, when the reliability of the second subchannel is the same as the reliability of the third subchannel, if either of the second subchannel and the third subchannel is selected to replicate the information bit, a problem of which subchannel is selected is encountered. For this case, the following describes a manner of determining the reliability of the second subchannel and the reliability of the third subchannel. The determining manner includes:

when the second subchannel and the third subchannel have the same reliability, determining the reliability of the second subchannel and the reliability of the third subchannel based on a second preset rule.

That the second subchannel and the third subchannel have the same reliability includes: the second subchannel corresponds to third reliability in the first reliability sequence, and the third subchannel corresponds to the third reliability in the first reliability sequence.

The second preset rule includes any one of the following possible implementations:
(1) When a sequence number of the fourth subblock is after a sequence number of the fifth subblock, it is determined that the reliability of the second subchannel is greater than the reliability of the third subchannel.
(2) When a sequence number of the fourth subblock is before a sequence number of the fifth subblock, it is determined that the reliability of the third subchannel is greater than the reliability of the second subchannel.

For example, as shown in FIG. 4B, the first subblock is the third subblock $u_3$, and the second subblocks are the first subblock $u_1$ and the second subblock $u_2$. It can be known from FIG. 4B that, the information bits of the third subblock $u_3$ are obtained by replicating the information bit of the first subblock $u_1$ and the information bit of the second subblock $u_2$. When the replicated bits are selected from the first subblock $u_1$ and the second subblock $u_2$, a reliability ranking of subchannels of the first subblock $u_1$ and a reliability ranking of subchannels of the second subblock $u_2$ are determined based on the first reliability sequence. X subchannels with high reliability are selected from the subchannels of the first subblock and the subchannels of the second subblock, and information bits of the X subchannels are replicated as the information bits of the third subblock $u_3$.

When the subchannel of the first subblock $u_1$ and the subchannel of the second subblock $u_2$ are determined, there is a case in which reliability of a first subchannel of the first subblock $u_1$ is the same as reliability of a second subchannel of the second subblock $u_2$. In this case, it is determined that the reliability of the first subchannel of the first subblock $u_1$ whose sequence number is higher is greater than the reliability of the second subchannel of the second subblock $u_2$. Alternatively, it is determined that the reliability of the second subchannel of the second subblock $u_2$ whose sequence number is lower is greater than the reliability of the first subchannel of the first subblock $u_1$. Therefore, if one subchannel needs to be selected from the first subchannel of the first subblock $u_1$ and the second subchannel of the second subblock $u_2$, the subchannel with higher reliability may be selected, and the information bit of the subchannel is replicated.

2. Implementation 2 is described with reference to step 2c and step 2d.

Step 2c: Determine, based on a second code rate allocation table, a quantity of information bits that are carried by a first coupling subblock and that are related to a second coupling subblock.

The first coupling subblock and the second coupling subblock each include at least two subblocks, the first coupling subblock is obtained by performing an exclusive OR operation on encoded bit sequences corresponding to the at least two subblocks, and the second coupling subblock is obtained by performing the exclusive OR operation on encoded bit sequences corresponding to the at least two subblocks. In other words, a codeword coupling relationship exists between the at least two subblocks included in the coupling subblock.

Figure 4F:
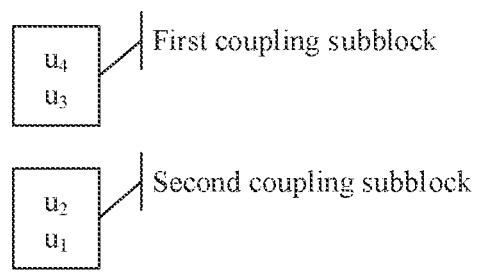
FIG. 4F is a schematic diagram of another scenario of an encoding method according to an embodiment of this application.

For example, it can be learned from FIG. 3 that the codeword coupling relationship exists between two adjacent subblocks, and the coupling subblock includes the two subblocks. With reference to FIG. 4F, for example, the first coupling subblock includes a second subblock $u_2$ and a third subblock $u_3$, and the second coupling subblock includes a first subblock $u_1$ and the second subblock $u_2$. Alternatively, the first coupling subblock includes a third subblock $u_3$ and a fourth subblock $u_4$, and the second coupling subblock includes a first subblock $u_1$ and a second subblock $u_2$.

In this embodiment, the following shows two possible implementations of determining, based on the second code rate allocation table, the quantity of information bits related to the second coupling subblock.

(1) An input parameter of the second code rate allocation table is a code length M of the T subblocks and a code rate of the T subblocks, and an output parameter of the second code rate allocation table is a quantity of information bits carried by each coupling subblock. The code length M=T×a code length N of each subblock. In this manner, the quantity of information bits that are carried by the first coupling subblock and that are related to the second coupling subblock may be directly determined based on the second bit rate allocation table.

(2) An input parameter of the second code rate allocation table is a code length M of the T subblocks and a code rate of the T subblocks, and an output parameter of the second code rate allocation table is a code rate of each coupling subblock. The code length M=T×a code length N of each subblock. In this manner, a code rate of the first coupling subblock is determined based on the second code rate allocation table, and the code rate of the first coupling subblock is multiplied by a code length M' of the first coupling subblock. M'=a quantity of subblocks included in a coupling subblock×the code length N of each subblock.

For example, the first coupling subblock includes a third subblock $u_3$ and a fourth subblock $u_4$, and the second coupling subblock includes a first subblock $u_1$ and a second subblock $u_2$. In this case, it is determined, based on the second bit rate allocation table, that a quantity of information bits carried by the first coupling subblock is 7, and a quantity of information bits carried by the second coupling subblock is 3.

Step 2d: Determine, based on a preset second reliability sequence, a sequence number of a subchannel of an information bit that is carried by the first coupling subblock and that is related to the second coupling subblock.

The second reliability sequence includes a reliability ranking of subchannels of the first coupling subblock. The information bit that is carried by the first coupling subblock and that is related to the second coupling subblock is obtained by replicating an information bit of the second coupling subblock.

Specifically, based on the second reliability sequence, subchannels whose reliability ranks top Y in subchannels of the second coupling subblock are selected as sequence numbers of subchannels of information bits related to the second coupling subblock. Alternatively, Y subchannels with medium reliability in subchannels of the second coupling subblock are selected as sequence numbers of subchannels of information bits related to the second coupling subblock. Y is a quantity of information bits related to the second coupling subblock.

For example, as shown in FIG. 4F, the first coupling subblock includes a third subblock $u_3$ and a fourth subblock $u_4$, and the second coupling subblock includes a first subblock $u_1$ and a second subblock $u_2$. The first coupling subblock includes four information bits, and the second coupling subblock includes seven information bits. In this case, sequence numbers of subchannels whose reliability ranks top four in the first coupling subblock are determined based on the second reliability sequence, and the sequence numbers of the four subchannels are used as the sequence numbers of the subchannels that carry the information bits related to the second coupling subblock.

In this embodiment, an indication manner of the second reliability sequence is similar to the indication manner of the first reliability sequence. For details, refer to the foregoing description of the indication manner of the first reliability sequence. Details are not described herein again.

It should be noted that reliability rankings of subchannels of different coupling subblocks may be the same or may be different. When the reliability rankings of the subchannels of different coupling subblocks are the same, a reliability sequence of subchannels of only one coupling subblock may be stored. For implementation 2, a relationship between the first coupling subblock and the second coupling subblock, and the first subblock and the second subblock includes the following two possible cases, which are separately described below.

Case 1: The first coupling subblock includes the first subblock, and the second coupling subblock includes the second subblock.

For example, as shown in FIG. 4F, the first coupling subblock includes a third subblock $u_3$ and a fourth subblock $u_4$, and the second coupling subblock includes a first subblock $u_1$ and a second subblock $u_2$. As shown in FIG. 3, because the information coupling relationship exists between two adjacent subblocks, an example in which the first subblock is the third subblock $u_3$ and the second subblock is the second subblock $u_2$ is used for description herein. If the first coupling subblock carries three first information bits, the second coupling subblock carries seven information bits, it is determined, based on the second reliability sequence, that subchannels that are of the first coupling subblock and that carry the information bits are respectively two subchannels of the third subblock $u_3$ and one subchannel of the fourth subblock $u_4$; and sequence numbers of the two subchannels of the third subblock $u_3$ are used as sequence numbers of subchannels that are of the third subblock $u_3$ and that carry the information bits.

Optionally, in case 1, the second subblock includes a third subblock. When both the first coupling subblock and the second coupling subblock include the third subblock, and a first subchannel of the third subblock corresponds to different reliability in different coupling subblocks. To be specific, the first subchannel corresponds to a plurality of reliabilities. Because the information bits of the first subblock include an information bit obtained by replicating the information bit of the third subblock, when the first subchannel corresponds to the plurality of reliabilities, reliability of the first subchannel needs to be determined. In this way, a subchannel for replicating the information bit is selected from the third subblock based on the reliability. The following describes a manner of determining the reliability of the first subchannel. The determining manner includes:

when the first subchannel corresponds to the plurality of reliabilities, determining the reliability of the first subchannel based on a first preset rule.

That the first subchannel corresponds to the plurality of reliabilities includes: The first subchannel corresponds to first reliability in the first coupling subblock, and the first subchannel corresponds to second reliability in the second coupling subblock.

The first preset rule includes any one of the following:
when the first reliability is greater than or equal to the second reliability, the first reliability is used as the reliability of the first subchannel;
when a sequence number of the first coupling subblock is after a sequence number of the second coupling subblock, the first reliability is used as the reliability of the first subchannel;
when the first reliability is less than or equal to the second reliability, the second reliability is used as the reliability of the first subchannel; or
when a sequence number of the first coupling subblock is before a sequence number of the second coupling subblock, the second reliability is used as the reliability of the first subchannel.

For example, as shown in FIG. 4G, the first coupling subblock includes a second subblock $u_2$ and a third subblock $u_3$, and the second coupling subblock includes a first subblock $u_1$ and the second subblock $u_2$. It can be learned that the first coupling subblock and the second coupling subblock include the same second subblock $u_2$. Herein, a first subchannel of the second subblock $u_2$ is used as an example for description. When the first subchannel corresponds to two reliabilities, higher reliability is selected as the reliability of the first subchannel, or lower reliability is selected as the reliability of the first subchannel; reliability corresponding to a first subchannel of a coupling subblock with a higher sequence number is selected as the reliability of the first subchannel; reliability corresponding to a first subchannel of a coupling subblock with a lower sequence number is selected as the reliability of the first subchannel.

Optionally, the second subblock includes a sixth subblock and a seventh subblock, and the first information bits of the first subblock are obtained by replicating an information bit of the sixth subblock and an information bit of the seventh subblock. The first coupling subblock includes a first subblock, the second coupling subblock includes a third coupling subblock and a fourth coupling subblock, the third coupling subblock includes a sixth subblock, and the fourth coupling subblock includes a seventh subblock. Therefore, when the first coupling subblock replicates information bits from the third coupling subblock and the fourth coupling subblock, reliability of a subchannel of the third coupling subblock and reliability of a subchannel of the fourth coupling subblock need to be considered.

In this implementation, the following case exists: Reliability of a fourth subchannel of the sixth subblock is the same as reliability of a fifth subchannel of the seventh subblock. Because the information bits of the first subblock are obtained by replicating the information bit of the sixth subblock and the information bit of the seventh subblock, when the reliability of the fourth subchannel is the same as the reliability of the fifth subchannel, if either of the fourth subchannel and the fifth subchannel is selected to replicate the information bit, a problem of which subchannel is selected is encountered. For this case, the following describes and determines a manner of determining the reliability of the fourth subchannel and the reliability of the fifth subchannel. The determining manner includes:

when the fourth subchannel and the fifth subchannel have the same reliability, determining the reliability of the fourth subchannel and the reliability of the fifth subchannel based on a third preset rule.

When the fourth subchannel and the fifth subchannel have the same reliability, determine the reliability of the fourth subchannel and the reliability of the fifth subchannel based on the third preset rule.

The third preset rule includes any one of the following possible implementations:

(1) When a sequence number of the sixth subblock is after a sequence number of the seventh subblock, it is determined that the reliability of the fourth subchannel is greater than the reliability of the fifth subchannel.

(2) When a sequence number of the sixth subblock is before a sequence number of the seventh subblock, it is determined that the reliability of the fifth subchannel is greater than the reliability of the fourth subchannel.

For example, as shown in FIG. 4H, it can be known that an information coupling relationship exists between four adjacent subblocks and a codeword coupling relationship exists between two adjacent subblocks. Therefore, it can be known that a coupling subblock includes two adjacent subblocks. With reference to FIG. 4I, for example, a first coupling subblock includes a fourth subblock $u_4$ and a fifth subblock $u_5$, a third coupling subblock includes a first subblock $u_1$ and a second subblock $u_2$, and a fourth coupling subblock includes the second subblock $u_2$ and a third subblock $u_3$. Herein, the sixth subblock is the first subblock the seventh subblock is the third subblock $u_3$, and the first subblock is the fourth subblock $u_4$. Information bits of the fourth subblock $u_4$ are obtained by replicating the first subblock the second subblock $u_2$, and the third subblock $u_3$. Therefore, when the information bits are replicated, reliability of subchannels of three subblocks: the first subblock $u_1$, the second subblock $u_2$, and the third subblock $u_3$ needs to be considered.

However, in this implementation, the following cases exist. Reliability that corresponds to the fourth subchannel of the first subblock $u_1$ and that is in the second reliability sequence is the same as reliability that corresponds to the fifth subchannel of the third subblock $u_3$ and that is in the second reliability sequence. It is determined that the reliability of the fifth subchannel is greater than the reliability of the fourth subchannel (that is, it is considered that the reliability that corresponds to the fifth subchannel and that is of the fourth coupling subblock with a lower sequence number is high), or it is determined that the reliability of the fourth subchannel is greater than the reliability of the fifth subchannel (that is, it is considered that the reliability that corresponds to the fourth subchannel and that is of the third coupling subblock with a higher sequence number is high).

Case 2: The first coupling subblock includes the first subblock and the second subblock.

For example, the first coupling subblock includes the first subblock $u_1$ and the second subblock $u_2$. The first subblock is the second subblock $u_2$, the second subblock is the first subblock $u_1$, and an information bit of the second subblock $u_2$ is obtained by replicating an information bit of the first subblock $u_1$. If the first coupling subblock includes three information bits, the first subblock $u_1$ carries two information bits. Therefore, based on the second reliability sequence, a subchannel with maximum reliability of the second subblock $u_2$ is selected as a subchannel that carries the information bits replicated from the first subblock $u_1$. Alternatively, a subchannel with medium reliability of the second subblock $u_2$ is selected as a subchannel that carries the information bits replicated from the first subblock $u_1$.

3. Implementation 3 is described with reference to step 2e.

Step 2e: Determine, based on a preset third reliability sequence, the sequence number of the subchannel that is of the first subblock and that carries the information bit.

The third reliability sequence includes a reliability ranking of subchannels of the T subblocks, and the information bit carried by the first subblock is obtained by replicating the information bit of the second subblock.

An indication manner of the third reliability sequence is similar to the indication manner of the first reliability sequence. For details, refer to the foregoing description of the indication manner of the first reliability sequence. Details are not described herein again.

For example, if a code length of each of the T subblocks is N, a code length of the T subblocks is M=T×N. It can be learned that the third reliability sequence includes a reliability ranking of M subchannels of the T subblocks. A reliability ranking of N subchannels of the first subblock is determined based on the third reliability sequence. X subchannels whose reliability ranks first X in the N subchannels of the first subblock are selected, and sequence numbers of the X subchannels are used as sequence numbers of subchannels that are of the first subblock and that carry information bits. X is a quantity of information bits carried by the first subblock.

4. Implementation 4 is described with reference to step 2f.

Step 2f: Determine, based on a fourth reliability sequence, the sequence number of the subchannel that is of the first subblock and that carries the information bit.

The fourth reliability sequence is obtained through calculation, and the fourth reliability sequence includes a reliability ranking of subchannels of the T subblocks. The following describes a process of generating the fourth reliability sequence.

Reliability of all subchannels corresponding to the T subblocks is calculated, and the reliability of all the subchannels is sorted in descending order to obtain the fourth reliability sequence. The fourth reliability sequence includes the reliability ranking of the subchannels of the T subblocks, and the information bit carried by the first subblock is obtained by replicating the information bit of the second subblock.

An indication manner of the fourth reliability sequence is similar to the indication manner of the first reliability sequence. For details, refer to the foregoing description of the indication manner of the first reliability sequence. Details are not described herein again.

Because the code length of each subblock is N, the fourth reliability sequence of the subchannels of the T subblocks is N×T. Calculation of the fourth reliability sequence includes reliability calculation within each subblock and reliability calculation between subblocks. A manner of calculating reliability within the subblock is the same as a manner of calculating reliability in an existing polar short code.

Figure 4J:
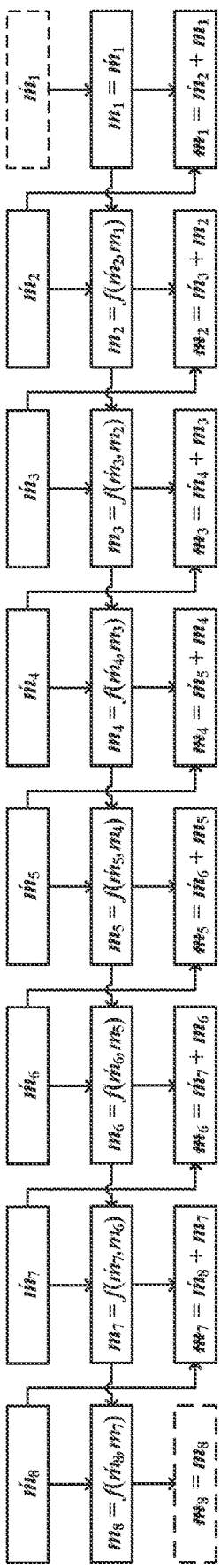
FIG. 4J is a schematic diagram of another scenario of an encoding method according to an embodiment of this application.

Optionally, when codeword coupling relationships between subblocks are different, manners of calculating reliability of a subchannel are also different. With reference to FIG. 3 and FIG. 4J, the following describes a manner of calculating reliability of a subchannel by using a specific example.

As shown in FIG. 3, the codeword coupling relationship exists between two adjacent subblocks. Refer to FIG. 4J. $\dot{m}_i$ is third reliability of an $i^{th}$ subblock, $\dot{m}_i$ is calculated fifth reliability of the $i^{th}$ subblock, and i is an integer ranging from 1 to 8. An f operation is $$f(m_1, m_2) = \phi^{-1}(1 - (1 - \phi(m_1))(1 - \phi(m_2))),$$

where $$\phi(x) = \begin{cases} 1 - \frac{1}{\sqrt{4\pi x}} \int_{-\infty}^{\infty} \tanh \frac{u}{2} e^{-\frac{(u-x)^2}{4x}} du & x > 0, \\ 1, & x = 0. \end{cases}$$

and $\phi^{-1}(x)$ is an inverse function of $\phi(x)$.

Refer to FIG. 4J. Fourth reliability $m_1$ of a first subblock is third reliability $\acute{m}_1$ of the first subblock. The f operation is performed on $m_1$ and $\acute{m}_2$ to obtain fourth reliability $m_2$ of a second subblock. The f operation is performed on $m_2$ and $\acute{m}_3$ to obtain fourth reliability $m_3$ of a third subblock, and the rest may be deduced by analogy until fourth reliability of an eighth subblock is obtained. This is expressed by using formulas: $m_1=\acute{m}_1$, $m_2=f(\acute{m}_2, m_1)$, $m_3=f(\acute{m}_3, m_2)$, $m_4=f(\acute{m}_4, m_3)$, $m_5=f(\acute{m}_5, m_4)$, $m_6=f(\acute{m}_6, m_5)$, $m_7=f_1(\acute{m}_7, m_6)$, and $m_8=f(\acute{m}_8, m_7)$.

Refer to FIG. 4J. It is first determined that fifth reliability $\mathcyr{m}_8$ of the eighth subblock is the fourth reliability $m_8$ of the eighth subblock. It is determined that fifth reliability $\mathcyr{m}_7$ of a seventh subblock is a sum of $\acute{m}_8$ and $m_7$. It is determined that fifth reliability $\mathcyr{m}_6$ of a sixth subblock is a sum of $\acute{m}_7$ and $m_6$, and the rest may be deduced by analogy until fifth reliability of the first subblock is obtained. This is expressed by using formulas: $\mathcyr{m}_8=m_8$, $\mathcyr{m}_7=\acute{m}_8+\mathcyr{m}_7$, $\acute{m}_6=\acute{m}_7+m_6$, $\mathcyr{m}_5=\acute{m}_6+m_5$, $\mathcyr{m}_4=\acute{m}_5+m_4$, $\acute{m}_3=\acute{m}_4+m_3$, $\mathcyr{m}_2=\acute{m}_3+m_2$, and $\mathcyr{m}_1=\acute{m}_2+m_1$. Fifth reliability of each subblock is separately input into a reliability calculating module, and reliability of a subchannel of each subblock is separately obtained through calculation by using the reliability calculating module.

Step 3: Determine a sequence number of a subchannel that is of the second subblock and that carries an information bit.

The following describes step 3 with reference to the four possible implementations provided in step 2.

1. Based on implementation 1 provided in step 2, step 3 specifically includes: selecting, based on the first reliability sequence, a sequence number of a subchannel that is of the second subblock and that is used for replicating an information bit for the first subblock.

For example, sequence numbers of X subchannels with low reliability are selected, based on the first reliability sequence, from subchannels that are of the second subblock and that carry information bits. For example, as shown in FIG. 4D, the second subblock is the first subblock $u_1$, and subchannels that are of the first subblock $u_1$ and that are used to carry information bits include the subchannel 1, the subchannel 5, the subchannel 6, and the subchannel 7. The second reliability sequence $r=\{r_1, r_5, r_6, r_7, r_2, r_3, K_r, r_8\}$. The subchannel 6 and the subchannel 7 of the first subblock $u_1$ with low reliability are selected as subchannels for replicating information bits for the first subblock. Alternatively, the subchannel 5 and the subchannel 6 of the first subblock $u_1$ with medium reliability are selected as subchannels for replicating information bits for the first subblock.

2. Based on implementation 2 provided in step 2, step 2 specifically includes: selecting, based on the second reliability sequence, a sequence number of a subchannel that is of the second subblock and that is used for replicating an information bit for the first subblock. A specific execution process of this implementation is similar to the foregoing selection process based on implementation 1 provided in step 2. For details, refer to the foregoing selection process based on implementation 1 provided in step 2.

3. Based on implementation 3 provided in step 2, step 2 specifically includes: selecting, based on the third reliability sequence, a sequence number of a subchannel that is of the second subblock and that is used for replicating an information bit for the first subblock. A specific execution process of this implementation is similar to the foregoing selection process based on implementation 1 provided in step 2. For details, refer to the foregoing selection process based on implementation 1 provided in step 2.

4. Based on implementation 3 provided in step 2, step 2 specifically includes: selecting, based on the fourth reliability sequence, a sequence number of a subchannel that is of the second subblock and that is used for replicating an information bit for the first subblock. A specific execution process of this implementation is similar to the foregoing selection process based on implementation 1 provided in step 2. For details, refer to the foregoing selection process based on implementation 1 provided in step 2.

Step 4: Establish a mapping relationship between a subchannel that is of the first subblock and that carries the information bit and a subchannel that is of the second subblock and that carries the information bit.

Specifically, a mapping relationship between a sequence number of the subchannel that is of the first subblock and that carries the information bit and a sequence number of the subchannel that is of the second subblock and that carries the information bit is generated. The mapping relationship is used to determine subchannels that are of the first subblock and that are used for placing the replicated information bits, and subchannels that are of the second subblock and from which the first subblock replicates the information bits carried by the first subblock.

402: Perform polar encoding on the input vector to obtain an encoded bit.

In a possible implementation, polar encoding is performed on the input vector by using a first generator matrix to obtain the encoded bit. In other words, the first generator matrix may reflect the codeword coupling relationship between the T subblocks.

The first generator matrix is generated based on a second generator matrix, the second generator matrix includes at least two matrix blocks distributed based on a preset location relationship, and the matrix block includes a plurality of first generator matrix cores. The first generator matrix includes A matrix blocks, a location relationship between two adjacent matrix blocks in the A matrix blocks is determined based on the preset location relationship, and A is a positive integer.

First, the first generator matrix core and the matrix block are described first.

The first generator matrix core may be $G_N$, and the code length of each of the T subblocks is the same as a dimension of the first generator matrix core. N is the code length of each of the T subblocks, $N=2^n$, and n is a positive integer. In an actual application process, a value of N may be set based on an actual requirement. For example, N may be a preset value.

Figure 4K:
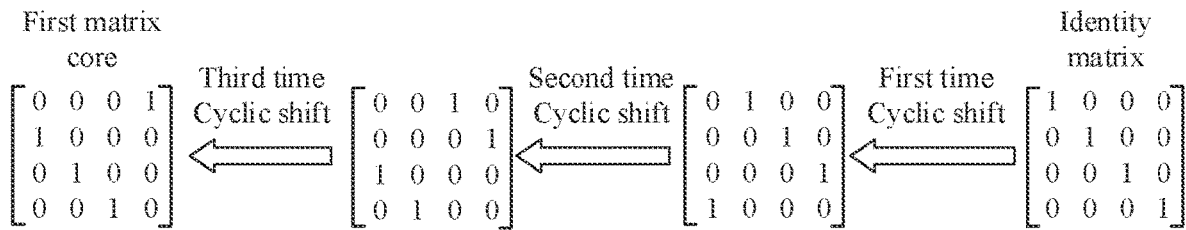
FIG. 4K is a schematic diagram of another scenario of an encoding method according to an embodiment of this application.

The following describes a construction process of $G_N$ with reference to an example in FIG. 4K.

If the code length of the subblock is 4, a dimension of an identity matrix is 4. As shown in FIG. 4K, the identity matrix is $$\begin{bmatrix} 1 & 0 & 0 & 0 \\ 0 & 1 & 0 & 0 \\ 0 & 0 & 1 & 0 \\ 0 & 0 & 0 & 1 \end{bmatrix}.$$

If it is determined through calculation that cyclic shift is performed on the identity matrix for three times, one cyclic shift is performed on the identity matrix $$\begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

to obtain $$\begin{bmatrix} 0 & 1 & 0 & 0 \\ 0 & 0 & 1 & 0 \\ 0 & 0 & 0 & 1 \\ 1 & 0 & 0 & 0 \end{bmatrix}.$$

The cyclic shift means that cyclic shift is performed on an element "1" in the matrix in a row in which the element "1" is located. Cyclic shift is performed on $$\begin{bmatrix} 0 & 1 & 0 & 0 \\ 0 & 0 & 1 & 0 \\ 0 & 0 & 0 & 1 \\ 1 & 0 & 0 & 0 \end{bmatrix}$$

for another time to obtain $$\begin{bmatrix} 0 & 0 & 1 & 0 \\ 0 & 0 & 0 & 1 \\ 1 & 0 & 0 & 0 \\ 0 & 1 & 0 & 0 \end{bmatrix},$$

and cyclic shift is performed on $$\begin{bmatrix} 0 & 0 & 1 & 0 \\ 0 & 0 & 0 & 1 \\ 1 & 0 & 0 & 0 \\ 0 & 1 & 0 & 0 \end{bmatrix}$$

for another time to obtain $$\begin{bmatrix} 0 & 0 & 0 & 1 \\ 1 & 0 & 0 & 0 \\ 0 & 1 & 0 & 0 \\ 0 & 0 & 1 & 0 \end{bmatrix}.$$

That is, the first matrix core $$G_N = \begin{bmatrix} 0 & 0 & 0 & 1 \\ 1 & 0 & 0 & 0 \\ 0 & 1 & 0 & 0 \\ 0 & 0 & 1 & 0 \end{bmatrix}.$$

A construction process of a first matrix core $G_N$ of another length is also similar. Details are not described herein one by one.

The matrix block may include the first generator matrix core and a zero matrix (which may be expressed as $0_N$). A size of the first generator matrix core is the same as a size of the zero matrix. For example, if the size of the first generator matrix core is N×N, the size of the zero matrix is also N×N. For ease of description, in the following, the first generator matrix core or the zero matrix is referred to as a matrix unit.

It should be noted that, in this embodiment of this application, a size of a matrix means that the matrix includes a row quantity and a column quantity, and the size of the matrix may be expressed by R×S (R is the row quantity of the matrix, and S is the column quantity of the matrix). When the matrix is a square matrix (square matrix), the size of the matrix may be expressed by the row quantity or the column quantity. For example, when the matrix includes R rows and R columns, the size of the matrix may be expressed by R×R, or the size of the matrix may be expressed by R.

Figure 5:
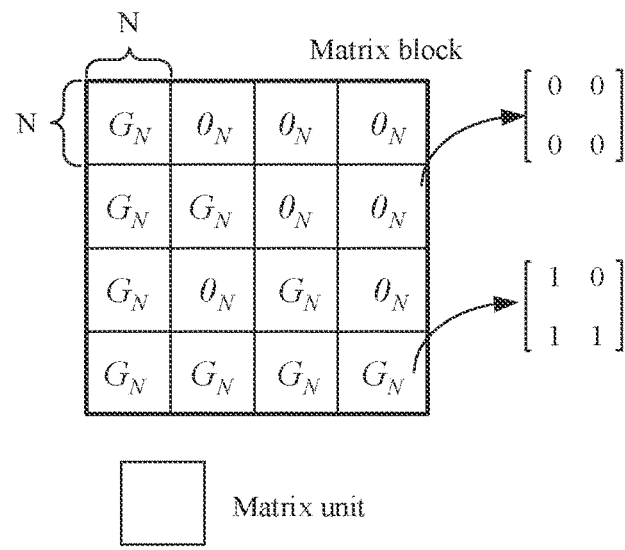
FIG. 5 is a schematic diagram of a matrix block according to an embodiment of this application.

The following describes the matrix block with reference to FIG. 5.

FIG. 5 is a schematic diagram of a matrix block according to an embodiment of this application. Refer to FIG. 5. T matrix block includes a plurality of matrix units. FIG. 5 is described by using an example in which a quantity of matrix units is 16. Each matrix unit includes N×N elements. For example, an element may be 0 or 1. The matrix unit may be $G_N$ or $0_N$. If N is equal to 2, $$G_N = \begin{bmatrix} 1 & 0 \\ 1 & 1 \end{bmatrix}, \text{ and } 0_N = \begin{bmatrix} 0 & 0 \\ 0 & 0 \end{bmatrix}.$$

Optionally, first generator matrix core ($G_N$) is included on a first diagonal of the matrix block. The first diagonal may be a primary diagonal of the matrix block. For example, refer to FIG. 5. A matrix unit located on the primary diagonal of the matrix block is $G_N$, for example, matrix units at coordinates (1, 1), (2, 2), (3, 3), and (4, 4) are $G_N$.

Optionally, the plurality of first generator matrix cores in the matrix block are distributed in a lower triangular form. For example, as shown in FIG. 5, a plurality of $G_N$ in the matrix block are distributed in the lower triangular form.

Optionally, distribution of the first generator matrix cores in the matrix block is the same as distribution of first elements of a second generator matrix core. The first element may be 1. Distribution of elements of the second generator matrix core is $B_N F_2^{\otimes(log_2(N))}$ and a quantity of elements of the second generator matrix core may be the same as or different from a quantity of elements of the first generator matrix core. For example, if the second generator matrix core is $$\begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

and the matrix block is shown in FIG. 5, distribution of $G_N$ in the matrix block is the same as distribution of is in the second generator matrix core, and distribution of $0_N$ in the matrix block is correspondingly the same as distribution of 0s in the second generator matrix core.

The following describes the matrix block by using specific examples.

Example 1: If the second generator matrix core is $$\begin{bmatrix} 1 & 0 \\ 0 & 1 \end{bmatrix},$$

the matrix block may be $$\begin{bmatrix} G_N & 0_N \\ 0_N & G_N \end{bmatrix},$$

and a quantity of matrix units included in the matrix block is 2×2. Distribution of $G_N$ in the matrix block is the same as distribution of elements 1 in the second generator matrix core.

If $$N = 2, G_N = \begin{bmatrix} 1 & 0 \\ 0 & 1 \end{bmatrix}, \text{ and } \begin{bmatrix} 1 & 0 \\ 0 & 1 \end{bmatrix}$$

is substituted into $G_N$ in the matrix block to obtain the matrix block:

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix}.$$

If $$N = 4, G_N = \begin{bmatrix} 1 & 0 & 0 & 0 \\ 0 & 1 & 0 & 0 \\ 0 & 0 & 1 & 0 \\ 0 & 0 & 0 & 1 \end{bmatrix}, \text{ and } \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

is substituted into $G_N$ in the matrix block to obtain the matrix block:

$$\begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}.$$

Example 2: If the second generator matrix core is $$\begin{bmatrix} 1 & 0 & 0 & 0 \\ 0 & 1 & 0 & 0 \\ 0 & 0 & 1 & 0 \\ 0 & 0 & 0 & 1 \end{bmatrix},$$

the matrix block may be $$\begin{bmatrix} G_N & 0_N & 0_N & 0_N \\ 0_N & G_N & 0_N & 0_N \\ 0_N & 0_N & G_N & 0_N \\ 0_N & 0_N & 0_N & G_N \end{bmatrix},$$

and distribution of $G_N$ in the matrix block is the same as distribution of elements 1 in the second generator matrix core.

If $$N = 2, G_N = \begin{bmatrix} 1 & 0 \\ 0 & 1 \end{bmatrix}, \text{ and } \begin{bmatrix} 1 & 0 \\ 0 & 1 \end{bmatrix}$$

is substituted into $G_N$ in the matrix block to obtain the matrix block:

$$\begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 1 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}.$$

Example 3: If the second generator matrix core is $$\begin{bmatrix} 1 & 0 \\ 1 & 1 \end{bmatrix},$$

the matrix block may be $$\begin{bmatrix} G_N & 0_N \\ G_N & G_N \end{bmatrix},$$

and a quantity of matrix units included in the matrix block is 2×2. Distribution of $G_N$ in the matrix block is the same as distribution of elements 1 in the second generator matrix core.

If $$N = 2, G_N = \begin{bmatrix} 1 & 0 \\ 1 & 1 \end{bmatrix}, \text{ and } \begin{bmatrix} 1 & 0 \\ 1 & 1 \end{bmatrix}$$

is substituted into $G_N$ in the matrix block to obtain the matrix block:

$$\begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

If $$N = 4, G_N = \begin{bmatrix} 1 & 0 & 0 & 0 \\ 1 & 1 & 0 & 0 \\ 1 & 0 & 1 & 0 \\ 1 & 1 & 1 & 1 \end{bmatrix}, \text{ and } \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

is substituted into $G_N$ in the matrix block to obtain the matrix block:

$$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

Example 4: If the second generator matrix core is $$\begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

the matrix block may be $$\begin{bmatrix} G_N & 0_N & 0_N & 0_N \\ G_N & G_N & 0_N & 0_N \\ G_N & 0_N & G_N & 0_N \\ G_N & G_N & G_N & G_N \end{bmatrix},$$

and distribution of $G_N$ in the matrix block is the same as distribution of elements 1 in the second generator matrix core.

If $$N = 2, G_N = \begin{bmatrix} 1 & 0 \\ 1 & 1 \end{bmatrix}, \text{ and } \begin{bmatrix} 1 & 0 \\ 1 & 1 \end{bmatrix}$$

is substituted into $G_N$ in the matrix block to obtain the matrix block:

$$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

The second generator matrix includes at least two matrix blocks distributed based on the preset location relationship. Optionally, a quantity of matrix blocks included in the second generator matrix may be 2.

Optionally, the at least two matrix blocks in the second generator matrix overlap. For example, every two adjacent matrix blocks in the second generator matrix overlap. If the two adjacent matrix blocks are a matrix block 1 and a matrix block 2, an element in the bottom-right corner area of the matrix block 1 overlaps an element in the top-left corner area of the matrix block 2.

For example, when the second generator matrix includes two matrix blocks (denoted as the matrix block 1 and the matrix block 2), the preset location relationship may be: The matrix block 1 is located on the top-left portion of the second generator matrix, the matrix block 2 is located on the bottom-right port of the second generator matrix, and the bottom-right corner area of the matrix block 1 overlaps the top-left corner area of the matrix block 2.

The following describes the second generator matrix with reference to FIG. 6A to FIG. 6D.

Figure 6A:
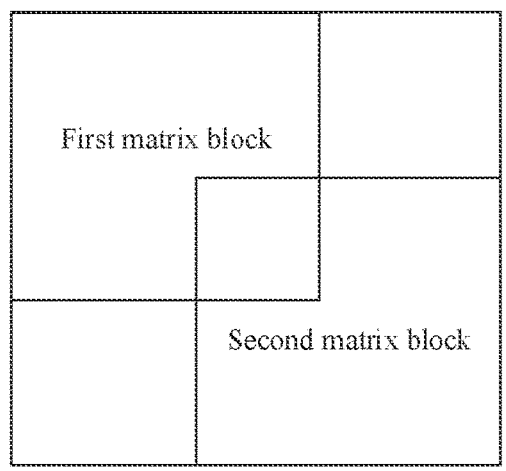
FIG. 6A is a schematic diagram of a second generator matrix according to an embodiment of this application.
Figure 6B:
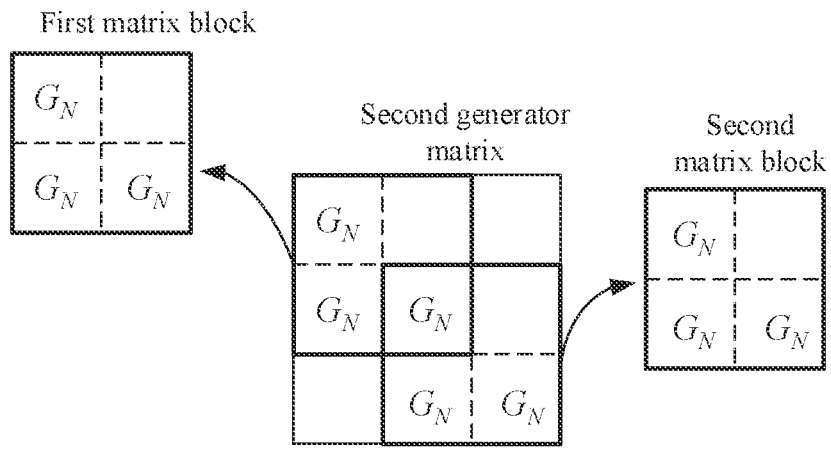
FIG. 6B is another schematic diagram of a second generator matrix according to an embodiment of this application.
Figure 6C:
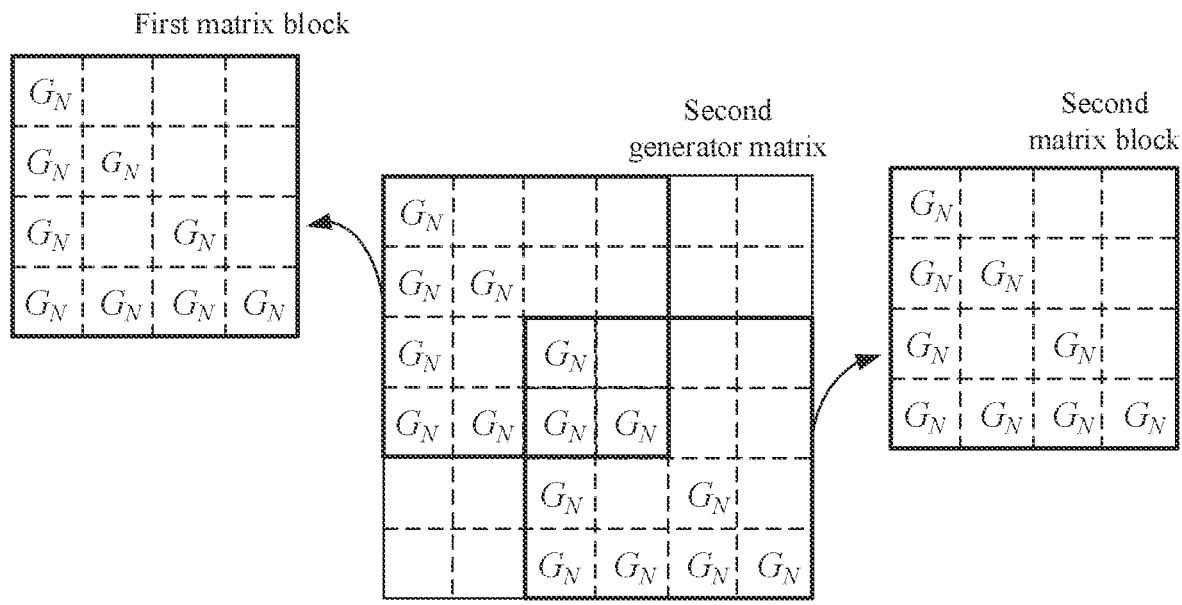
FIG. 6C is another schematic diagram of a second generator matrix according to an embodiment of this application.
Figure 6D:
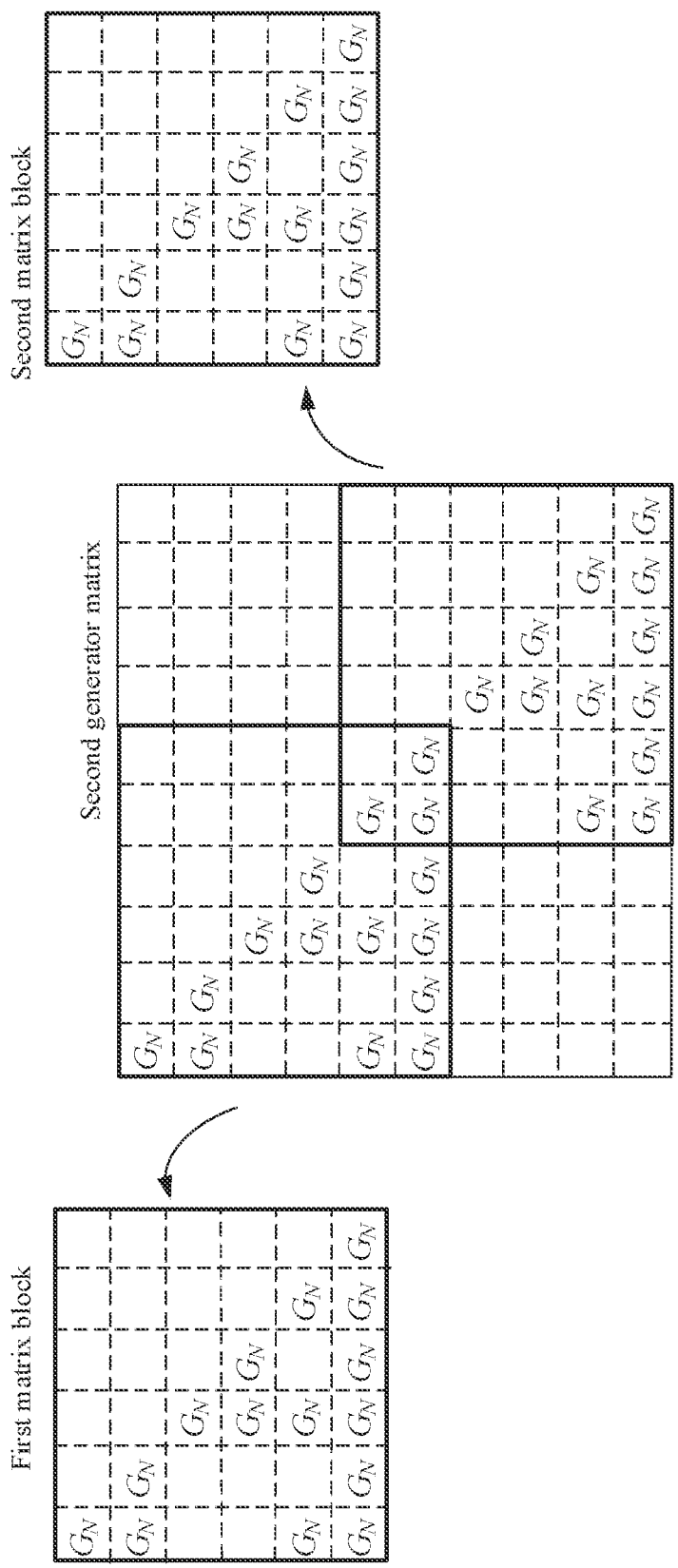
FIG. 6D is another schematic diagram of a second generator matrix according to an embodiment of this application.

FIG. 6A is a schematic diagram of a second generator matrix according to an embodiment of this application. FIG. 6B is a schematic diagram of another second generator matrix according to an embodiment of this application. FIG. 6C is a schematic diagram of still another second generator matrix according to an embodiment of this application. FIG. 6D is a schematic diagram of still another second generator matrix according to an embodiment of this application.

Refer to FIG. 6A. The second generator matrix includes two matrix blocks, which are denoted as a first matrix block and a second matrix block, and the first matrix block is the same as the second matrix block. The first matrix block is located on the top-left portion of the second generator matrix, and the second matrix block is located on the bottom-right portion of the second generator matrix. The bottom-right corner area of the first matrix block overlaps the top-left corner area of the second matrix block, and distribution of elements in the bottom-right corner area of the first matrix block is the same as distribution of elements in the top-left corner area of the second matrix block.

Refer to FIG. 6B. The second generator matrix includes a first matrix block and a second matrix block, and the first matrix block and the second matrix block are $$\begin{bmatrix} G_N & 0_N \\ G_N & G_N \end{bmatrix}.$$

In this case, the second generator matrix may be $$\begin{bmatrix} G_N & 0_N & 0_N \\ G_N & G_N & 0_N \\ 0_N & G_N & G_N \end{bmatrix}.$$

The first matrix block is located on the top-left portion of the second generator matrix, and the second matrix block is located on the bottom-right portion of the second generator matrix. A first matrix unit in the first matrix block overlaps a second matrix unit in the second matrix block. Coordinates of the first matrix unit in the first matrix block are (2, 2), and coordinates of the second matrix unit in the second matrix block are (1, 1).

Refer to FIG. 6C. The second generator matrix includes a first matrix block and a second matrix block, and the first matrix block and the second matrix block are $$\begin{bmatrix} G_N & 0_N & 0_N & 0_N \\ G_N & G_N & 0_N & 0_N \\ G_N & 0_N & G_N & 0_N \\ G_N & G_N & G_N & G_N \end{bmatrix}.$$

In this case, the second generator matrix may be $$\begin{bmatrix} G_N & 0_N & 0_N & 0_N & 0_N & 0_N \\ G_N & G_N & 0_N & 0_N & 0_N & 0_N \\ G_N & 0_N & G_N & 0_N & 0_N & 0_N \\ G_N & G_N & G_N & G_N & 0_N & 0_N \\ 0_N & 0_N & G_N & 0_N & G_N & 0_N \\ 0_N & 0_N & G_N & G_N & G_N & G_N \end{bmatrix}.$$

The first matrix block is located on the top-left portion of the second generator matrix, and the second matrix block is located on the bottom-right portion of the second generator matrix. Four first matrix units in the first matrix block overlap four second matrix units in the second matrix block. Coordinates of the four first matrix units in the first matrix block are (3, 3), (3, 4), (4, 3), and (4, 4); and coordinates of the four second matrix units in the second matrix block are (1, 1), (1, 2), (2, 1), and (2, 2).

Refer to FIG. 6D. The second generator matrix includes a first matrix block and a second matrix block, and the first matrix block and the second matrix block are $$\begin{bmatrix} G_N & 0_N & 0_N & 0_N & 0_N & 0_N \\ G_N & G_N & 0_N & 0_N & 0_N & 0_N \\ 0_N & 0_N & G_N & 0_N & 0_N & 0_N \\ 0_N & 0_N & G_N & G_N & 0_N & 0_N \\ G_N & 0_N & G_N & 0_N & G_N & 0_N \\ G_N & 0_N & G_N & G_N & G_N & G_N \end{bmatrix}.$$

In this case, the second generator matrix may be $$\begin{bmatrix} G_N & 0_N & 0_N & 0_N & 0_N & 0_N & 0_N & 0_N & 0_N & 0_N \\ G_N & G_N & 0_N & 0_N & 0_N & 0_N & 0_N & 0_N & 0_N & 0_N \\ 0_N & 0_N & G_N & 0_N & 0_N & 0_N & 0_N & 0_N & 0_N & 0_N \\ 0_N & 0_N & G_N & G_N & 0_N & 0_N & 0_N & 0_N & 0_N & 0_N \\ G_N & 0_N & G_N & 0_N & G_N & 0_N & 0_N & 0_N & 0_N & 0_N \\ G_N & G_N & G_N & G_N & G_N & G_N & 0_N & 0_N & 0_N & 0_N \\ 0_N & 0_N & 0_N & 0_N & 0_N & 0_N & G_N & 0_N & 0_N & 0_N \\ 0_N & 0_N & 0_N & 0_N & 0_N & 0_N & G_N & G_N & 0_N & 0_N \\ 0_N & 0_N & 0_N & 0_N & 0_N & 0_N & 0_N & 0_N & 0_N & 0_N \\ 0_N & 0_N & 0_N & 0_N & G_N & 0_N & G_N & 0_N & G_N & 0_N \\ 0_N & 0_N & 0_N & 0_N & G_N & G_N & G_N & G_N & G_N & G_N \end{bmatrix}.$$

The first matrix block is located on the top-left portion of the second generator matrix, and the second matrix block is located on the bottom-right portion of the second generator matrix. Four first matrix units in the first matrix block overlap four second matrix units in the second matrix block. Coordinates of the four first matrix units in the first matrix block are (5, 5), (5, 6), (6, 5), and (6, 6); and coordinates of the four second matrix units in the second matrix block are (1, 1), (1, 2), (2, 1), and (2, 2).

It should be noted that, for ease of description and viewing, in FIG. 6B to FIG. 6D, marks of $0_N$ are omitted in the figures, that is, all blank matrix units in FIG. 6B to FIG. 6D are $0_N$.

The following describes the first generator matrix.

Specifically, a quantity A of matrix blocks included in the first generator matrix may be determined based on the second generator matrix, a size of a matrix block, and a code length M of T subblocks, and the first generator matrix is generated based on the second generator matrix and the quantity A.

Optionally, A is a minimum integer that enables a first condition to be satisfied, and the first condition is that a size of the first generator matrix is greater than or equal to the code length M of the T subblocks. The first generator matrix is a square matrix, and the size of the first generator matrix may be indicated by a quantity of rows or columns included in the first generator matrix, that is, the size of the first generator matrix is the quantity of rows or columns included in the first generator matrix.

For example, A satisfies the following relationship: $v+(A-2)*g<M\leq v+(A-1)*g$.

v is the size of the matrix block (the matrix block is a square matrix, and v indicates a quantity of rows or columns of elements included in the matrix block). M is the code length of the T subblocks, and M is an integer greater than 1. g is a distance between two matrix blocks, and a distance (a row number difference or a column number difference) between first elements (for example, the first element may be an element whose coordinates are (1, 1) in a matrix block) in two adjacent matrix blocks may be used to indicate the distance between the two matrix blocks.

For example, if the size v of the matrix block is 256, the code length of the T subblocks is 512, and the distance g between the two adjacent matrix blocks is 128, A is 3.

For example, if the size v of the matrix block is 384, the code length of the T subblocks is 512, and the distance g between the two adjacent matrix blocks is 128, A is 2.

Figure 7A:
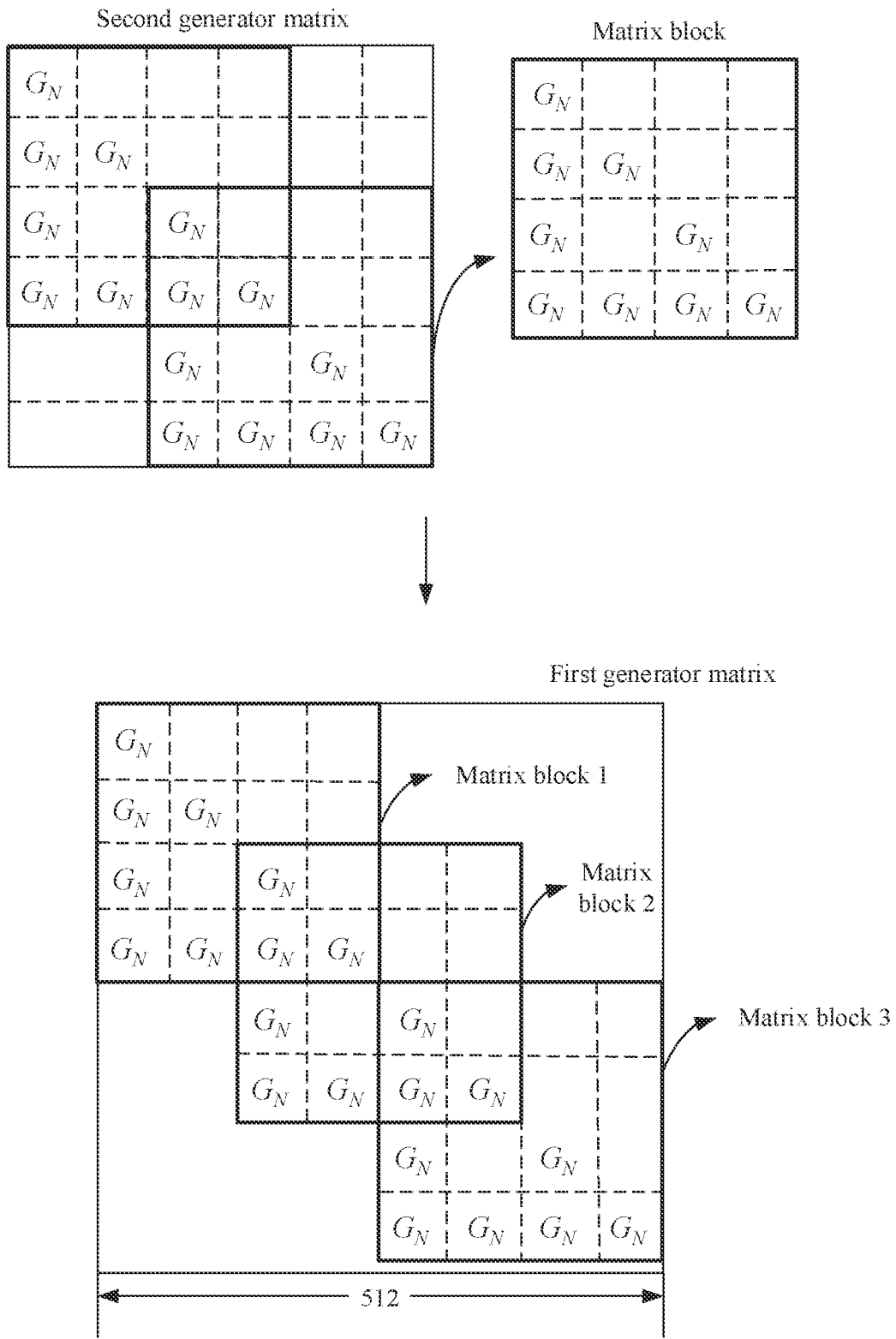
FIG. 7A is a schematic diagram of a first generator matrix according to an embodiment of this application.
Figure 7B:
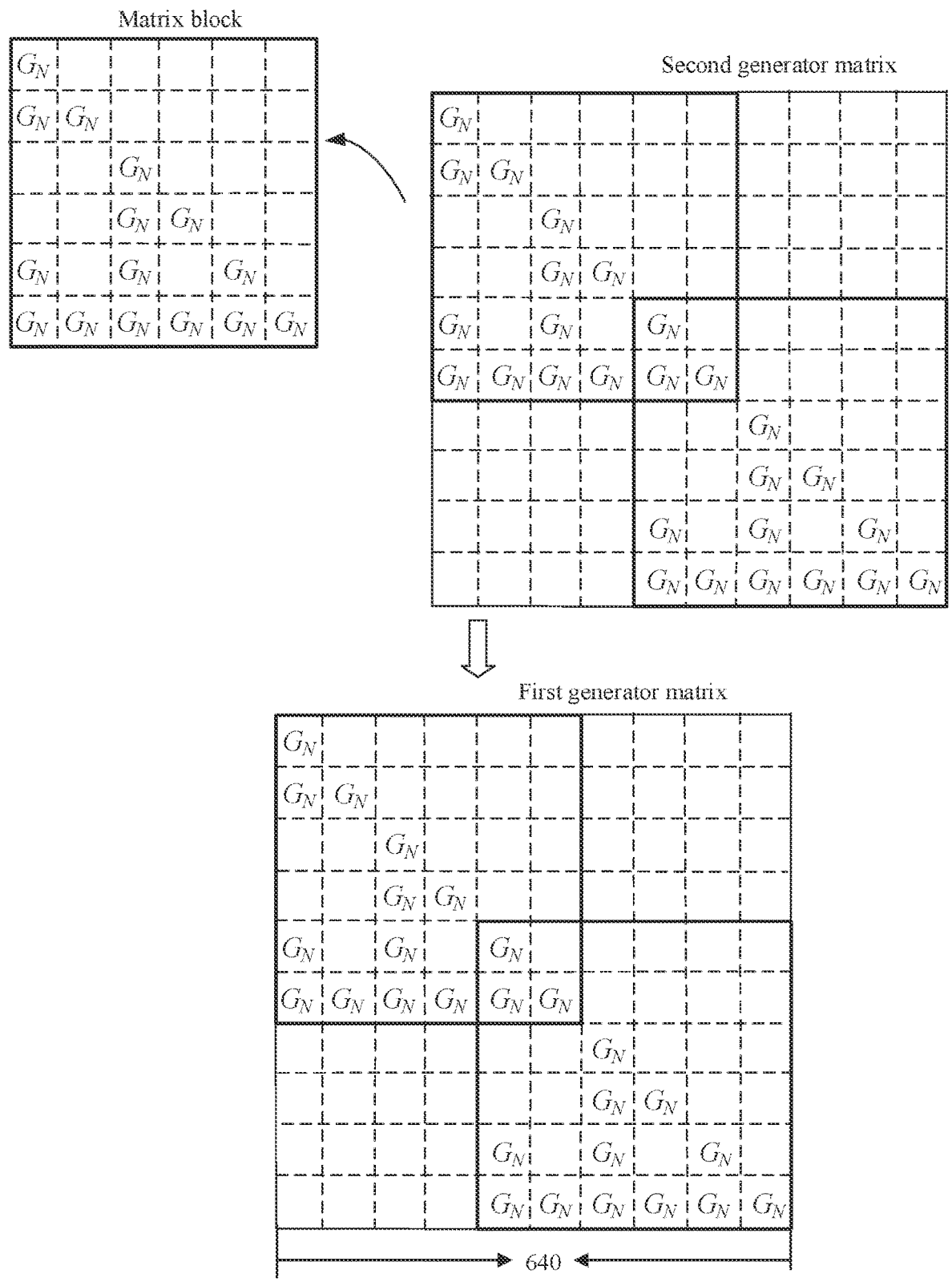
FIG. 7B is another schematic diagram of a first generator matrix according to an embodiment of this application.
Figure 7C:
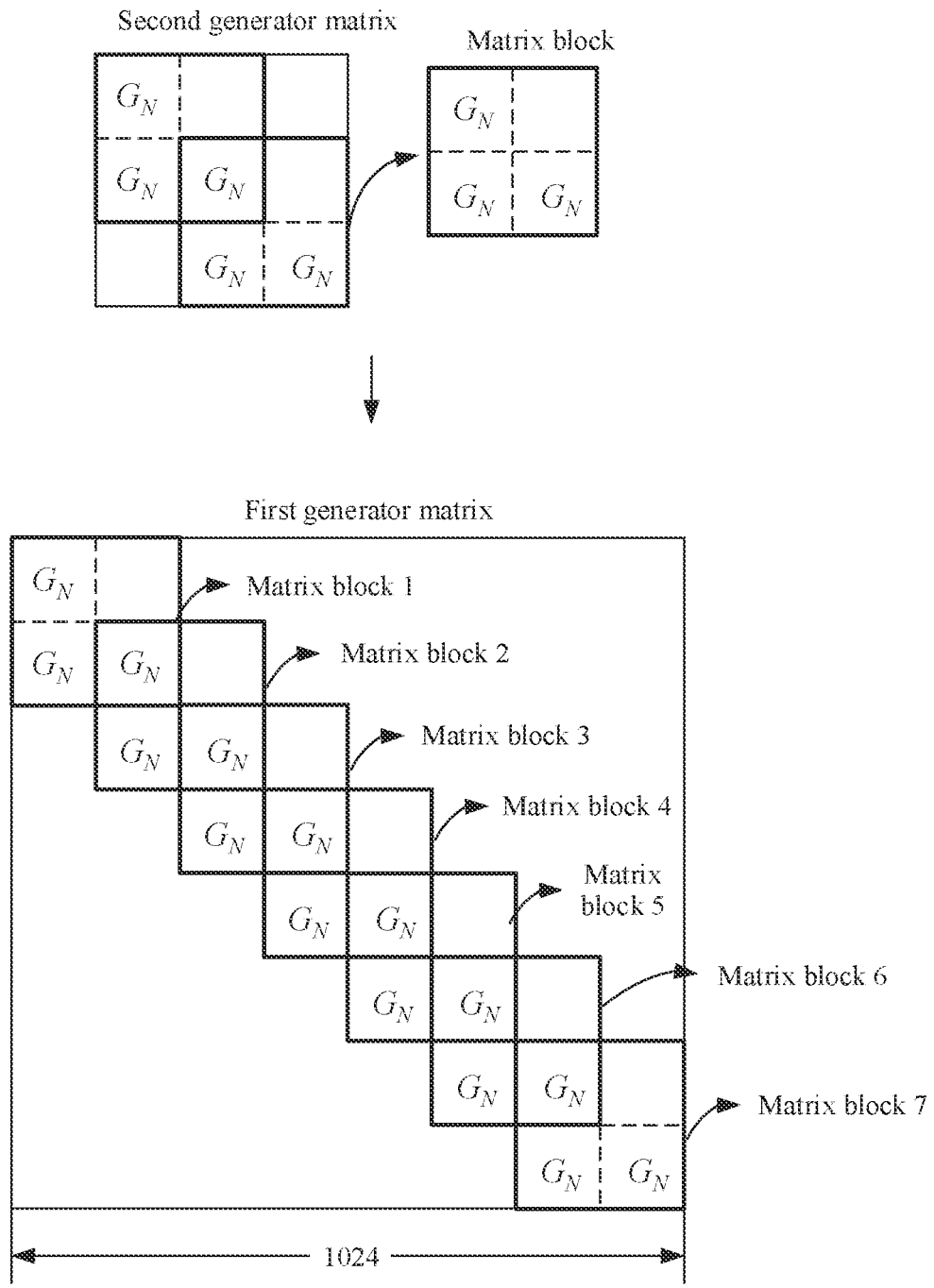
FIG. 7C is another schematic diagram of a first generator matrix according to an embodiment of this application.

The following describes the first generator matrix by using a specific example with reference to FIG. 7A to FIG. 7C.

FIG. 7A is a schematic diagram of a first generator matrix according to an embodiment of this application. Refer to FIG. 7A. A second generator matrix includes two matrix blocks, each matrix block includes 16 matrix units, a part of matrix units are $G_N$, and a part of matrix units are $0_N$. A location relationship between the two matrix blocks is shown in FIG. 7A.

If a size of each matrix unit is 64 (including 64 rows and 64 columns), a size of the matrix block is 256, a distance between the two matrix blocks in the second generator matrix is 128. If a code length M of T subblocks is 512, the first generator matrix includes three matrix blocks, denoted as: a matrix block 1, a matrix block 2, and a matrix block 3. A location relationship between every two adjacent matrix blocks in the three matrix blocks is the same as the location relationship between the two matrix blocks in the second generator matrix. A size of the first generator matrix (a quantity of rows or columns included in the first generator matrix) is 512.

FIG. 7B is a schematic diagram of another first generator matrix according to an embodiment of this application. Refer to FIG. 7B. If a second generator matrix includes two matrix blocks, each matrix block includes 36 matrix units, a part of matrix units are $G_N$, and a part of matrix units are $0_N$. A location relationship between the two matrix blocks is shown in FIG. 6B.

If a size of each matrix unit is 64 (including 64 rows and 64 columns), a size of the matrix block is 384, a distance between the two matrix blocks in the second generator matrix is 128. If a code length M of T subblocks is 512, the first generator matrix includes two matrix blocks, denoted as: a matrix block 1 and a matrix block 2. A location relationship between every two adjacent matrix blocks in the two matrix blocks is the same as the location relationship between the two matrix blocks in the second generator matrix. A size of the first generator matrix (a quantity of rows or columns included in the first generator matrix) is 640.

FIG. 7C is a schematic diagram of still another first generator matrix according to an embodiment of this application. Refer to FIG. 7C. If a second generator matrix includes two matrix blocks, each matrix block includes 4 matrix units, a part of matrix units are $G_N$, and a part of matrix units are $0_N$. A location relationship between the two matrix blocks is shown in FIG. 7C.

If a size of each matrix unit is 128 (including 128 rows and 128 columns), a size of the matrix block is 256, a distance between the two matrix blocks in the second generator matrix is 128. If a code length M of T subblocks is 1024, the first generator matrix includes seven matrix blocks, denoted as: a matrix block 1, a matrix block 2, . . . , a matrix block 6, and a matrix block 7. A location relationship between every two adjacent matrix blocks in the seven matrix blocks is the same as the location relationship between the two matrix blocks in the second generator matrix. A size of the first generator matrix (a quantity of rows or columns included in the first generator matrix) is 1024.

It should be noted that, in FIG. 7A to FIG. 7C, all matrix units other than $G_N$ are $0_N$. For ease of description and viewing, marks of $0_N$ are omitted in the figures, that is, all blank matrix units in FIG. 7A to FIG. 7C are $0_N$.

It should be noted that FIG. 7A to FIG. 7C show merely the examples of the first generator matrix, and do not limit the first generator matrix. Certainly, there may alternatively be another first generator matrix. This is not specifically limited in this embodiment of this application.

The following describes a process of performing polar encoding on an input vector by using a first generator matrix to obtain an encoded bit.

If a size of the first generator matrix is equal to a code length M of T subblocks, polar encoding is performed on the input vector by using the first generator matrix to obtain the encoded bit. For example, the first generator matrix shown in FIG. 7A is the first generator matrix shown in FIG. 4B, and a codeword coupling relationship exists between four adjacent subblocks. As shown in FIG. 4B, the input vector is multiplied by the first generator matrix to obtain the encoded bit.

If the size of the first generator matrix is greater than the code length M of the T subblocks, a third generator matrix is first determined in the first generator matrix, and polar encoding is performed on the input vector by using the third generator matrix to obtain the encoded bit. The third generator matrix is a matrix taken from the top-left corner area of the first generator matrix, or the third generator matrix is a matrix taken from the bottom-right corner area of the first generator matrix. The third generator matrix is a square matrix.

Figure 8A:
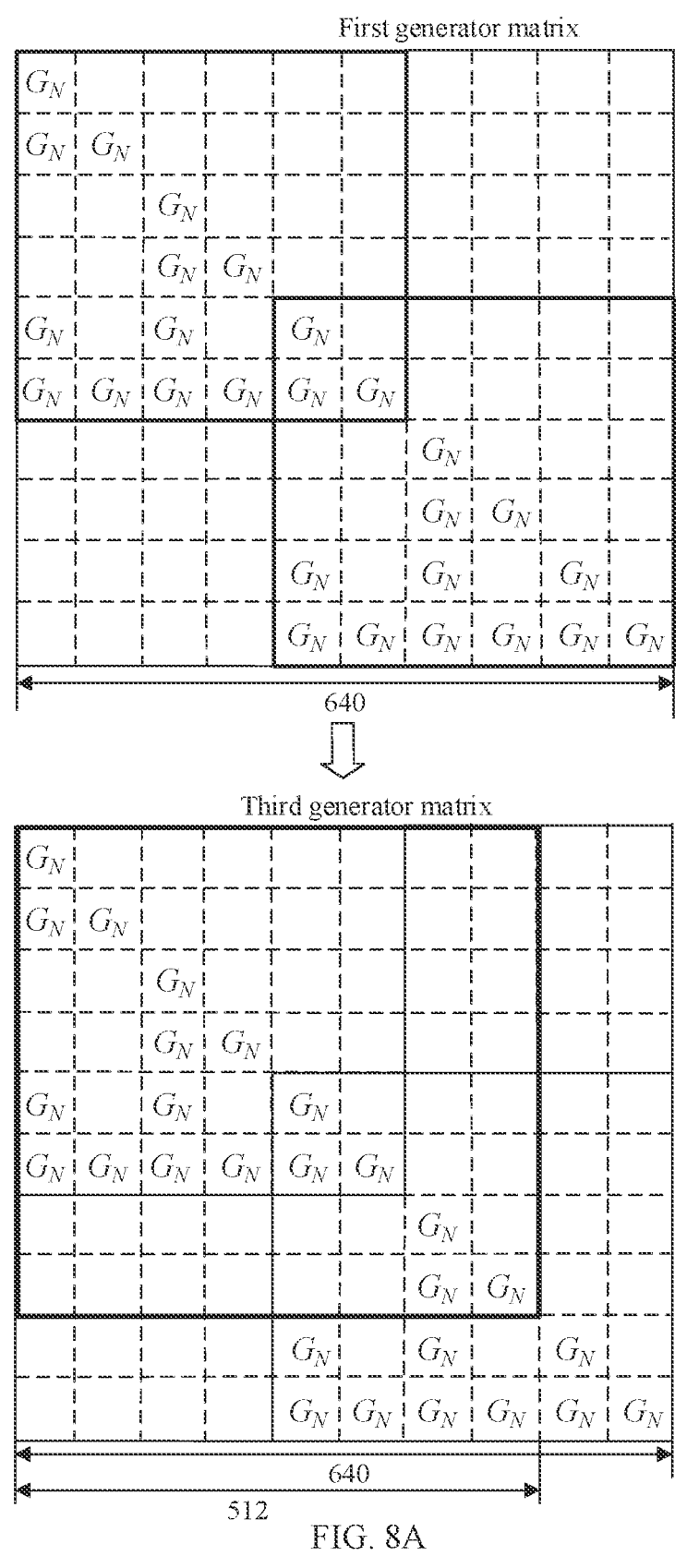
Figure 8B:
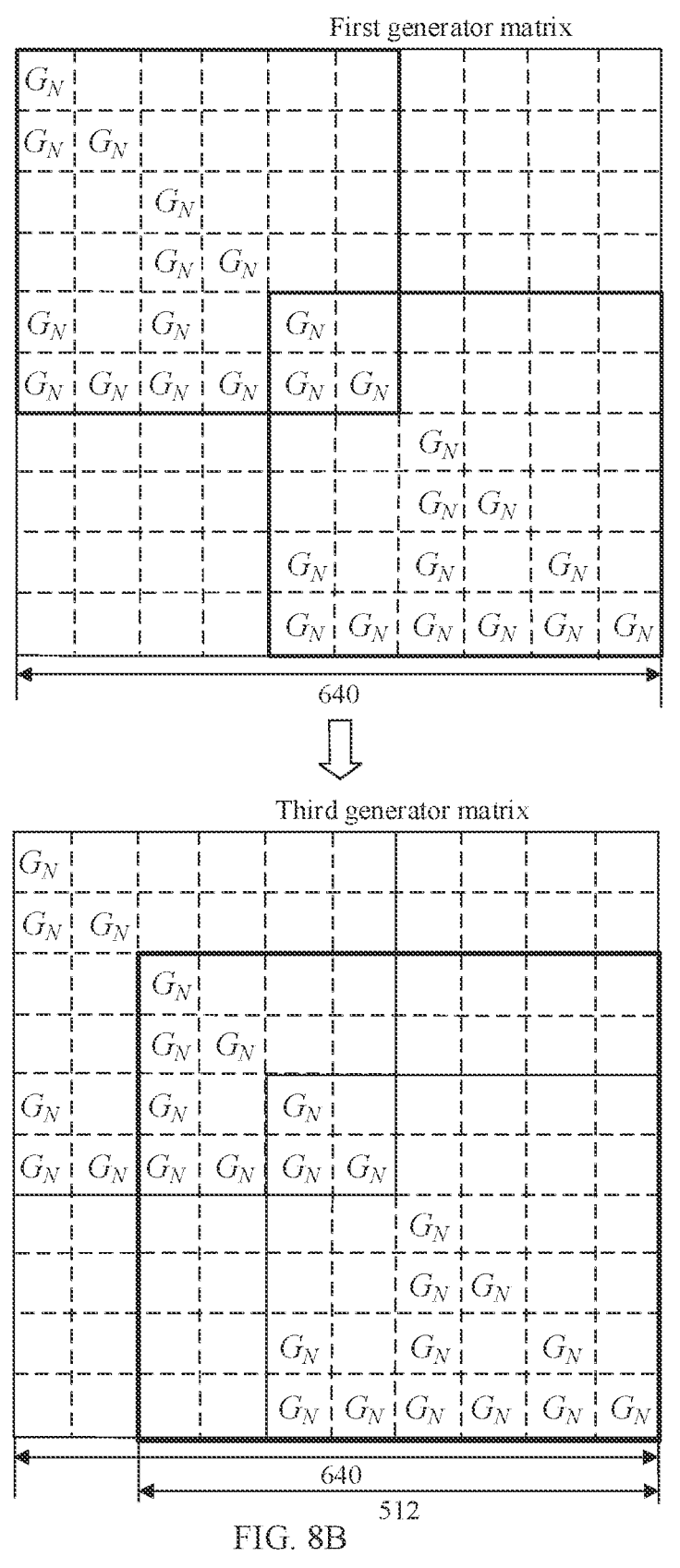

The following describes the third generator matrix with reference to FIG. 8A and FIG. 8B.

FIG. 8A is a schematic diagram of a third generator matrix according to an embodiment of this application. Refer to FIG. 8A. If a code length of T subblocks is 512, and a size of a first generator matrix is 640, a matrix whose size is 512 may be taken from the top-left corner of the first generator matrix as the third generator matrix.

FIG. 8B is a schematic diagram of another third generator matrix according to an embodiment of this application. Refer to FIG. 8B. If a code length of T subblocks is 512, and a size of a first generator matrix is 640, a matrix whose size is 512 may be taken from the bottom-right corner of the first generator matrix as the third generator matrix.

In a possible implementation, the embodiment shown in FIG. 4A further includes step 403.

403: Obtain K to-be-encoded bits.

The to-be-encoded bit is an information bit, that is, the to-be-encoded bit is a bit that carries specific information, and K is a positive integer.

Optionally, the second information bit of the second subblock is the information bit in the to-be-encoded bits, or is an information bit obtained by replicating the to-be-encoded bit. In this case, the first information bit of the first subblock is the information bit obtained by replicating the to-be-encoded bit. Alternatively, the first information bit of the first subblock is an information bit obtained by replicating the second information bit of the second subblock, and the second information bit of the second subblock is the information bit obtained by replicating the to-be-encoded bit.

Figures 9A, 9B, 10A:
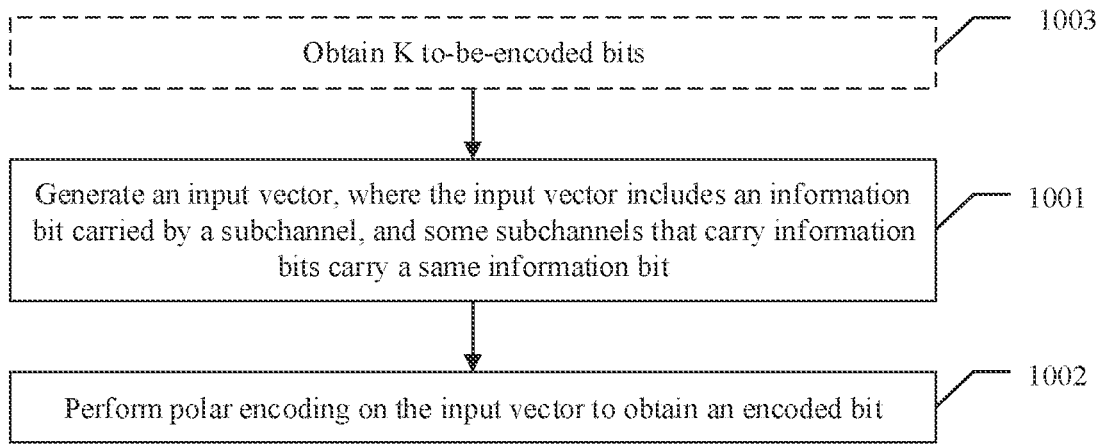
FIG. 9A is a schematic diagram of another scenario of an encoding method according to an embodiment of this application.
FIG. 9B is a schematic diagram of another scenario of an encoding method according to an embodiment of this application.
FIG. 10A is another schematic flowchart of an encoding method according to an embodiment of this application.

The following further shows some examples in embodiments of this application by using FIG. 9A and FIG. 9B.

Refer to FIG. 9A. In an input vector in FIG. 9A, an information coupling relationship exists between adjacent subblocks, and a codeword coupling relationship exists between four adjacent subblocks. It is set that the information coupling relationship exists between some subblocks of the T subblocks and the codeword coupling relationship exists between some subblocks of the T subblocks. In this way, encoding and decoding complexity are reduced while ensuring an encoding gain.

Refer to FIG. 9B. In an input vector in FIG. 9B, an information coupling relationship exists between adjacent subblocks, and a codeword coupling relationship exists between eight subblocks. It is set that the information coupling relationship exists between some of the eight subblocks. In this way, encoding and decoding complexity are reduced while ensuring an encoding gain.

It can be learned that an embodiment of this application provides a flexible code construction framework. The code construction framework includes code construction, an encoding process, and a decoding process. In the code construction process, an appropriate information coupling degree and codeword coupling degree may be set to obtain a performance gain similar to a performance gain of an IR-HARQ. Encoding and decoding complexity, and the performance gain are balanced. A small information coupling degree may be set to reduce hardware overheads and avoid a switching network that has a complex information replication process.

In this embodiment of this application, a maximum mother code length supported by a hardware resource (for example, a decoder chip) is limited to some extent. For example, Nmax=1024, Nmax=512, or Nmax=256. A larger code coupling degree brings a better performance gain. Therefore, the encoding and decoding complexity, and the performance gain need to be balanced.

The following shows several codeword coupling degree solutions used by a transmitting end for retransmission.

1. A supported maximum codeword coupling degree is determined based on a maximum mother code length and a code length of an initially transmitted subblock. When a total code length of subblocks (including the initially transmitted subblock and a retransmitted subblock) sent by the transmitting end to a receiving end is less than the maximum mother code length, the transmitting end may perform retransmission (similar to an IR-HARQ retransmission mode) by using a large codeword coupling degree (but not greater than the maximum codeword coupling degree). When a total code length of subblocks (including the initially transmitted subblock and a retransmitted subblock) sent by the transmitting end to a receiving end reaches or exceeds the maximum mother code length, a codeword coupling degree is no longer increased, and the transmitting end may perform retransmission by using a fixed codeword coupling degree (for example, retransmission may be performed by using the maximum codeword coupling degree, which is similar to an IR-HARQ retransmission mode). In this way, a hardware resource can be fully utilized, and the performance gain can be ensured. In this mode, the maximum codeword coupling degree is calculated in the following two modes.

(1) The code length of the initially transmitted subblock is N, and an initial transmission mother code length is $N_0 = 2^{\lceil log_2 N \rceil}$. $\lceil x \rceil$ is a round-up value of x. $N_{max}$ is a maximum mother code length specified in a communication protocol, or a maximum code length supported by a decoder. In this way, the maximum codeword coupling degree is $p = N_{max}/N_0$. The codeword coupling degree refers to a quantity of subblocks that have a codeword coupling relationship and that are in T subblocks.

(2) When the code length of the initially transmitted subblock is N, and $N_{max}$ is a maximum mother code length specified in a communication protocol, or is a maximum code length supported by a decoder, the maximum codeword coupling degree is $p=\lfloor N_{max}/N \rfloor$, where $\lfloor x \rfloor$ is a round-down value of x.

2. A supported maximum codeword coupling degree is determined based on a first target code length and a code length of an initially transmitted subblock. When a total code length of subblocks (including the initially transmitted subblock and a retransmitted subblock) sent by the transmitting end to a receiving end is less than the first target code length, the transmitting end may perform retransmission (similar to an IR-HARQ retransmission mode) by using a large codeword coupling degree (but not greater than the maximum codeword coupling degree). When a total code length of subblocks (including the initially transmitted subblock and a retransmitted subblock) sent by the transmitting end to a receiving end is greater than or equal to the first target code length, a codeword coupling degree is no longer increased, and the transmitting end may perform retransmission by using a fixed codeword coupling degree (for example, retransmission may be performed by using the maximum codeword coupling degree, which is similar to an IR-HARQ retransmission mode). When a total code length of subblocks sent by the transmitting end to a receiving end is greater than or equal to a second target code length, encoding is no longer performed, and the transmitting end repeatedly transmits, in a sequence, the retransmitted subblock that has been sent (similar to a CC-HARQ retransmission mode).

The first target code length $N_1$ and the second target code length $N_2$ are specified in a communication protocol. The first target code length $N_1$ may be understood as a maximum mother code length specified in the communication protocol, or a maximum mother code length supported by a decoder.

For example, the code length of the initially transmitted subblock is N, and an initial transmission mother code length is $N_0 2^{\lceil log_2 N \rceil}$. $\lceil x \rceil$ is a round-up value of x. When the total code length of the subblocks (including the initially transmitted subblock and the retransmitted subblock) that have been sent by the transmitting end to the receiving end is K, the maximum codeword coupling degree is $p_1=N_1/N_0$ or $p_1=\lfloor N_1/N \rfloor$, where a relationship between $N_0$, $N_1$, and $N_2$ is $N_0 \leq N_1 \leq N_2$. When K is less than $N_1$, retransmission is performed by using a codeword coupling degree as large as possible (but not greater than the maximum codeword coupling degree $p_1$). When the total code length K is greater than or equal to the first target code length $N_1$ and less than or equal to the second target code length $N_2$, retransmission is still performed by using the codeword coupling degree $p_1$. When the total code length K is greater than $N_2$, the transmitting end no longer performs encoding, but repeatedly sends an encoded bit.

3. A codeword coupling degree used in retransmission is determined based on a total code rate of subblocks sent by the transmitting end to a receiving end. When the total code rate of the subblocks (including an initially transmitted subblock and a retransmitted subblock) sent by the transmitting end to the receiving end is less than a first preset target code rate, the transmitting end performs retransmission (similar to an IR-HARQ retransmission mode) by using a large codeword coupling degree (not greater than a first preset codeword coupling degree). When the total code rate of the subblocks (including an initially transmitted subblock and a retransmitted subblock) sent by the transmitting end to the receiving end is greater than or equal to a first preset target code rate and less than or equal to a second preset target code rate, the transmitting end performs retransmission by using a fixed codeword coupling degree (for example, the first preset codeword coupling degree, which is similar to an IR-HARQ retransmission mode). When the total code rate of the subblocks (including an initially transmitted subblock and a retransmitted subblock) sent by the transmitting end to the receiving end is greater than a second preset target code rate, the transmitting end does not perform encoding anymore, but repeatedly sends an encoded bit (similar to a CC-HARQ retransmission mode).

Example 2: If an initial transmission code length is N, an information bit is K, and an initial transmission code rate is $R_0=K/N$. It is assumed that a total code length of the initially transmitted subblock and the retransmitted subblock that have been currently sent by the transmitting end to the receiving end is M. It is assumed that a total bit rate is $R=K/M$. It is assumed that $R_1$ is a first preset target code rate specified in a communication protocol, and $p_t$ is a coupling degree 1 specified in the communication protocol. $R_2$ is a second preset target code rate specified in the communication protocol. A relationship between $R_0$, $R_1$, and $R_2$ is $R_0 \geq R_1 \geq R_2$. When the total code rate of the initially transmitted subblock and the retransmitted subblock is $R<R_1$, the transmitting end performs retransmission by using a codeword coupling degree as large as possible (but the used codeword coupling degree is $p<p_1$). When the total code rate of the initially transmitted subblock and the retransmitted subblock is $R_1 \leq R \leq R_2$, the transmitting end still performs retransmission by using the codeword coupling degree $p_1$. When the total code rate of the initially transmitted subblock and the retransmitted subblock is $R>N_2$, the transmitting end no longer performs encoding, but repeatedly sends the encoded bit.

It can be learned that the retransmission mode in this embodiment of this application is combined with the IR-HARQ and the CC-HARQ, and is more competitive in terms of the performance gain, and the encoding and decoding complexity.

In this embodiment of this application, K to-be-encoded bits are obtained, where K is a positive integer. The input vector is generated, where the input vector includes the T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer ranging from 2 to T. Polar encoding is performed on the input vector to obtain the encoded bit. It can be learned that, in the encoding process, the first information bit of the first subblock is obtained by replicating the second information bit of the second subblock, which is equivalent to setting an information coupling relationship between the first subblock and the second subblock. In this way, a check relationship exists between the first information bit of the first subblock and the second information bit of the second subblock. Therefore, in the encoding/decoding process, encoding/decoding may be performed based on the information coupling relationship between the first subblock and the second subblock. In this way, encoding/decoding complexity is reduced.

The following describes another encoding method with reference to FIG. 10A. FIG. 10A is a schematic diagram of another embodiment of an encoding method according to an embodiment of this application. Refer to FIG. 10A. The method includes the following steps.

1001: Generate an input vector.

The input vector includes an information bit carried by a subchannel, and some subchannels that carry information bits carry a same information bit.

Specifically, the information bit carried by the subchannel include K to-be-encoded bits.

That the some subchannels that carry the information bits carry the same information bit includes the following two possible cases. The following provides an example for description with reference to FIG. 10B and FIG. 10C.

Figure 10B:
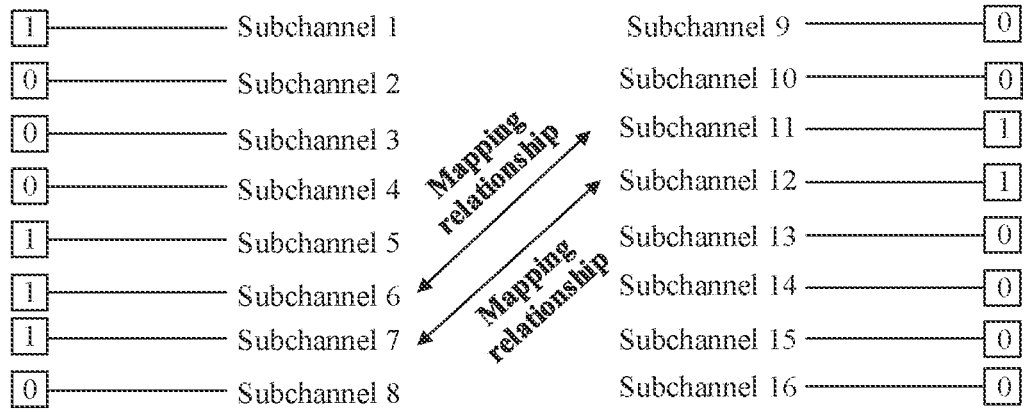
FIG. 10B is a schematic diagram of another scenario of an encoding method according to an embodiment of this application.

Refer to FIG. 10B. The input vector includes bits carried by a subchannel 1 to a subchannel 16. The K to-be-encoded bits are separately information bits "1" carried by the subchannel 1, the subchannel 5, the subchannel 6, and the subchannel 7. An information bit "1" carried by the subchannel 11 is obtained by replicating the information bit "1" carried by the subchannel 5, and an information bit "1" carried by the subchannel 12 is obtained by replicating the information bit "1" carried by the subchannel 6. That is, it may be understood that the subchannel 11 and the subchannel 6 carry the same information bit, and the subchannel 12 and the subchannel 7 carry the same information bit. In addition, some bits in the K to-be-encoded bits are replicated on the subchannel 11 and the subchannel 12.

Figure 10C:
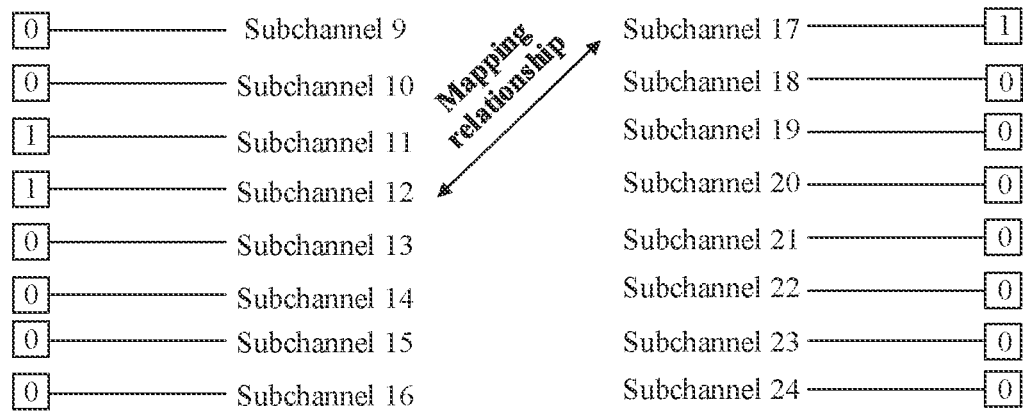
FIG. 10C is a schematic diagram of another scenario of an encoding method according to an embodiment of this application.

Refer to FIG. 10B and FIG. 10C. The input vector includes bits carried by a subchannel 1 to a subchannel 24. For description related to FIG. 10B, refer to the description in the foregoing paragraph. An information bit "1" carried by the subchannel 17 is obtained by replicating an information bit "1" carried by the subchannel 12, and an information bit "1" carried by the subchannel 12 is obtained by replicating the information bit "1" carried by the subchannel 6. The subchannel 12 and the subchannel 7 carry the same information bit, and the subchannel 7 carries a bit in the K to-be-encoded bits.

Optionally, the input vector further includes another new information bit or frozen bit. In the following embodiment or implementation, an example in which the frozen bit is further included is used for description.

1002: Perform polar encoding on the input vector to obtain an encoded bit.

Optionally, the embodiment shown in FIG. 10A further includes step 1003.

Step 1003: Obtain the K to-be-encoded bits.

Step 1003 is similar to step 403 in the embodiment shown in FIG. 4A. For details, refer to the detailed description of step 403 in the embodiment shown in FIG. 4A. Details are not described herein again.

The following describes another description method of step 402 in the embodiment shown in FIG. 4A.

In a possible implementation, step 402 specifically includes:

performing polar encoding on the input vector by using a first generator matrix to obtain the encoded bit.

That is, the first generator matrix may reflect a codeword coupling relationship between encoded bit sequences corresponding to the T subblocks included in the input vector.

The first generator matrix is generated based on a second generator matrix, the second generator matrix includes at least two matrix blocks distributed based on a preset location relationship, and the matrix block includes a plurality of first generator matrix cores. The first generator matrix includes A matrix blocks, a location relationship between two adjacent matrix blocks in the A matrix blocks is determined based on the preset location relationship, and A is a positive integer.

The second generator matrix is equivalent to the matrix block in the embodiment shown in FIG. 4A. The description of the matrix block in the embodiment shown in FIG. 4A may be the second generator matrix herein. Details are not described herein again.

The second generator matrix includes a first submatrix block and a second submatrix block, the first submatrix block is located at the top-left corner of the second submatrix block, the second submatrix block is located at the bottom-right corner of the first generator matrix, the first submatrix block and the second submatrix block are the same, a distance between a first element of the first submatrix block and a second element of the second submatrix block is u in a diagonal direction of the second generator matrix (The following may also be briefly referred to as a distance between the first submatrix block and the second submatrix block), and u is an integer greater than or equal to 1.

Optionally, the first element may be an element at the top-left corner of the first submatrix block, and the second element may be an element at the top-left corner of the second submatrix block. The distance between the first element and the second element is a difference between row numbers of the first element and the second element or a difference between column numbers of the first element and the second element. For example, the first element is 0 or 1.

All elements of the second generator matrix other than the first submatrix block and the second submatrix block may be elements 0.

Optionally, the first submatrix block and the second submatrix block may include one or more matrix units, and the matrix unit may be $G_N$ or $0_N$. Both the first submatrix block and the second submatrix block are square matrices. For description of $G_N$ and $0_N$, refer to the embodiment shown in FIG. 4A.

The second generator matrix satisfies a self-similarity (or referred to as a shift self-similarity). The self-similarity means that after the first submatrix block of the second generator matrix moves (for example, moves along a primary diagonal of the second generator matrix) by a preset distance, the first submatrix block may move to a location of the second submatrix block, and content in the first submatrix block is the same as content in the second submatrix block. When the second generator matrix has the similarity, an element of the second generator matrix is $a_{i,j}=a_{i+u,j+u}$, where i is an integer, j is an integer, v is a size of the second generator matrix, v is a positive integer, u is an integer, $1 \le i < v$, $1 \le j < v$, $1 < i+u \le v$, and $1 < j+u \le v$.

Figure 11A:
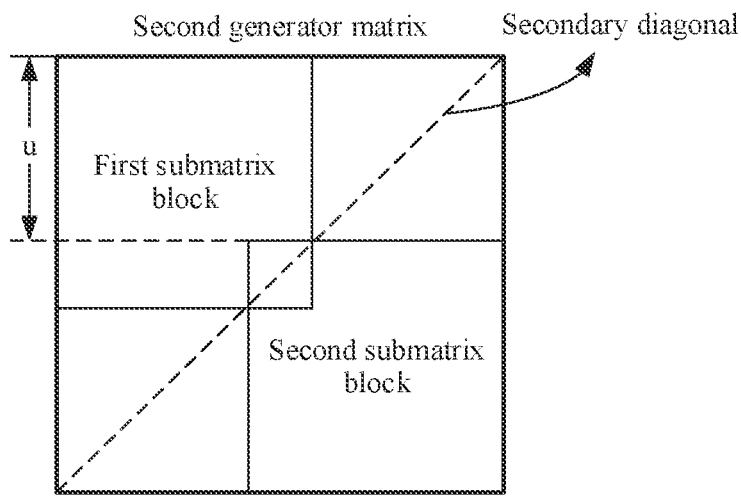
FIG. 11A is another schematic diagram of a second generator matrix according to an embodiment of this application.
Figure 11B:
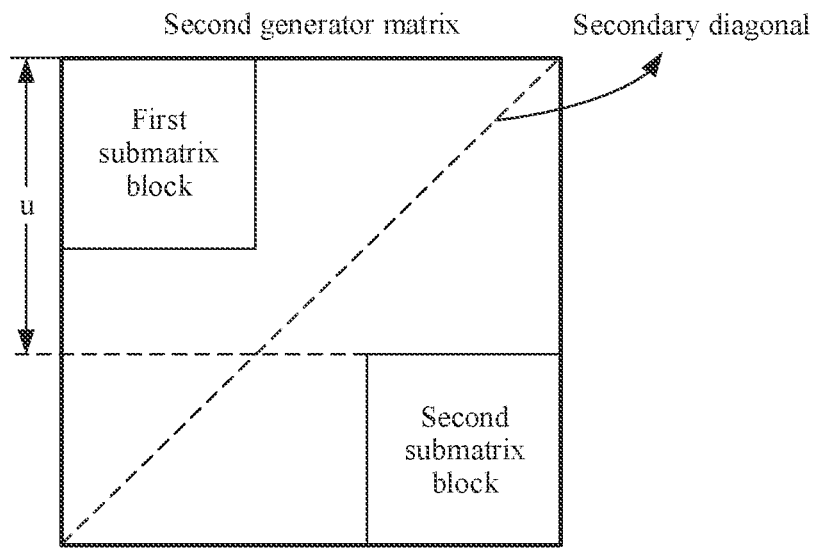
FIG. 11B is another schematic diagram of a second generator matrix according to an embodiment of this application.
Figure 11C:
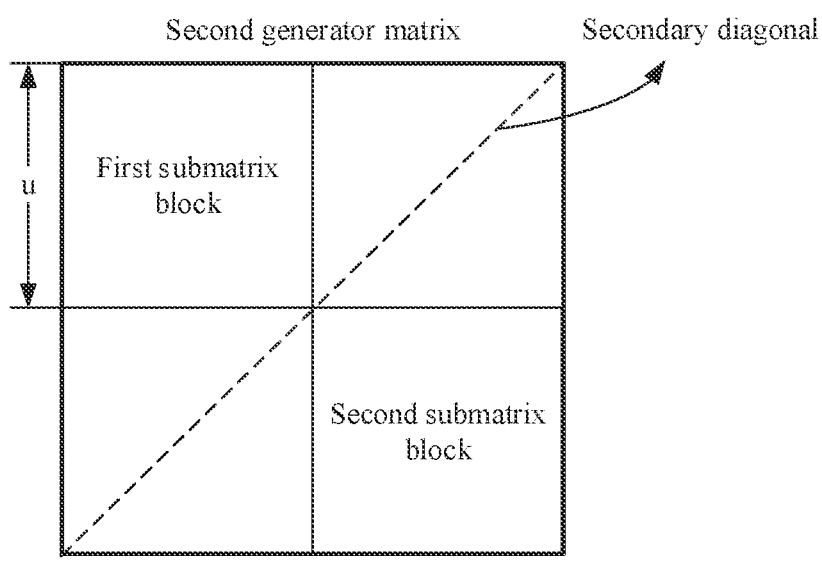
FIG. 11C is another schematic diagram of a second generator matrix according to an embodiment of this application.

The following describes, with reference to FIG. 11A to FIG. 11C, that the second generator matrix includes the first submatrix block and the second submatrix block.

FIG. 11A is a schematic diagram of a second generator matrix according to an embodiment of this application. Refer to FIG. 11A. The second generator matrix includes a first submatrix block and a second submatrix block, the first submatrix block is located at the top-left corner (or referred to as the top-left corner area) of the second generator matrix, and the second submatrix block is located at the bottom-right corner (or referred to as the bottom-right corner area) of the second generator matrix. The first submatrix block is the same as the second submatrix block. The first submatrix block partially overlaps the second submatrix block.

FIG. 11B is a schematic diagram of still another second generator matrix according to an embodiment of this application. Refer to FIG. 11B. The second generator matrix includes a first submatrix block and a second submatrix block, the first submatrix block is located at the top-left corner (or referred to as the top-left corner area) of the second generator matrix, and the second submatrix block is located at the bottom-right corner (or referred to as the bottom-right corner area) of the second generator matrix. The first submatrix block is the same as the second submatrix block. A specific distance exists between the first submatrix block and the second submatrix block, that is, a specific distance exists between an element at the bottom-right corner of the first submatrix block (an element 1 for short) and an element at the top-left corner of the second submatrix block (an element 2 for short). For example, a difference between row numbers of the element 2 and the element 1 is greater than 1.

FIG. 11C is a schematic diagram of another second generator matrix according to an embodiment of this application. Refer to FIG. 11C. The second generator matrix includes a first submatrix block and a second submatrix block, the first submatrix block is located at the top-left corner (or referred to as the top-left corner area) of the second generator matrix, and the second submatrix block is located at the bottom-right corner (or referred to as the bottom-right corner area) of the second generator matrix. The first submatrix block is the same as the second submatrix block. The first submatrix block is adjacent to the second submatrix block, that is, an element at the bottom-right corner of the first submatrix block (an element 1 for short) is adjacent to an element at the top-left corner of the second submatrix block (an element 2 for short). For example, a row number of the element 2 is greater than a row number of the element 1 by 1, and a column number of the element 2 is greater than a column number of element 1 by 1.

Optionally, elements of the second generator matrix are symmetrical along a secondary diagonal of the second generator matrix.

The following shows the second generator matrix by using specific examples.

Figure 12A:
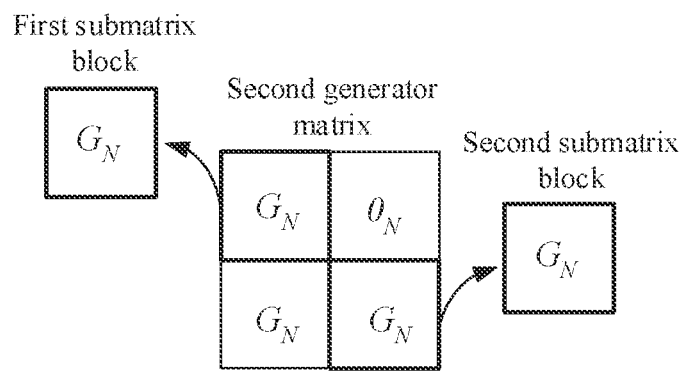
FIG. 12A is another schematic diagram of a second generator matrix according to an embodiment of this application.

FIG. 12A is a schematic diagram of yet another second generator matrix according to an embodiment of this application. Refer to FIG. 12A. The second generator matrix includes a first submatrix block and a second submatrix block, and each of the first submatrix block and the second submatrix block includes one $G_N$. If N is 128, a distance between the first submatrix block and the second submatrix block is 128.

Figure 12B:
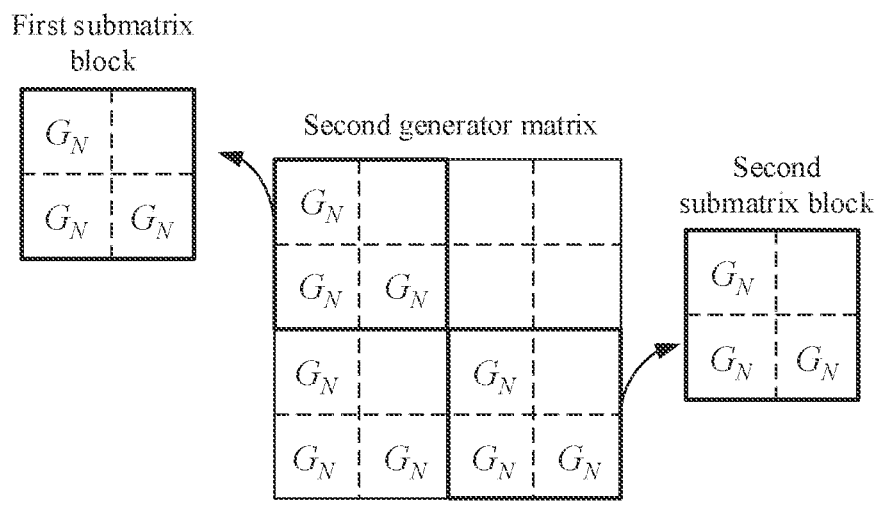
FIG. 12B is another schematic diagram of a second generator matrix according to an embodiment of this application.

FIG. 12B is a schematic diagram of yet another second generator matrix according to an embodiment of this application. Refer to FIG. 12B. The second generator matrix includes a first submatrix block and a second submatrix block, and each of the first submatrix block and the second submatrix block includes four matrix units. If N is 128, a distance between the first submatrix block and the second submatrix block is 256.

It should be noted that, for ease of description and viewing, in FIG. 12A and FIG. 12B, marks of $0_N$ are omitted in the figures, that is, all blank matrix units in FIG. 12A and FIG. 12B are $0_N$. FIG. 12A and FIG. 12B show merely examples of the second generator matrix, and do not limit the second generator matrix.

The following describes the first generator matrix.

The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2.

Figure 13:
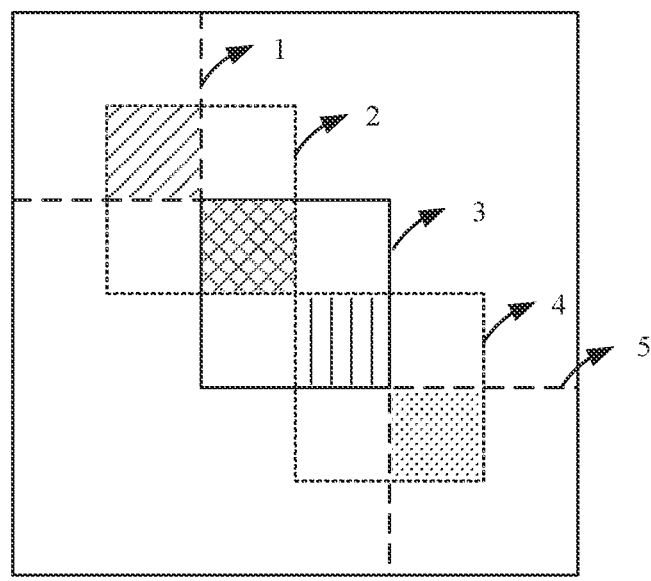
FIG. 13 is another schematic diagram of a first generator matrix according to an embodiment of this application.

The following describes the first generator matrix with reference to FIG. 13.

FIG. 13 is a schematic diagram of another first generator matrix according to an embodiment of this application.

Refer to FIG. 13. The first generator matrix includes five second generator matrices. The five second generator matrices are distributed along a primary diagonal of the first generator matrix, reference numerals of the second generator matrices increase successively in a downward and rightward extension direction of the primary diagonal of the first generator matrix, and a matrix at the top-left corner of the first generator matrix is a Pt second generator matrix. For example, refer to FIG. 13. A second generator matrix indicated by a reference numeral 1 is the Pt second generator matrix, a second generator matrix indicated by a reference numeral 2 is a $2^{nd}$ second generator matrix, and the rest may be deduced by analogy. A second generator matrix indicated by a reference numeral 5 is a 5th second generator matrix.

Refer to FIG. 13. A second submatrix block of the Pt second generator matrix overlaps a first submatrix block of the $2^{nd}$ second generator matrix. A second submatrix block of the $2^{nd}$ second generator matrix overlaps a first submatrix block of a $3^{rd}$ second generator matrix. A second submatrix block of the $3^{rd}$ second generator matrix overlaps a first submatrix block of a 4th second generator matrix. A second submatrix block of the 4th second generator matrix overlaps a first submatrix block of the $5^{th}$ second generator matrix.

Optionally, A is a minimum integer that enables a first condition to be satisfied, and the first condition is that a size of the first generator matrix is greater than or equal to a code length M of T subblocks included in an input vector.

For example, A satisfies the following relationship: $v+(A-2)*u<M\leq v+(A-1)*u$.

v is a size of the second generator matrix, M is the code length M of the T subblocks included in the input vector, and M is an integer greater than 1.

For example, if a size v of a matrix block is 256, the code length of the T subblocks included in the input vector is 512, and a distance u between two adjacent second generator matrices is 128, A is 3.

For example, if a size v of a matrix block is 384, the code length of the T subblocks included in the input vector is 512, and a distance u between two adjacent second generator matrices is 128, A is 2.

Optionally, a quantity A of second generator matrices included in the first generator matrix may be determined based on the code length of the T subblocks included in the input vector and the second generator matrix, and the first generator matrix is generated based on the second generator matrix and the quantity A. For example, the second generator matrix may be replicated and moved A−1 times in a direction of the primary diagonal of the second generator matrix, to obtain the first generator matrix. A distance for moving for one time is u, and the moving distance is a quantity of moved rows or columns. For example, if three rows are moved by, the moving distance is 3.

Figure 14:
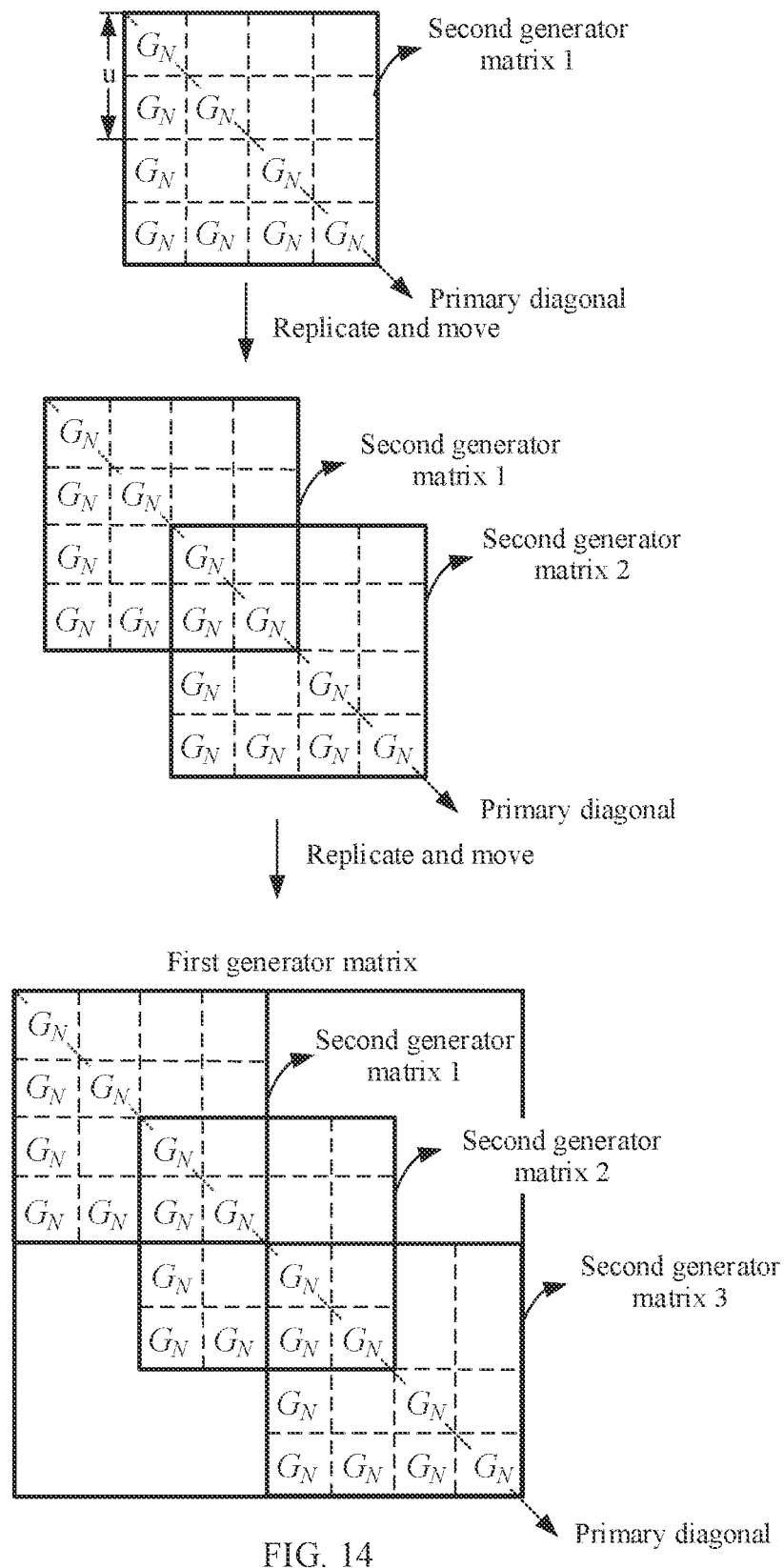
FIG. 14 is another schematic diagram of a first generator matrix according to an embodiment of this application.

The following describes, with reference to FIG. 14, a process of generating the first generator matrix based on the second generator matrix.

FIG. 14 is a schematic diagram of a process of generating a first generator matrix according to an embodiment of this application. Refer to FIG. 14. A second generator matrix includes 16 matrix units, a part of matrix units are $G_N$, and a part of matrix units are $0_N$. The second generator matrix satisfies a self-similarity, and a distance (a row spacing or a column spacing) between a first submatrix block and a second submatrix block in the second generator matrix is u. If it is determined that the first generator matrix includes three second generator matrices, the second generator matrix needs to be replicated and moved for two times.

Refer to FIG. 14. In a process of replicating and moving for the first time, a second generator matrix 1 is replicated, and the replicated second generator matrix 1 is moved in a direction of a primary diagonal by u rows (a diagonal distance corresponding to the u rows is $\sqrt{2} \times u$), to obtain a second generator matrix 2. A first submatrix block of the second generator matrix 2 overlaps a second submatrix block of the second generator matrix 1.

Refer to FIG. 14. In a process of replicating and moving for the second time, the second generator matrix 2 is replicated, and the replicated second generator matrix 2 is moved in the direction of the primary diagonal by the u rows (the diagonal distance corresponding to the u rows is $\sqrt{2} \times u$), to obtain a second generator matrix 3. A first submatrix block of the second generator matrix 3 overlaps a second submatrix block of the second generator matrix 2.

It is determined that the first generator matrix includes the second generator matrix 1, the second generator matrix 2, and the second generator matrix 3.

It should be noted that FIG. 14 shows merely an example manner of generating the first generator matrix based on the second generator matrix, and does not limit the manner. In FIG. 14, all matrix units other than $G_N$ are $0_N$. For ease of description and viewing, marks of $0_N$ are omitted in the figure, that is, all blank matrix units in FIG. 14 are $0_N$.

Figure 15A:
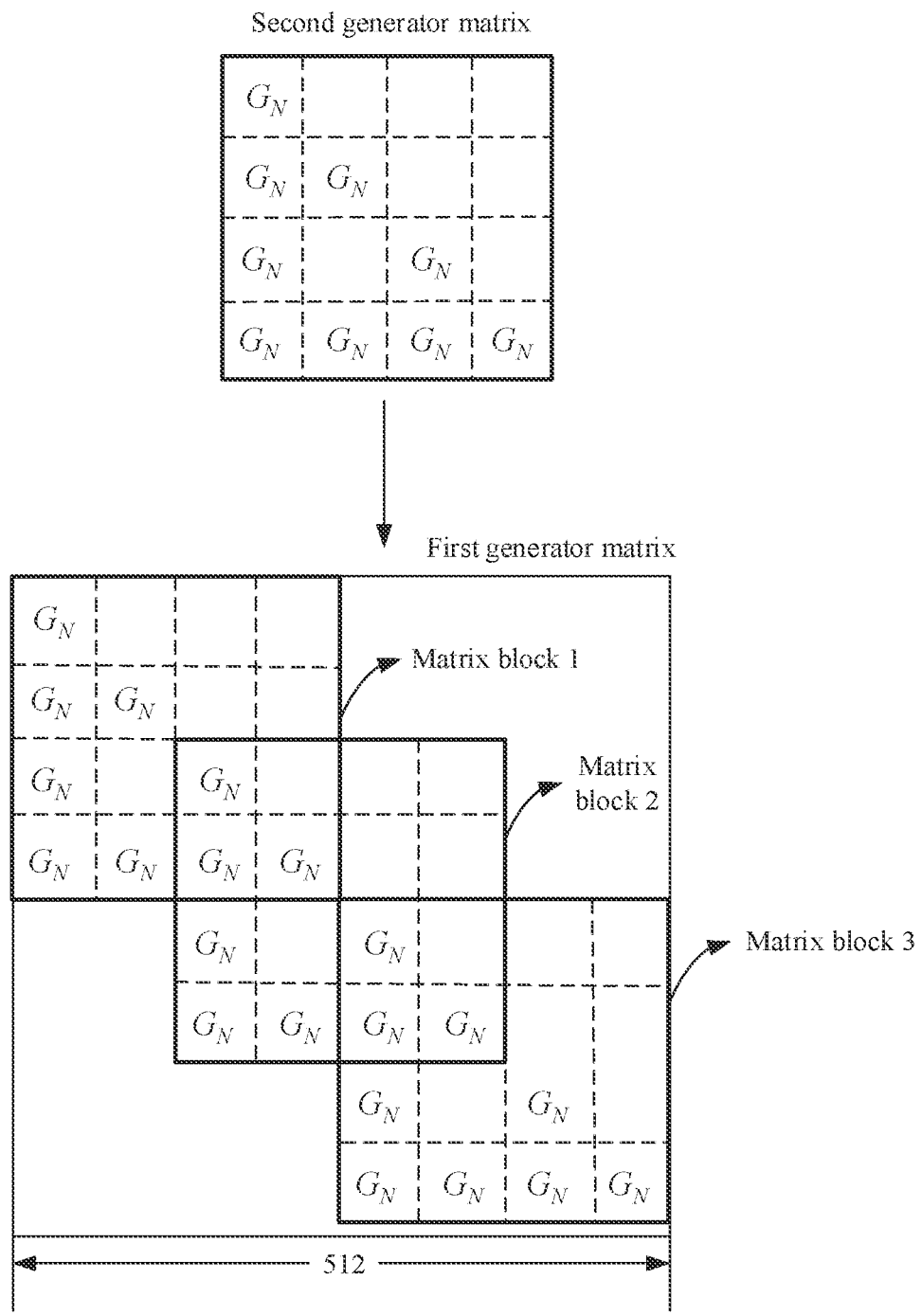
FIG. 15A is another schematic diagram of a first generator matrix according to an embodiment of this application.

FIG. 15A is a schematic diagram of a first generator matrix according to an embodiment of this application. Refer to FIG. 15A. A second generator matrix includes 16 matrix units, a part of matrix units are $G_N$, and a part of matrix units are $0_N$. The second generator matrix satisfies a self-similarity.

If a size of each matrix unit is 64 (including 64 rows and 64 columns), a size of the second generator matrix is 512, a distance between two first generator matrices of the second generator matrix is 128. If a code length M of T subblocks included in an input vector is 512, the first generator matrix includes three second generator matrices, and in every two adjacent generator matrices of the three second generator matrices, a first submatrix block of a next generator matrix overlaps a second submatrix block of a previous second generator matrix. A size of the first generator matrix (a quantity of rows or columns included in the first generator matrix) is 512.

Figure 15B:
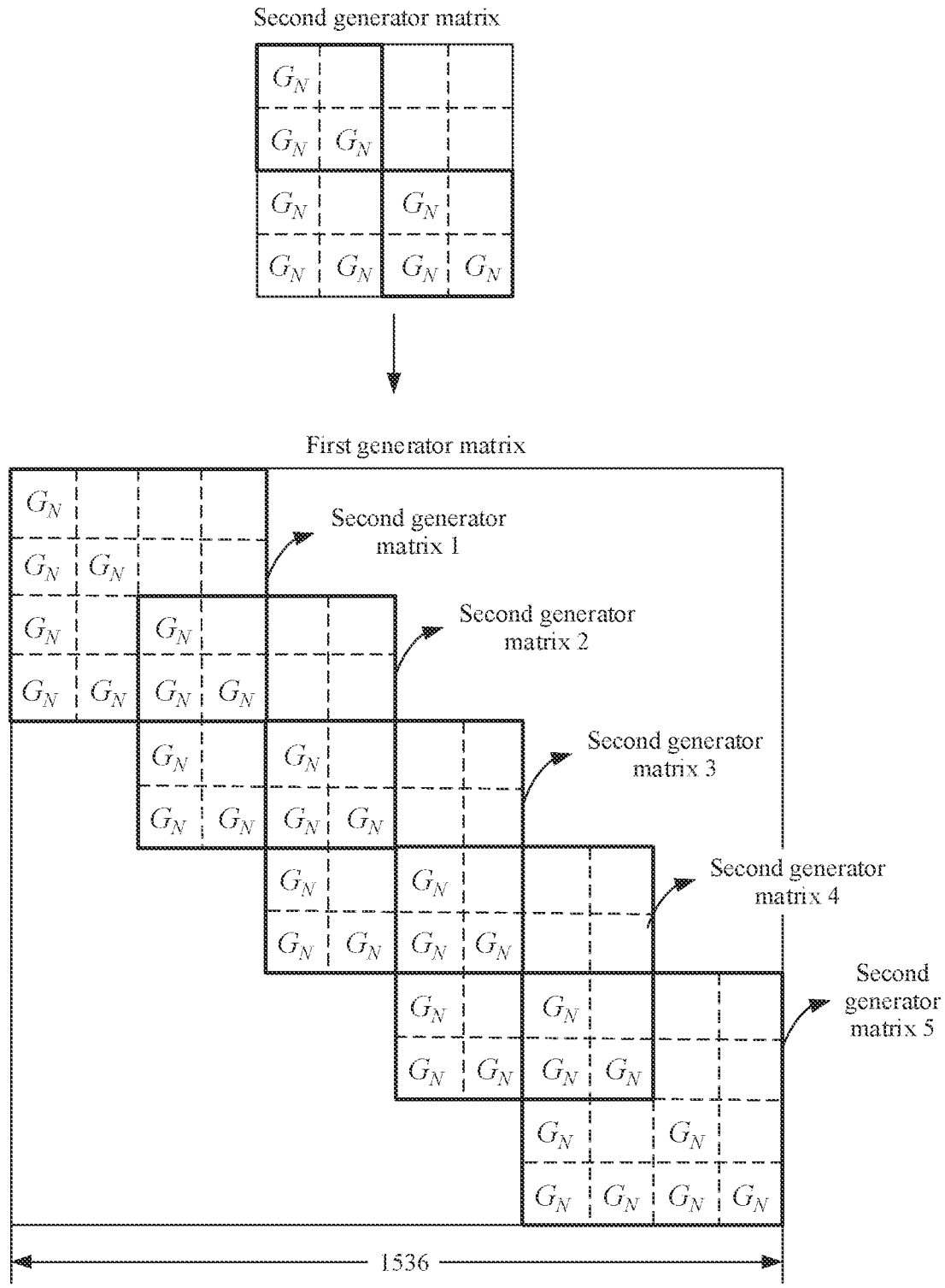
FIG. 15B is another schematic diagram of a first generator matrix according to an embodiment of this application.

FIG. 15B is a schematic diagram of another first generator matrix according to an embodiment of this application. Refer to FIG. 15B. A second generator matrix includes 16 matrix units, a part of matrix units are $G_N$, and a part of matrix units are $0_N$. The second generator matrix satisfies a self-similarity.

If a size of each matrix unit is 128 (including 128 rows and 128 columns), a size of the second generator matrix is 512, a distance between two first generator matrices of the second generator matrix is 256. If a code length M of T subblocks included in an input vector is 1500, the first generator matrix includes five second generator matrices, and in every two adjacent generator matrices of the five second generator matrices, a first submatrix block of a next generator matrix overlaps a second submatrix block of a previous second generator matrix. A size of the first generator matrix (a quantity of rows or columns included in the first generator matrix) is 1536.

Figure 15C:
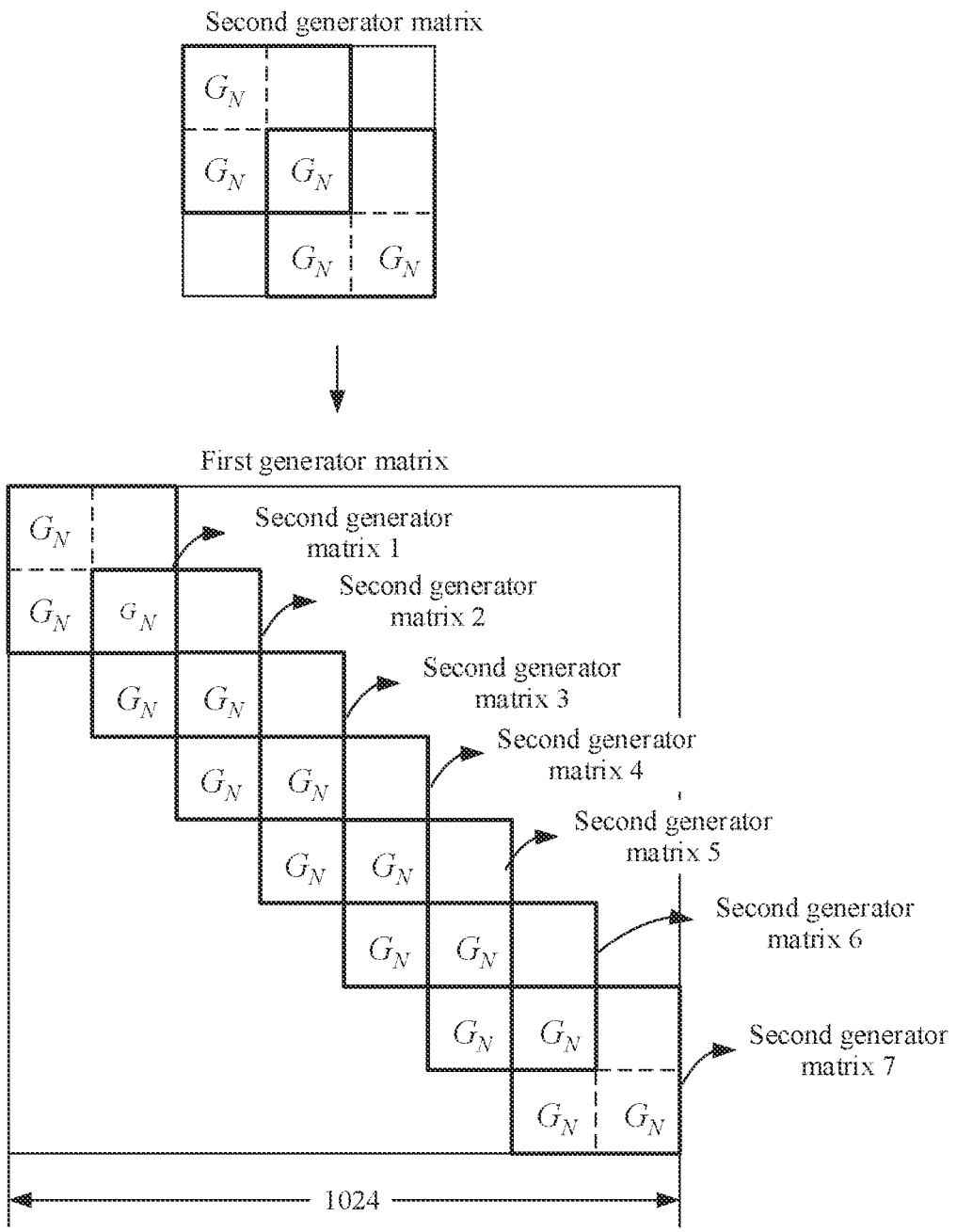
FIG. 15C is another schematic diagram of a first generator matrix according to an embodiment of this application.

FIG. 15C is a schematic diagram of a first generator matrix according to an embodiment of this application. Refer to FIG. 15C. A second generator matrix includes 16 matrix units, a part of matrix units are $G_N$, and a part of matrix units are $0_N$. The second generator matrix satisfies a self-similarity.

If a size of each matrix unit is 128 (including 128 rows and 128 columns), a size of the second generator matrix is 256, a distance between two subblocks of the first generator matrix is 128. If a code length M of T subblocks included in an input vector is 1024, the first generator matrix includes seven second generator matrices, and in every two adjacent generator matrices of the seven second generator matrices, a first submatrix block of a next generator matrix overlaps a second submatrix block of a previous second generator matrix. A size of the first generator matrix (a quantity of rows or columns included in the first generator matrix) is 1024.

It should be noted that, in FIG. 15A to FIG. 15C, all matrix units other than $G_N$ are $0_N$. For ease of description and viewing, marks of $0_N$ are omitted in the figures, that is, all blank matrix units in FIG. 15A to FIG. 15C are $0_N$.

Based on the encoding method shown in FIG. 4A, the following describes a decoding method based on the foregoing encoding method.

Figure 16:
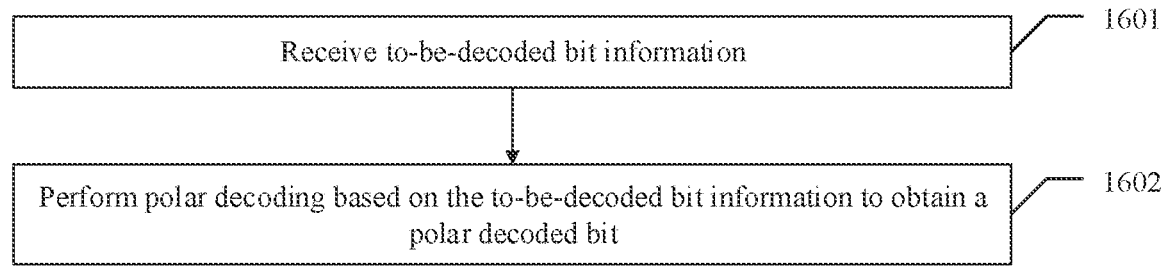
FIG. 16 is a schematic flowchart of a decoding method according to an embodiment of this application.

FIG. 16 is a schematic diagram of decoding according to an embodiment of this application. Refer to FIG. 16. The method includes the following steps.

1601: Receive to-be-decoded bit information.

The to-be-decoded bit information includes Q first log likelihood ratios LLR, and Q is a positive integer. The to-be-decoded bit information includes information about a bit of a first subblock and information about a bit of a second subblock, the bit of the first subblock is obtained by replicating the bit of the second subblock, and the second subblock is after the first subblock.

Optionally, for related description of the first subblock and the second subblock, refer to the embodiment shown in FIG. 4A. Details are not described herein again.

Optionally, the Q first LLRs include P second LLR sequences, that is, the Q first LLRs may be divided into P first LLR sequences. One first LLR sequence includes at least two LLRs, one LLR sequence corresponds to one subblock, and p is an integer greater than or equal to 2. For example, the P first LLR sequences are first LLR sequences respectively corresponding to the first subblock to a $P^{th}$ subblock.

It should be noted that when sending data to a receiving end, the transmitting end may send, for each time, data corresponding to one subblock whose code length is N; may send data that is corresponding to one subblock whose code length is less than N; or sends a plurality of subblocks at a time. This is not specifically limited in this application. In addition, a sequence in which the transmitting end the sends data to the receiving end may be the same as or different from a sequence of sequence numbers of subblocks. This is not specifically limited herein.

1602: Perform polar decoding based on the to-be-decoded bit information to obtain a polar decoded bit.

Optionally, step 1602 specifically includes: performing polar decoding on the to-be-decoded bit information based on a first generator matrix and according to a mapping relationship, to obtain the polar decoded bit.

For the mapping relationship, refer to related description in the embodiment shown in FIG. 4A. The first generator matrix is the matrix used for polar encoding in the embodiment shown in FIG. 4A. Details are not described herein again.

The performing polar decoding on the to-be-decoded bit information based on a first generator matrix and according to a mapping relationship, to obtain the polar decoded bit specifically includes:

determining P second LLR sequences corresponding to the P first LLR sequences, where one first LLR sequence corresponds to one subblock, and one second LLR sequence corresponds to one subblock;

determining, based on a $P^{th}$ second LLR sequence to obtain a codeword decoding result of the $P^{th}$ subblock and an information decoding result of the $P^{th}$ subblock; and determining, based on at least one codeword decoding result of a subblock from a codeword decoding result of an $(i+1)^{th}$ subblock to the codeword decoding result of the $P^{th}$ subblock, at least one information decoding result of a subblock from an information decoding result of the $(i+1)^{th}$ subblock to the information decoding result of the $P^{th}$ subblock, and an $i^{th}$ second LLR sequence, a codeword decoding result of an $i^{th}$ subblock and an information decoding result of the $i^{th}$ subblock, where i is an integer ranging from 1 to P-1.

In the foregoing decoding process of obtaining the information decoding result of the $i^{th}$ subblock through decoding, the P subblocks are decoded one by one until an information decoding result of the first subblock is obtained, to obtain the information decoding result of the initially transmitted first subblock.

The following describes the decoding process by using an example in which Q is equal to a code length M of T subblocks and in which the receiving end receives the T subblocks. To be specific, M first LLRs include T first LLR sequences, that is, the M first LLRs may be divided into the T first LLR sequences, and one first LLR sequence includes N first LLRs.

One first LLR sequence number corresponds to one subblock. For example, if an input vector includes the T subblocks, and a second generator matrix is shown in FIG. 3, the M first LLRs include eight first LLR sequences, and a relationship between the eight first LLR sequences and the T subblocks is shown in Table 2.

TABLE 2

| Identifier of a first LLR sequence | Subblock |
| --- | --- |
| First LLR sequence 1 | First subblock and second subblock |
| First LLR sequence 2 | Second subblock and third subblock |
| First LLR sequence 3 | Third subblock and fourth subblock |
| First LLR sequence 4 | Fourth subblock and fifth subblock |
| First LLR sequence 5 | Fifth subblock and sixth subblock |
| First LLR sequence 6 | Sixth subblock and seventh subblock |
| First LLR sequence 7 | Seventh subblock and eighth subblock |
| First LLR sequence 8 | Eighth subblock |

In addition, in the encoding scenario shown in FIG. 3, the information coupling relationship exists between two adjacent subblocks. Therefore, during decoding, the $i^{th}$ subblock should be decoded with reference to an information decoding result of an (i−1)th subblock.

Refer to Table 2. The first LLR sequence 1 is related to the first subblock and the second subblock; the first LLR sequence 2 is related to the second subblock, and bits of the second subblock and the third subblock; and the rest may be deduced by analogy.

To perform accurate decoding, the first LLR sequence may be decoupled to obtain a second LLR sequence corresponding to each first LLR sequence, so that one second LLR sequence corresponds to one subblock. For example, first LLR sequences shown in Table 3 are decoupled to obtain eight second LLR sequences. Table 3 shows a relationship between the eight second LLR sequences and subblocks.

TABLE 3

| Identifier of a second LLR sequence | Subblock |
| --- | --- |
| Second LLR sequence 1 | First subblock |
| Second LLR sequence 2 | Second subblock |
| Second LLR sequence 3 | Third subblock |
| Second LLR sequence 4 | Fourth subblock |
| Second LLR sequence 5 | Fifth subblock |
| Second LLR sequence 6 | Sixth subblock |
| Second LLR sequence 7 | Seventh subblock |
| Second LLR sequence 8 | Eighth subblock |

Refer to Table 3. The second LLR sequence 1 is related to the first subblock, the second LLR sequence 2 is related to the second subblock, and the rest may be deduced by analogy.

Optionally, the $i^{th}$ second LLR sequence may be determined in the following manner: determining the $i^{th}$ second LLR sequence based on the $i^{th}$ first LLR sequence and an $(i-1)^{th}$ second LLR sequence. A $1^{st}$ second LLR sequence is the same as a $1^{st}$ first LLR sequence.

Optionally, polar decoding may be performed on first bit information by using the first generator matrix and according to the mapping relationship in the following manner:

determining T second LLR sequences corresponding to the T first LLR sequences, where one first LLR sequence corresponds to one subblock, and one second LLR sequence corresponds to one subblock;

determining, based on a $T^{th}$ second LLR sequence to obtain a codeword decoding result of a $T^{th}$ subblock and an information decoding result of the $T^{th}$ subblock; and determining the information decoding result of the $i^{th}$ subblock based on the information decoding result of the $(i+1)^{th}$ subblock, the codeword decoding result of the $(i+1)^{th}$ subblock, an $(i+1)^{th}$ first LLR sequence, and the $i^{th}$ second LLR sequence.

In the foregoing decoding process of obtaining the $i^{th}$ subblock through decoding, the T subblocks are decoded one by one until an information decoding result of the first subblock is obtained, to obtain the information decoding result of the initially transmitted first subblock.

The following describes a decoding process of the receiving end with reference to a specific example. In a subsequent example, $l'_i$ is the $i^{th}$ first LLR sequence, $l_i$ is the $i^{th}$ second LLR sequence, $u_1$ is a bit sequence that is before encoding and that is of the $i^{th}$ subblock, $c_i$ is a bit sequence that is after encoding and that is of the $i^{th}$ subblock, and i is specifically determined based on a quantity of subblocks that the receiving end decodes. For example, when the receiving end decodes four subblocks, i is an integer greater than or equal to 1 and less than or equal to 4. The first subblock $u_1$ is a subblock used for initial transmission, and all subblocks following the first subblock $u_1$ are subblocks used for retransmission. An f operation is: $f(L_1, L_2)=sgn(L_1) sgn(L_2) min(|L_1|, |L_2|)$. A g operation is: $g(u, L_1, L_2)=(-1)^{u_1} \cdot L_1+L_2$, and c is encoded to obtain u.

Example 1: In the following, based on the encoding scenario shown in FIG. 3, a decoding mode of the receiving end may be:

determining the $i^{th}$ second LLR sequence: determining the $i^{th}$ second LLR sequence based on the $i^{th}$ first LLR sequence and the $(i-1)^{th}$ second LLR sequence. The $1^{st}$ second LLR sequence is the same as the 1st first LLR sequence.

The information decoding result of the $i^{th}$ subblock may be determined in the following manner: determining the information decoding result of the $i^{th}$ subblock based on the information decoding result of the $(i+1)^{th}$ subblock, the codeword decoding result of the $(i+1)^{th}$ subblock, the $(i+1)^{th}$ first LLR sequence, and the $i^{th}$ second LLR sequence.

Figure 17A:
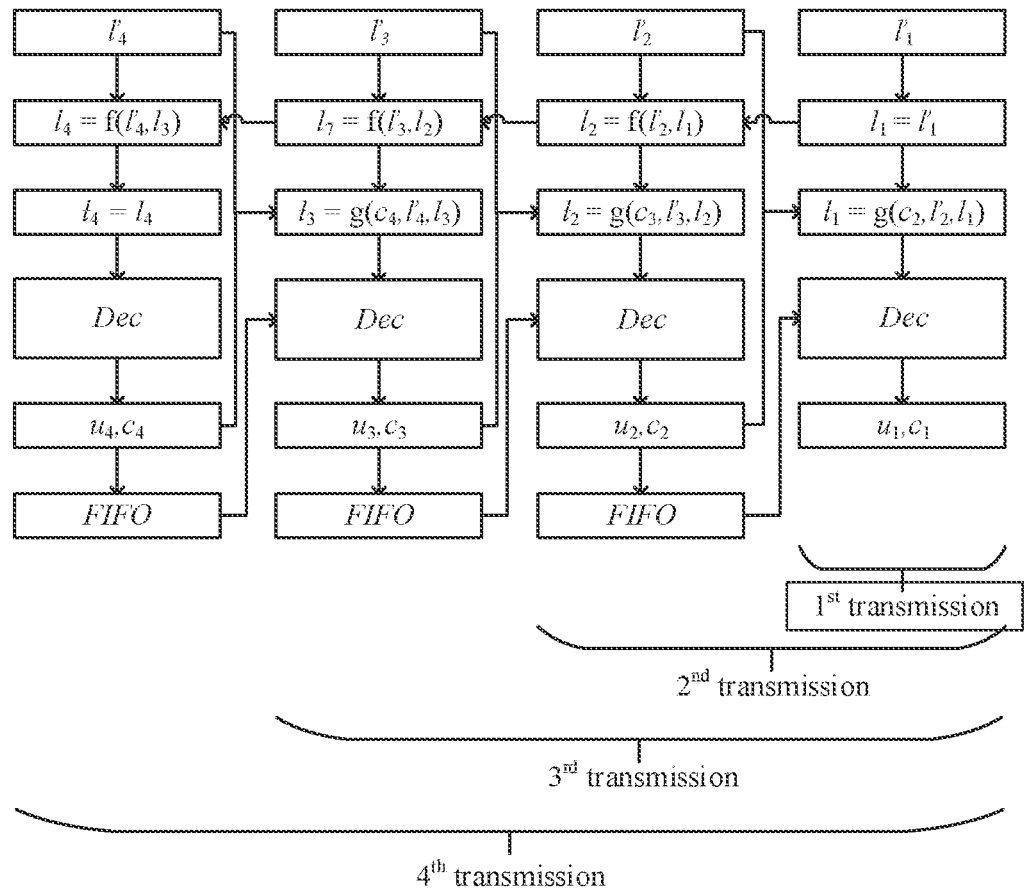
FIG. 17A is a schematic diagram of a decoding process according to an embodiment of this application.

Refer to 17A. An example in which the receiving end decodes first four subblocks is used to describe the decoding process. A basis of FIG. 17A is that the receiving end fails to decode data of received first three subblocks, and the transmitting end continues to retransmit the data to the receiving end. On this basis, after receiving 4N LLRs in total, the receiving end divides the received 4N LLRs into four first LLR sequences, where the four first LLR sequences are denoted as: $l'_1$, $l'_2$, $l'_3$, and $l'_4$. Second LLR sequences corresponding to the foregoing four first LLR sequences are denoted as: $l_1$, $l_2$, $l_3$, and $l_4$.

The $1^{st}$ second LLR sequence $l_1$ is first determined. The f operation is performed on the $1^{st}$ second LLR sequence $l_1$ and the $2^{nd}$ first LLR sequence $l'_2$ to obtain a $2^{nd}$ second LLR sequence $l_2$. The f operation is performed on the $2^{nd}$ second LLR sequence $l_2$ and a $3^{rd}$ first LLR sequence $l'_3$ to obtain a $3^{rd}$ second LLR sequence $l_3$, and the rest may be deduced by analogy until the four second LLR sequences are obtained. This is expressed by using formulas: $l_1=l'_1$, $l_2=f(l'_2, l_1)$, $l_3=f(l'_3, l_2)$, and $l_4=f(l'_4, l_3)$.

A $4^{th}$ second LLR sequence $l_4$ is first input to a decoder for decoding to obtain an information decoding result $u_4$ of the fourth subblock, where $u_4$ includes N decoded bits. $u_4$ is encoded to obtain a codeword decoding result $c_4$ of the fourth subblock. The g operation is performed on $c_4$, $l'_4$, and $l_3$ to obtain a g operation result $m_3$, and the g operation result is input into the decoder. An information bit that is of $u_4$ and that is replicated from $u_3$ is determined according to the mapping relationship when encoding is performed on an encoder, and the information bit is input into the decoder by using a first in first out (first input first output, FIFO) cache. The decoder performs decoding to obtain an information decoding result $u_3$ of the third subblock. The decoder performs encoding based on $u_3$ to obtain a codeword decoding result $c_3$ of the third subblock. During decoding, the decoder may decode the information bit as a special frozen bit with a specific value, that is, use the information bit as an information decoding result of an information bit at a location of a replicated bit in $u_3$; or uses the information bit as a check bit, and use a check value of the information bit as an information decoding result of an information bit at a location of a replicated bit in $u_3$. The rest may be deduced by analogy until it is determined that the first information decoding result $u_1$ is obtained, to obtain the information decoding result $u_1$ of the initially transmitted subblock.

Figure 17B:
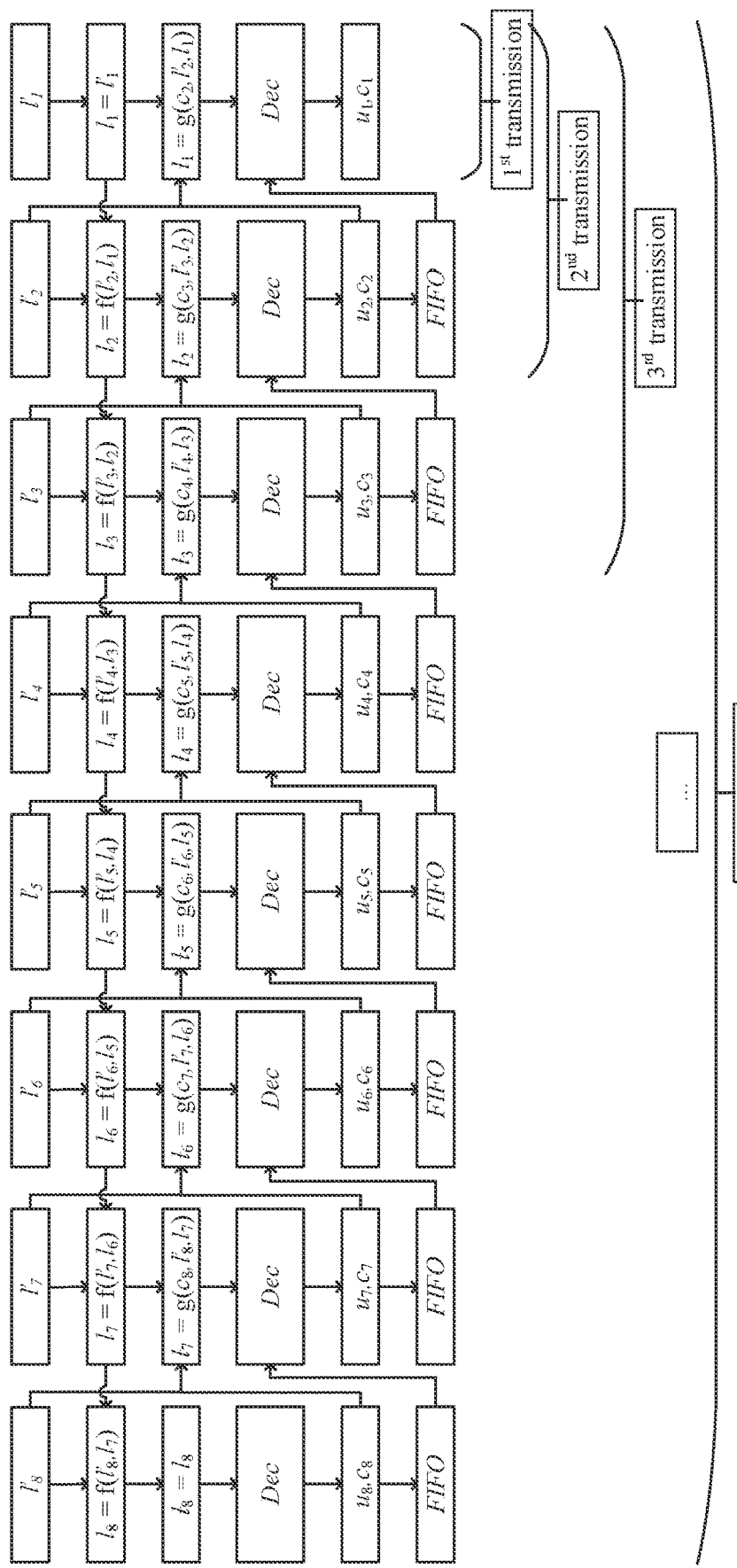
FIG. 17B is a schematic diagram of another decoding process according to an embodiment of this application.

If the receiving end fails in decoding in the example shown in FIG. 17A, the transmitting end continues to retransmit the data to the receiving end. The following shows a process in which the receiving end decodes eight subblocks sent by the transmitting end. Refer to FIG. 17B. $l'_i$ is the $i^{th}$ first LLR sequence, $l_i$ is the $i^{th}$ second LLR sequence, $u_i$ is the information decoding result of the $i^{th}$ subblock, $c_i$ is the codeword decoding result of the $i^{th}$ subblock, and i is an integer ranging from 1 to 8. After receiving 8N LLRs, the receiving end divides the received 8N LLRs into eight first LLR sequences, where the eight first LLR sequences are denoted as: $l'_1$, $l'_2$, $l'_4$, $l'_5$, $l'_6$, $l'_6$, $l'_7$, and $l'_8$. Second LLR sequences corresponding to the foregoing eight first LLR sequences are denoted as: $l_1$, $l_2$, $l_3$, $l_4$, $l_5$, $l_6$, $l_7$, and $l_8$.

Refer to FIG. 17B. The $1^{st}$ second LLR sequence $l_1$ is first determined. The f operation is performed on the 1st second LLR sequence $l_1$ and the $2^{nd}$ first LLR sequence $l'_2$ to obtain a $2^{nd}$ second LLR sequence $l_2$. The f operation is performed on the $2^{nd}$ second LLR sequence $l_2$ and a $3^{rd}$ first LLR sequence $l'_3$ to obtain a $3^{rd}$ second LLR sequence $l_3$, and the rest may be deduced by analogy until the eight second LLR sequences are obtained. This is expressed by using formulas: $l_1=l'_1$, $l_2=f(l'_2, l_1)$, $l_3=f(l'_3, l_2)$, $l_4=f(l'_4, l_3)$, $l_5=f(l'_5, l_4)$, $l_6=f(l_6, l_5)$, $l_7=f(l_7, l_6)$, and $l_8=f(l_8, l_7)$.

Refer to FIG. 17B. An $8^{th}$ second LLR sequence $l_8$ is first input to the decoder for decoding to obtain an information decoding result $u_8$ of the eighth subblock, where $u_8$ includes N decoded bits. $u_8$ is encoded to obtain a codeword decoding result $c_8$ of the eighth subblock. The g operation is performed on $c_8$, $l'_8$, and $l_7$ to obtain a g operation result $l_8$, and the g operation result $l_8$ is input into the decoder for decoding. An information bit that is of $u_8$ and that is replicated from $u_7$ is determined according to the mapping relationship when encoding is performed on the encoder, and the information bit is input into the decoder by using the FIFO cache. The decoder performs decoding to obtain an information decoding result $u_7$ of the seventh subblock. $u_7$ is encoded to obtain a codeword decoding result $c_7$ of the seventh subblock. The g operation is performed on $c_7$, $l'_7$, and $l_6$ to obtain a g operation result $l_7$, and the g operation result $l_7$ is input into the decoder. An information bit that is of $u_7$ and that is replicated from $u_6$ is determined according to the mapping relationship when encoding is performed on an encoder, and the information bit is input into the decoder by using the FIFO cache. The decoder performs decoding to obtain an information decoding result $u_6$ of the sixth subblock. The rest may be deduced by analogy until it is determined that a first decoding result $u_1$ is obtained, to obtain the information decoding result $u_1$ of the initially transmitted subblock.

Example 2: Based on the encoding scenario shown in FIG. 4B, a decoding mode of the receiving end may be:
determining the $i^{th}$ second LLR sequence: determining the $i^{th}$ second LLR sequence based on the $i^{th}$ first LLR sequence and an $(i-2)^{th}$ second LLR sequence, where i is an integer ranging from 3 to T. The 1st second LLR sequence is the same as the 1st first LLR sequence, and the $2^{nd}$ second LLR sequence is the same as the $2^{nd}$ first LLR sequence.

The following provides description with reference to FIG. 18A to FIG. 18D.

Figure 18A:
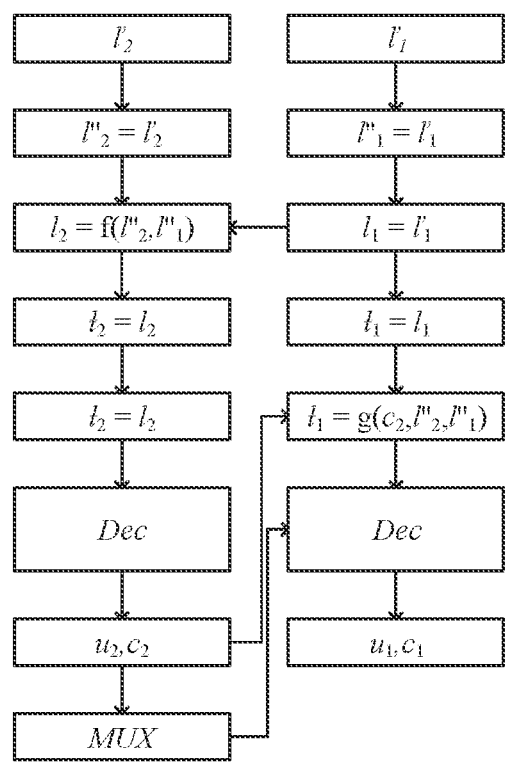
FIG. 18A is a schematic diagram of another decoding process according to an according to an embodiment of this application.

Refer to FIG. 18A. FIG. 18A shows a process in which the receiving end decodes two subblocks sent by the transmitting end. A basis of FIG. 18A is that the receiving end fails to decode data of the received first subblock, and the transmitting end continues to retransmit the data to the receiving end. On this basis, after receiving 2N LLRs in total, the receiving end divides the received 2N LLRs into two first LLR sequences, where the two first LLR sequences are denoted as: $l'_1$ and $l'_2$.

First, $l''_i$ is calculated based on $l'_i$, where $l''_1=l'_1$ and $l''_2=l'_2$. $l''_i$ is the $i^{th}$ second LLR sequence.

Decoding is performed based on the foregoing calculated parameters: $l_2$ is input into a decoder for decoding, to obtain an information decoding result $u_2$ of the second subblock, where $u_2$ includes N decoded bits. $u_2$ is encoded to obtain a codeword decoding result $c_2$ of the second subblock. The g operation is performed on $c_2$, $l''_2$, and $l''_1$, and a g operation result $l_i$ is input into the decoder. An information bit that is of $u_2$ and that is replicated from $u_1$ is determined according to the mapping relationship when encoding is performed on an encoder, and the information bit is input into the decoder by using a data multiplexer (multiplexer, MUX). The decoder performs decoding to obtain an information decoding result $u_1$ of the first subblock.

Figure 18B:
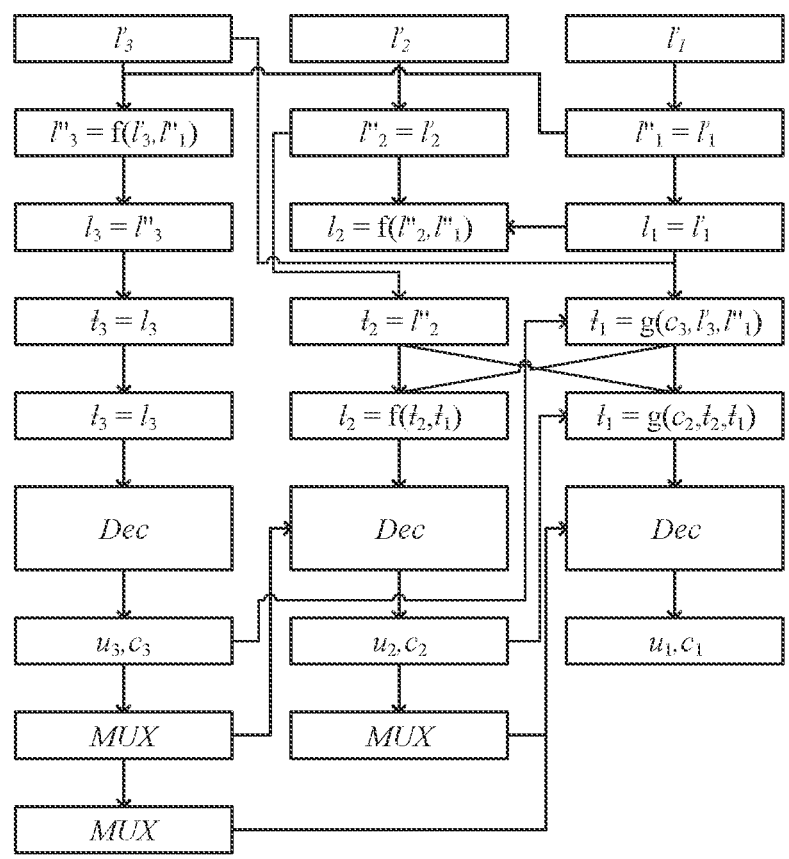
FIG. 18B is a schematic diagram of another decoding process according to an embodiment of this application.

If the receiving end sill fails in decoding in the example shown in FIG. 18A, the transmitting end continues to retransmit the data to the receiving end. The following shows a process in which the receiving end decodes three subblocks sent by the transmitting end. Refer to FIG. 18B. After the transmitting end performs retransmission for another time based on FIG. 18A, and after receiving 3N LLRs in total, the receiving end divides the received 3N LLRs into three first LLR sequences, where the three first LLR sequences are denoted as: $l'_1$, $l'_2$, and First, $l''_i$ is calculated based on $l'_i$, where $l''_1=l'_1$, $l''_2=l'_2$, and $l''_3=f(l'_3, l''_1)$. $l''_i$ is the $i^{th}$ second LLR sequence.

Decoding is performed based on the foregoing calculated parameters: $l_3$ is input into the decoder for decoding, to obtain an information decoding result $u_3$ of the third subblock, where $u_3$ includes N decoded bits. $u_3$ is encoded to obtain a codeword decoding result $c_3$ of the third subblock. The g operation is performed on $c_3$, $l''_3$, and $l''_1$, the f operation is performed on $l'_1$ and a g operation result $l_i$, and an f operation result $l_2$ is input into the decoder. An information bit that is of $u_3$ and that is replicated from $u_2$ is determined according to the mapping relationship when encoding is performed on the encoder, and the information bit is input into the decoder by using the data multiplexer MUX. The decoder performs decoding to obtain an information decoding result $u_2$ of the second subblock. $u_2$ is encoded to obtain a codeword decoding result $c_2$ of the second subblock. The g operation is performed on $c_2$, $l_2$, and $l_1$, and a g operation result $l_1$ is input into the decoder. An information bit 1 that is of $u_3$ and that is replicated from $u_1$, and an information bit 2 that is of $u_2$ and that is replicated from $u_1$ are determined according to the mapping relationship when encoding is performed on the encoder. The information bit 1 and the information bit 2 are separately input into the decoder by using the multiplexer MUX, and then decoding is performed to obtain an information decoding result $u_1$ of the first subblock.

Figure 18C:
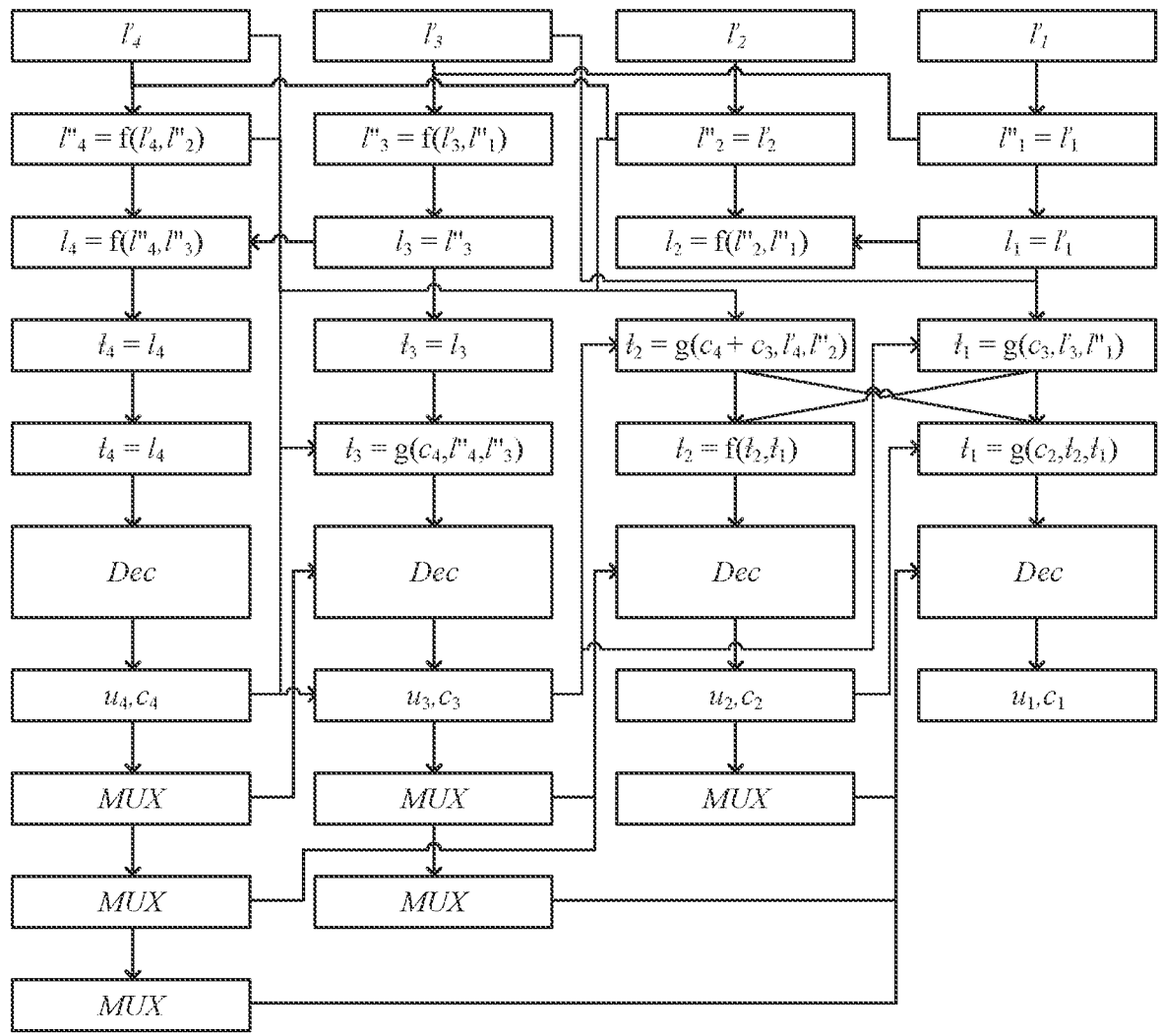
FIG. 18C is a schematic diagram of another decoding process according to an embodiment of this application.

If the receiving end sill fails in decoding in the example shown in FIG. 18B, the transmitting end continues to retransmit the data to the receiving end. The following shows a process in which the receiving end decodes four subblocks sent by the transmitting end. Refer to FIG. 18C. After the transmitting end performs retransmission for another time based on FIG. 18B, and after receiving 4N LLRs in total, the receiving end divides the received 4N LLRs into four first LLR sequences, where the four first LLR sequences are denoted as: 4, 6, 6, and 6.

First, $l''_i$ is calculated based on $l'_i$, where $l''_1=l'_1$, $l''_2=l'_2$, $l''_3=f(l'_3, l''_1)$, and $l''_4=f(l'_4, l''_2)$.

$l_i$ is calculated based on $l''_i$, where $l_3=l''_3$ and $l_1=l''_1$.

Decoding is performed based on the foregoing calculated parameters: $l_4$ is input into the decoder for decoding, to obtain an information decoding result $u_4$ of the fourth subblock, where $u_4$ includes N decoded bits. $u_4$ is encoded to obtain a codeword decoding result $c_4$ of the fourth subblock. The g operation is performed on $c_4$, $l''_4$, and $l''_3$, and a g operation result $l_3$ is input into the decoder. An information bit that is of $u_4$ and that is replicated from $u_3$ is determined according to the mapping relationship when encoding is performed on the encoder. The information bit is input into the decoder by using the data multiplexer MUX, and then decoding is performed to obtain an information decoding result $u_3$ of the third subblock. $u_3$ is encoded to obtain a codeword decoding result $c_3$ of the third subblock. The g operation is performed on $c_4+c_3$, $l'_4$, and $l''_2$ to obtain a g operation result $l_2$, and the g operation is performed on $l_1$ and $l_2$ to obtain a g operation result $l_2$, where $l_1$ is a result of the g operation performed on $c_3$, $l'_3$, and $l''_{15}$. $l_2$ is input into the decoder. An information bit 1 that is of $u_3$ and that is replicated from $u_2$, and an information bit 2 that is of $u_4$ and that is replicated from $u_2$ are determined according to the mapping relationship when encoding is performed on the encoder. The information bit 1 and the information bit 2 are input into the decoder by using the data multiplexer MUX, and then decoding is performed to obtain an information decoding result $u_2$ of the third subblock. $u_2$ is encoded to obtain a codeword decoding result $c_2$ of the second subblock. The rest may be deduced by analogy until it is determined that a first decoding result $u_1$ is obtained, to obtain the information decoding result $u_1$ of the initially transmitted subblock.

Figure 18D:
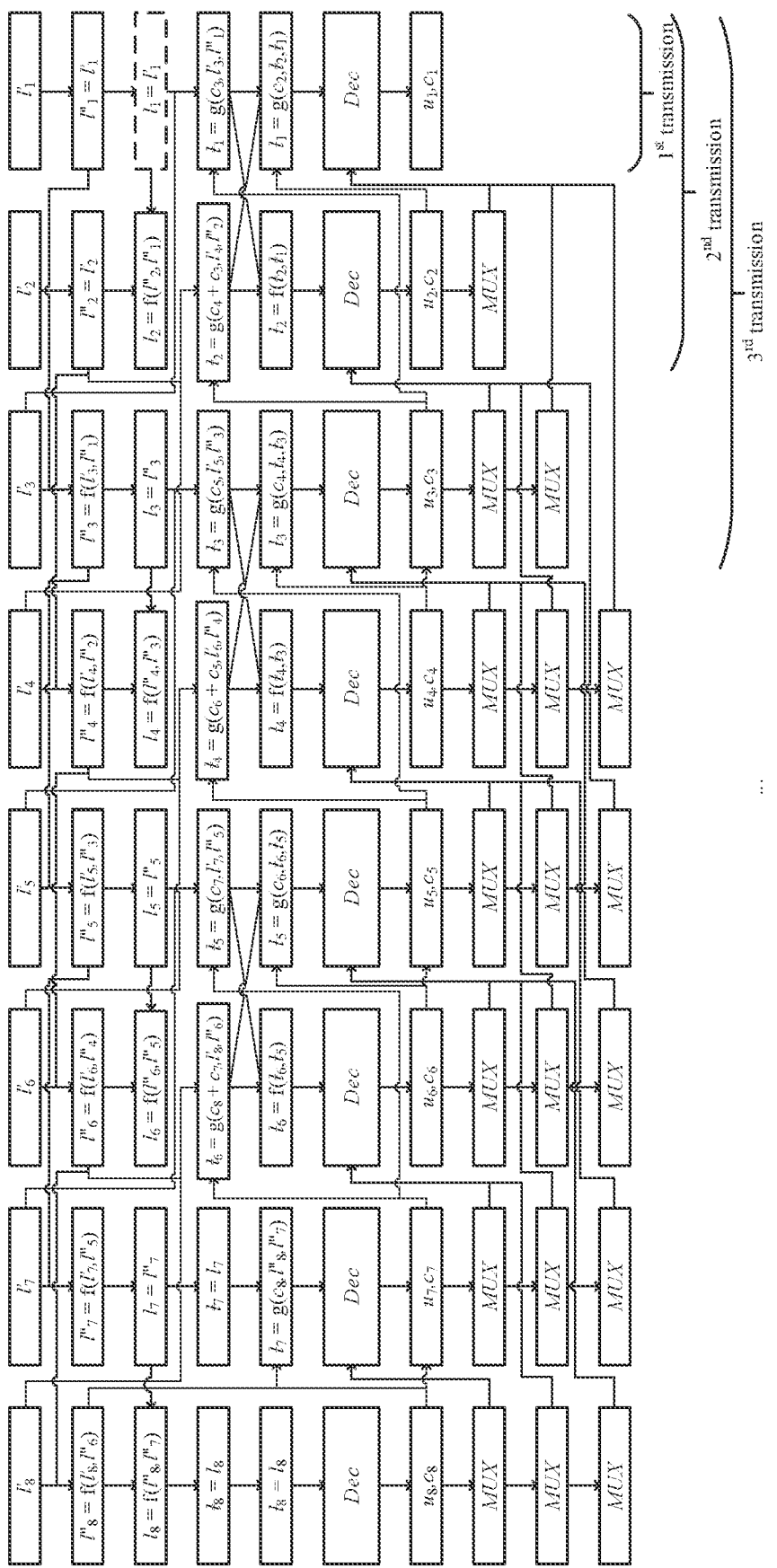
FIG. 18D is a schematic diagram of another decoding process according to an embodiment of this application.

If the receiving end sill fails in decoding in the example shown in FIG. 18C, the transmitting end continues to retransmit the data to the receiving end. The following shows a process in which the receiving end decodes eight subblocks sent by the transmitting end. Refer to FIG. 18D. After the transmitting end performs retransmission for another time based on FIG. 18C, and after receiving 8N LLRs in total, the receiving end divides the received 8N LLRs into eight first LLR sequences, where the eight first LLR sequences are denoted as: $l'_1$, $l'_2$, $l'_3$, $\mathbf{1}'_5$, $l'_6$, $l'_7$, and $l'_8$.

First, $l''_i$ is calculated based on $l'_i$, where $l''_1=l'_1$, $l''_2=l'_2$, $l''_3=f(l'_3, l''_1)$, $l''_4=f(l'_4, l''_2)$, $l''_5=f(l'_5, l''_3)$, $l''_6=f(l'_6, l''_4)$, $l''_7=f(l'_7, l''_5)$, and $l''_8=f(l'_8, l''_6)$. $l''_i$ is the $i^{th}$ second LLR sequence.

$l_i$ is calculated based on $l''_i$, where $l_8=f(l''_8, l''_7)$, $l_7=l''_7$, $l''_5=l''_5$, $l_3=l''_3$, and $l_1=l''_1$.

Decoding is performed based on the foregoing calculated parameters: $l_8$ is input into the decoder for decoding, to obtain an eighth decoding result $u_8$, where $u_8$ includes N decoded bits. $u_8$ is encoded to obtain an eighth encoded bit sequence $c_8$. The g operation is performed on $c_8$, $l''_8$, and $l''_7$, and a g operation result $l_7$ is input into the decoder. An information bit that is of $u_8$ and that is replicated from $u_7$ is determined according to the mapping relationship when encoding is performed on the encoder. The information bit is input into the decoder by using the multiplexer MUX, decoding is performed to obtain an information decoding result $u_7$ of the seventh subblock, and $u_7$ is encoded to obtain a codeword decoding result $c_7$ of the seventh subblock. The g operation is performed on $c_8+c_7$, $l'_8$, and $l''_6$ to obtain a g operation result $l_6$, and the g operation is performed on $l_6$ and $l_5$ to obtain a g operation result $l_6$, where $l_5$ is a result of the g operation performed on $c_7$, $l'_7$, and $l''_5$'. $l_6$ is input to the decoder. An information bit a that is of $u_8$ and that is replicated from $u_6$, and an information bit b that is of $u_7$ and that is replicated from $u_6$ are determined according to the mapping relationship when encoding is performed on the encoder, and are input to the decoder. Decoding is performed to obtain an information decoding result $u_6$ of the sixth subblock. The rest may be deduced by analogy until it is determined that a first decoding result $u_1$ is obtained, to obtain the information decoding result $u_1$ of the initially transmitted subblock.

Figure 19:
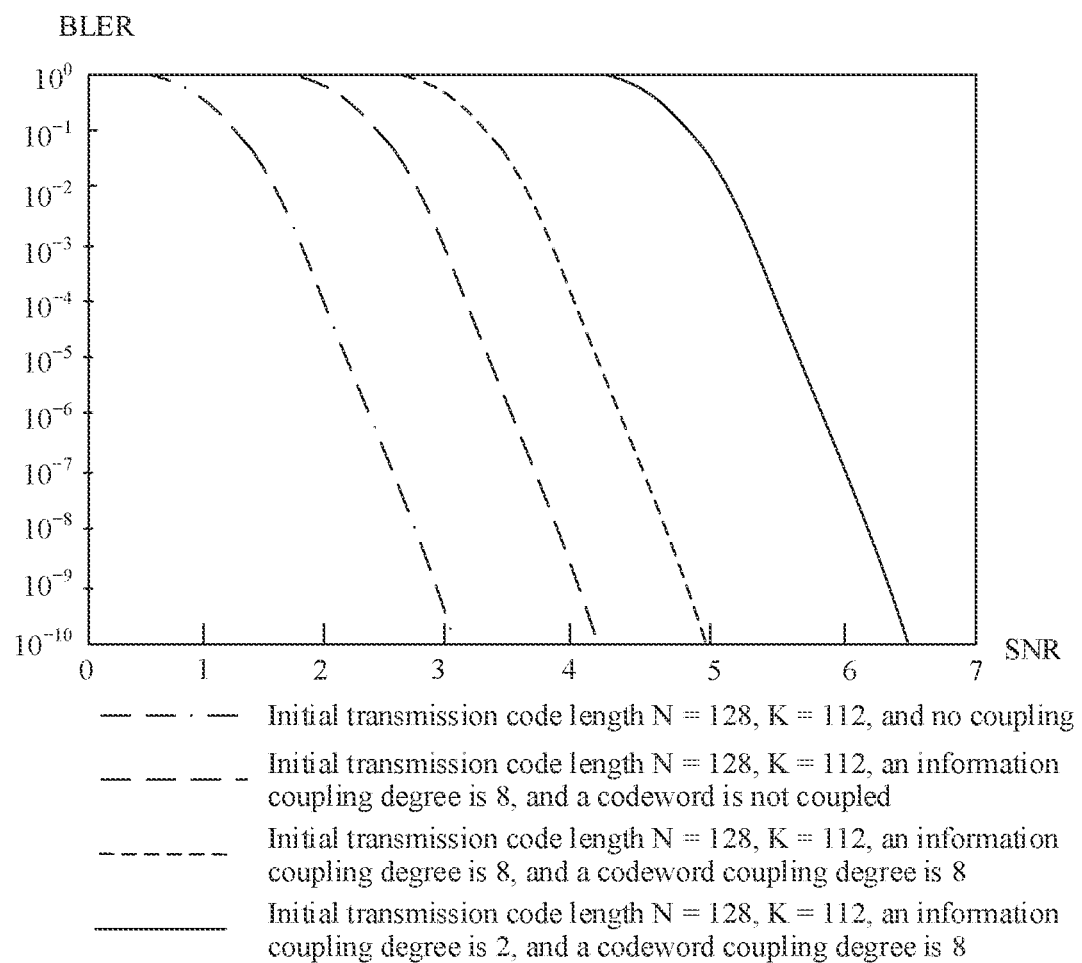
FIG. 19 is a schematic diagram of decoding performance according to an embodiment of this application.
Figure 20:
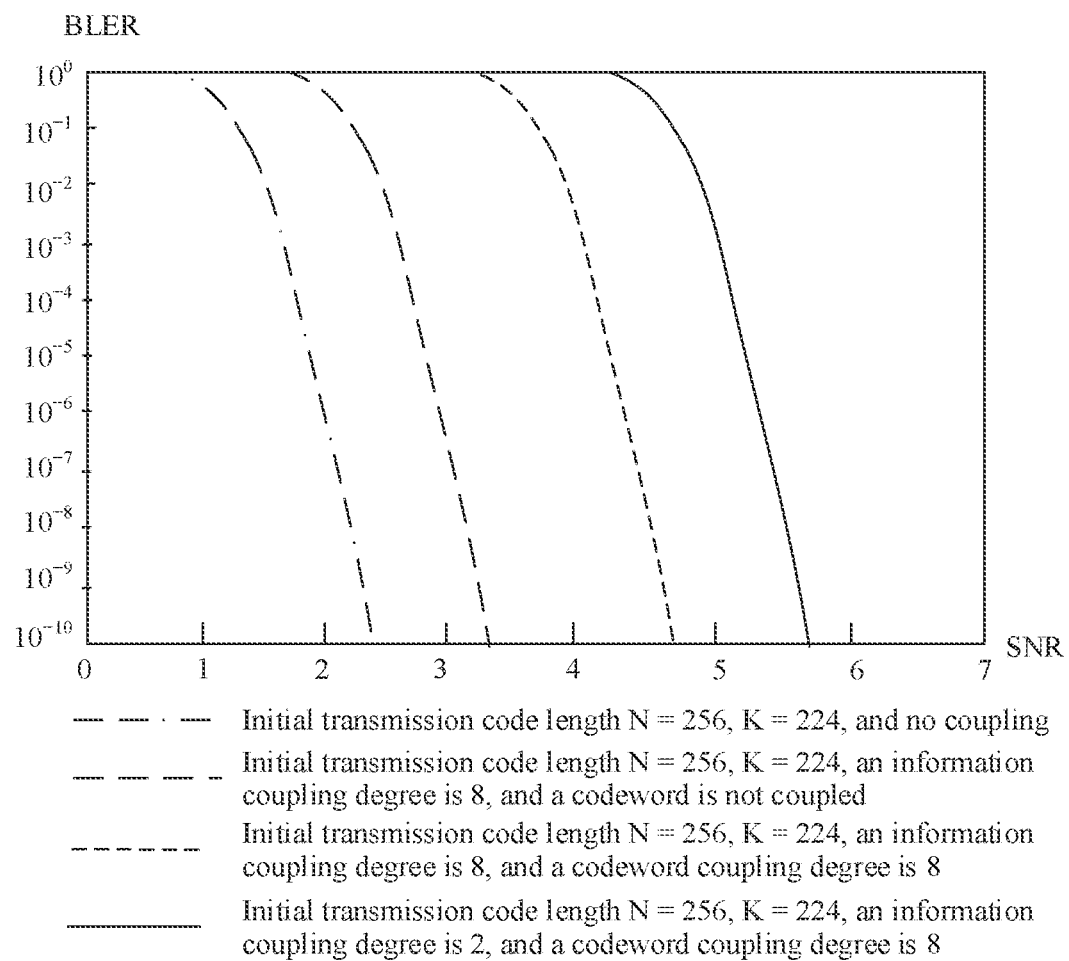
FIG. 20 is another schematic diagram of decoding performance according to an embodiment of this application.
Figure 21:
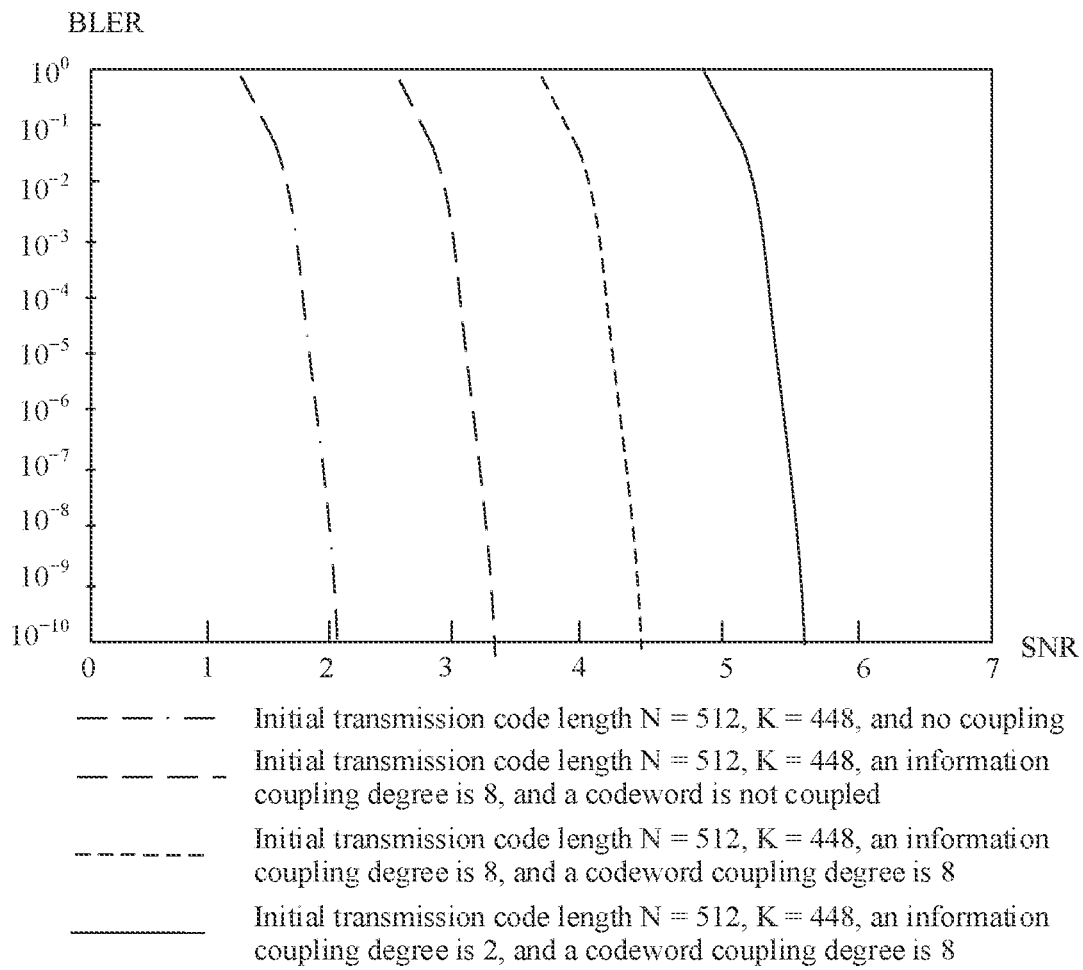
FIG. 21 is another schematic diagram of decoding performance according to an embodiment of this application.

The following describes decoding performance of a decoding method in this application with reference to FIG. 19 to FIG. 21.

FIG. 19 is a schematic diagram of decoding performance according to an embodiment of this application. Refer to FIG. 19. A horizontal axis indicates a signal-to-noise ratio (signal to noise ratio, SNR), and a vertical axis indicates a block error rate (Block Error Rate, BLER).

Refer to FIG. 19. When an initial transmission code length N=128, a supported maximum mother code length is 1024, a quantity K of information bits is 112, and no coupling exists, a performance curve is shown by a dashed line. When an initial transmission code length N=128, a supported maximum mother code length is 1024, a quantity of information bits is 112, an information coupling degree is 8, and a codeword is not coupled (an existing IF-HARQ mode), a performance curve is shown by another dashed line. When an initial transmission code length N=128, a supported maximum mother code length is 1024, a quantity K of information bits is 112, an information coupling degree is 8, and a codeword coupling degree is 8 (an existing IR-HARQ mode), a performance curve is shown by another dashed line. When an initial transmission code length N=128, a supported maximum mother code length is 1024, a quantity K of information bits is 112, an information coupling degree is 2, and a codeword coupling degree is 8, a performance curve is shown by a solid line.

FIG. 20 is another schematic diagram of decoding performance according to an embodiment of this application. Refer to FIG. 20. When an initial transmission code length N=256, a supported maximum mother code length is 2048, a quantity K of information bits is 224, and no coupling exists, a performance curve is shown by a dashed line. When an initial transmission code length N=256, a supported maximum mother code length is 2048, a quantity K of information bits is 224, an information coupling degree is 8, and a codeword is not coupled (an existing IF-HARQ mode), a performance curve is shown by another dashed line. When an initial transmission code length N=256, a supported maximum mother code length is 2048, a quantity K of information bits is 224, an information coupling degree is 8, and a codeword coupling degree is 8 (an existing IR-HARQ mode), a performance curve is shown by another dashed line. When an initial transmission code length N=256, a supported maximum mother code length is 2048, a quantity K of information bits is 224, an information coupling degree is 2, and a codeword coupling degree is 8, a performance curve is shown by a solid line.

FIG. 21 is another schematic diagram of decoding performance according to an embodiment of this application. Refer to FIG. 21. When an initial transmission code length N=512, a supported maximum mother code length is 4096, a quantity K of information bits is 448, and no coupling exists, a performance curve is shown by a dashed line. When an initial transmission code length N=512, a supported maximum mother code length is 4096, a quantity K of information bits is 448, an information coupling degree is 8, and a codeword is not coupled (an existing IF-HARQ mode), a performance curve is shown by another dashed line. When an initial transmission code length N=512, a supported maximum mother code length is 4096, a quantity K of information bits is 448, an information coupling degree is 8, and a codeword coupling degree is 8 (an existing IR-HARQ mode), a performance curve is shown by another dashed line. When an initial transmission code length N=512, a supported maximum mother code length is 4096, a quantity K of information bits is 448, an information coupling degree is 2, and a codeword coupling degree is 8, a performance curve is shown by a solid line.

Therefore, it can be learned that when a small information coupling degree and a proper codeword coupling degree are used, an optimal performance gain can be obtained, and encoding and decoding complexity are low.

Figure 22:
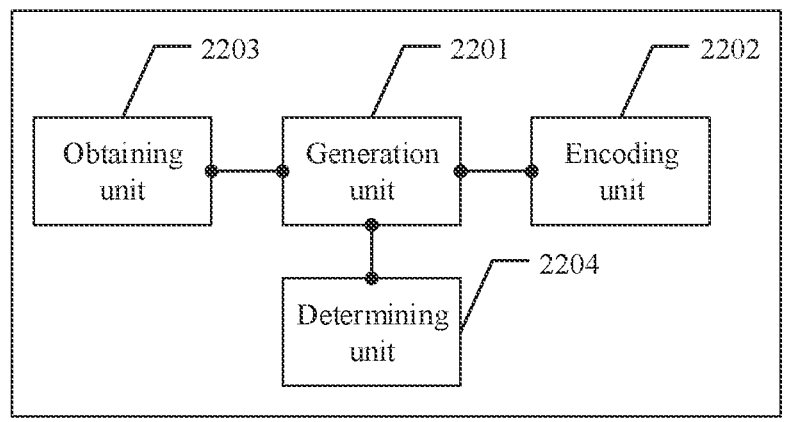
FIG. 22 is a schematic diagram of a structure of an encoding apparatus according to an embodiment of this application.

FIG. 22 is a schematic diagram of a structure of an encoding apparatus according to an embodiment of this application. Refer to FIG. 22. The encoding apparatus may include a generation unit 2201 and an encoding unit 2202. Optionally, the encoding apparatus further includes an obtaining unit 2203 and a determining unit 2204.

The generation unit 2201 is configured to generate an input vector, where the input vector includes T subblocks, a first information bit of a first subblock is obtained by replicating a second information bit of a second subblock, the first subblock and the second subblock are subblocks of the T subblocks, a sequence number of the first subblock is after a sequence number of the second subblock, and T is an integer greater than or equal to 2.

The encoding unit 2202 is configured to perform polar encoding on the input vector to obtain an encoded bit.

In a possible implementation, the obtaining unit 2203 is configured to obtain K to-be-encoded bits, where K is a positive integer.

In another possible implementation, the information bit of the first subblock is obtained by replicating the second information bit of the second subblock according to a mapping relationship, and the mapping relationship includes a mapping relationship between a subchannel that is of the first subblock and that carries the first information bit and a subchannel that is of the second subblock and that carries the second information bit.

In another possible implementation, the determining unit 2204 is configured to: determine, based on a first code rate allocation table, a quantity of first information bits carried by the first subblock; and determine, based on a preset first reliability sequence, a sequence number of the subchannel that is of the first subblock and that carries the first information bit, where the first reliability sequence includes a reliability ranking of subchannels of the first subblock, and the first information bit is obtained by replicating the second information bit of the second subblock.

In another possible implementation, the determining unit 2204 is configured to: determine, based on a second code rate allocation table, a quantity of information bits that are carried by a first coupling subblock and that are related to a second coupling subblock, where the first coupling subblock and the second coupling subblock each include at least two subblocks, the first coupling subblock is obtained by performing an exclusive OR operation on encoded bit sequences corresponding to the at least two subblocks, and the second coupling subblock is obtained by performing the exclusive OR operation on encoded bit sequences corresponding to the at least two subblocks; and determine, based on a preset second reliability sequence, a sequence number of a subchannel of an information bit that is carried by the first coupling subblock and that is related to the second coupling subblock, where the second reliability sequence includes a reliability ranking of subchannels of the first coupling subblock, and the information bit that is carried by the first coupling subblock and that is related to the second coupling subblock is obtained by replicating an information bit of the second coupling subblock.

In another possible implementation, the determining unit 2204 is configured to determine, based on a preset third reliability sequence, a sequence number of the subchannel that is of the first subblock and that carries the first information bit, where the third reliability sequence includes a reliability ranking of subchannels of the T subblocks, and the first information bit is obtained by replicating the second information bit of the second subblock.

In another possible implementation, the second subblock includes a third subblock, the first information bit of the first subblock is obtained by replicating an information bit of the third subblock, the first coupling subblock and the second coupling subblock include the same third subblock, and the third subblock includes a first subchannel; and the determining unit 2204 is further configured to:

when the first subchannel corresponds to a plurality of reliabilities, determine reliability of the first subchannel based on a first preset rule.

That the first subchannel corresponds to the plurality of reliabilities includes: The first subchannel corresponds to first reliability in the first coupling subblock, and the first subchannel corresponds to second reliability in the second coupling subblock.

The first preset rule includes: when the first reliability is greater than or equal to the second reliability, the first reliability is used as the reliability of the first subchannel; when a sequence number of the first coupling subblock is after a sequence number of the second coupling subblock, the first reliability is used as the reliability of the first subchannel; when the first reliability is less than or equal to the second reliability, the second reliability is used as the reliability of the first subchannel; or when a sequence number of the first coupling subblock is before a sequence number of the second coupling subblock, the second reliability is used as the reliability of the first subchannel.

In another possible implementation, the second subblock includes a fourth subblock and a fifth subblock, the first information bits of the first subblock are obtained by replicating an information bit of the fourth subblock and an information bit of the fifth subblock, the first reliability sequence indicates a reliability ranking of subchannels of each subblock, the fourth subblock includes a second subchannel, and the fifth subblock includes a third subchannel; and the determining unit 2204 is further configured to:

when the second subchannel and the third subchannel have same reliability, determine the reliability of the second subchannel and the reliability of the third subchannel based on a second preset rule.

That the second subchannel and the third subchannel have the same reliability includes: the second subchannel corresponds to third reliability in the first reliability sequence, and the third subchannel corresponds to the third reliability in the first reliability sequence.

The second preset rule includes: when a sequence number of the fourth subblock is after a sequence number of the fifth subblock, it is determined that the reliability of the second subchannel is greater than the reliability of the third subchannel; or when a sequence number of the fourth subblock is before a sequence number of the fifth subblock, it is determined that the reliability of the third subchannel is greater than the reliability of the second subchannel.

In another possible implementation, the second subblock includes M subblocks that are adjacent to the first subblock, or the second subblock includes M subblocks that are not adjacent to the first subblock, where M is an integer greater than or equal to 1 and less than T−1.

In another possible implementation, the determining unit 2204 is further configured to:

determine the M subblocks based on a preset mapping sequence, where the first information bit of the first subblock is obtained by directly replicating an information bit of the M subblocks, and the mapping sequence indicates a mapping relationship between the T subblocks.

In another possible implementation, when T=8, the mapping relationship includes:
a mapping relationship exists between a first subblock and a second subblock,
a mapping relationship exists between the second subblock and a third subblock,
a mapping relationship exists between the first subblock and a fourth subblock,
a mapping relationship exists between the first subblock and a fifth subblock,
a mapping relationship exists between the first subblock and a sixth subblock,
a mapping relationship exists between the first subblock and a seventh subblock, and
a mapping relationship exists between the first subblock and an eighth subblock; or
the mapping sequence of the T subblocks includes:
a mapping relationship exists between a first subblock and a second subblock,
a mapping relationship exists between the second subblock and a third subblock,
a mapping relationship exists between the third subblock and a fifth subblock,
a mapping relationship exists between the fifth subblock and a sixth subblock,
a mapping relationship exists between the sixth subblock and a seventh subblock, and
a mapping relationship exists between the seventh subblock and an eighth subblock; or
the mapping sequence of the T subblocks includes:
a mapping relationship exists between a first subblock and a second subblock,
a mapping relationship exists between the second subblock and a third subblock,
a mapping relationship exists between the third subblock and a fourth subblock,
a mapping relationship exists between the third subblock and a fifth subblock,
a mapping relationship exists between the fifth subblock and a sixth subblock,
a mapping relationship exists between the sixth subblock and a seventh subblock, and
a mapping relationship exists between the seventh subblock and an eighth subblock; or
the mapping sequence of the T subblocks includes:
a mapping relationship exists between a first subblock and a second subblock,
a mapping relationship exists between the second subblock and a third subblock,
a mapping relationship exists between the first subblock and a fourth subblock,
a mapping relationship exists between the third subblock and a fifth subblock,
a mapping relationship exists between the fifth subblock and a sixth subblock,
a mapping relationship exists between the sixth subblock and a seventh subblock, and
a mapping relationship exists between the seventh subblock and an eighth subblock.

In another possible implementation, the encoding unit 2202 is specifically configured to:
perform polar encoding on the input vector by using a first generator matrix.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer.

In another possible implementation, a code length of each of the T subblocks is the same as a dimension of the first generator matrix core.

In another possible implementation, the location relationship between two adjacent matrix blocks in the A matrix blocks is the same as the preset location relationship.

In another possible implementation, the at least two matrix blocks overlap.

In another possible implementation, the first generator matrix core is included on a first diagonal of the matrix block.

In another possible implementation, the plurality of first generator matrix cores in the matrix block are distributed in a lower triangular form.

In another possible implementation, distribution of the first generator matrix cores in the matrix block is the same as distribution of first elements of a second generator matrix core, a quantity of elements included in the second generator matrix core is the same as a quantity of matrix units included in the matrix block, and the matrix unit included in the matrix block is the first generator matrix core or a zero matrix.

In another possible implementation, the encoding unit 2202 is specifically configured to:

perform polar encoding on the input vector by using a first generator matrix.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2.

In this implementation, a codeword coupling degree is set by using the first generator matrix. With reference to the third aspect, an embodiment of this application provides a flexible code construction framework. In a code construction process, an appropriate information coupling degree and codeword coupling degree may be set to obtain a performance gain similar to a performance gain of an IR-HARQ. Encoding and decoding complexity, and the performance gain are balanced. A small information coupling degree may be set to reduce hardware overheads and avoid a switching network that has a complex information replication process.

In another possible implementation, the first submatrix block and the second submatrix block do not have an overlapping element.

In another possible implementation, a size of the second generator matrix is v×v, and an element of the second generator matrix satisfies: $a_{i,j}=a_{i+u,j+u}$, where i is an integer, j is an integer, v is a positive integer, u is an integer, $1 \le i < v$, $1 \le j < v$, $1 < i+u \le v$, and $1 < j+u \le v$.

In this possible implementation, when the second generator matrix satisfies $a_{i,j}=a_{i+u,j+u}$, the second generator matrix satisfies self-similarity. In this way, a codeword coupling degree can be set by using the first generator matrix. In a code construction process, an appropriate information coupling degree and codeword coupling degree may be set to obtain a performance gain similar to a performance gain of an IR-HARQ. Encoding and decoding complexity, and the performance gain are balanced.

In another possible implementation, elements of the second generator matrix are symmetrical along a secondary diagonal of the second generator matrix. It can be learned from this implementation that the elements of the second generator matrix are symmetrical along the diagonal of the second generator matrix. In this way, encoding complexity is low.

In another possible implementation, A is a minimum integer that enables a first condition to be satisfied, and the first condition is that a size of the first generator matrix is greater than or equal to a code length M of the T subblocks included in the input vector.

In another possible implementation, A satisfies the following relationship: $v+(A-2)*u < M \le v+(A-1)*u$.

v is a size of the second generator matrix, M is the code length M of the T subblocks included in the input vector, and M is an integer greater than 1.

Figure 23:
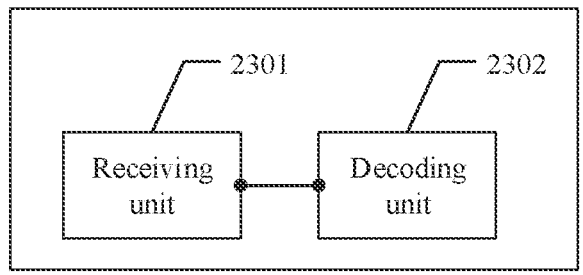
FIG. 23 is a schematic diagram of a structure of a decoding apparatus according to an embodiment of this application.

FIG. 23 is a schematic diagram of a structure of a decoding apparatus according to an embodiment of this application. Refer to FIG. 23. The decoding apparatus may include a receiving unit 2301 and a decoding unit 2302.

The receiving unit 2301 is configured to receive to-be-decoded bit information, where the to-be-decoded bit information includes information about a bit of a first subblock and information about a bit of a second subblock, the bit of the first subblock is obtained by replicating the bit of the second subblock, and a sequence number of the second subblock is after a sequence number of the first subblock.

The decoding unit 2302 is configured to perform polar decoding based on the to-be-decoded bit information to obtain a polar decoded bit.

In a possible implementation, that the bit of the first subblock is obtained by replicating the bit of the second subblock includes: obtaining a first information bit of the first subblock by replicating a second information bit of the second subblock according to a mapping relationship, where the mapping relationship includes a mapping relationship between a subchannel that is of the first subblock and that carries the first information bit and a subchannel that is of the second subblock and that carries the second information bit.

In another possible implementation, the decoding unit 2302 is specifically configured to:

perform polar decoding on the to-be-decoded bit information based on a first generator matrix and according to the mapping relationship, to obtain the polar decoded bit.

The first generator matrix is generated based on a second generator matrix, the second generator matrix includes at least two matrix blocks distributed based on a preset location relationship, the matrix block includes a plurality of first generator matrix cores, the first generator matrix includes A matrix blocks, a location relationship between two adjacent matrix blocks in the A matrix blocks is determined based on the preset location relationship, and A is a positive integer. The mapping relationship includes the mapping relationship between the subchannel that is of the first subblock and that carries the first information bit and the subchannel that is of the second subblock and that carries the second information bit, and T is an integer greater than or equal to 2.

In another possible implementation, the to-be-decoded bit information includes Q first log likelihood ratios LLR, and Q is a positive integer.

In another possible implementation, the Q first LLRs include P first LLR sequences, the first LLR sequence includes at least two first LLRs, and P is an integer greater than or equal to 2; and the decoding unit 2302 is specifically configured to:

determine P second LLR sequences corresponding to the P first LLR sequences, where one first LLR sequence corresponds to one subblock, and one second LLR sequence corresponds to one subblock;
  determine, based on a $P^{th}$ second LLR sequence to obtain a codeword decoding result of the $P^{th}$ subblock and an information decoding result of the $P^{th}$ subblock; and
  determine, based on at least one codeword decoding result of a subblock from a codeword decoding result of an $(i+1)^{th}$ subblock to the codeword decoding result of the $P^{th}$ subblock, at least one information decoding result of a subblock from an information decoding result of the $(i+1)^{th}$ subblock to the information decoding result of the $P^{th}$ subblock, and an $i^{th}$ second LLR sequence, a codeword decoding result of an $i^{th}$ subblock and an information decoding result of the $i^{th}$ subblock, where i is an integer ranging from 1 to P−1.

In another possible implementation, the location relationship between two adjacent matrix blocks in the A matrix blocks is the same as the preset location relationship.

In another possible implementation, the decoding unit 2302 is specifically configured to:

perform polar decoding on the to-be-decoded bit information based on a first generator matrix and according to the mapping relationship, to obtain the polar decoded bit.

The first generator matrix is generated based on a second generator matrix, the second generator matrix includes a first submatrix block that is located at the top-left corner of a second submatrix block, the second submatrix block is located at the bottom-right corner of the first generator matrix, the first submatrix block is the same as the second submatrix block, a distance between a first element of the first submatrix block and a second element of the second submatrix block is u in a diagonal direction of the second generator matrix, and u is an integer greater than or equal to 1. The first generator matrix includes A second generator matrices, the A second generator matrices are distributed along a diagonal (for example, the diagonal may be a primary diagonal) of the second generator matrix, a first submatrix block of a $(b+1)^{th}$ second generator matrix of the A second generator matrices overlaps a second submatrix block of a $b^{th}$ second generator matrix, b is an integer greater than or equal to 1, and T is an integer greater than or equal to 2. The mapping relationship includes the mapping relationship between the subchannel that is of the first subblock and that carries the first information bit and the subchannel that is of the second subblock and that carries the second information bit, and T is an integer greater than or equal to 2.

Figure 24:
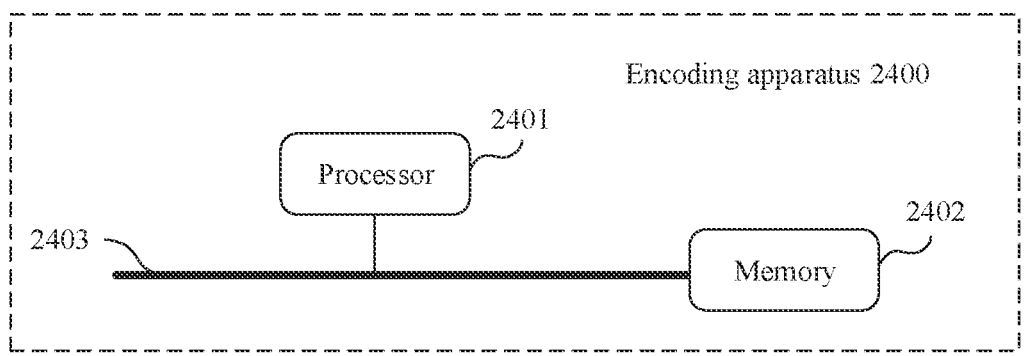
FIG. 24 is a schematic diagram of a structure of another encoding apparatus according to an embodiment of this application.

FIG. 24 is a schematic diagram of a hardware structure of an encoding apparatus according to an embodiment of this application. Refer to FIG. 24. The encoding apparatus 2400 may include a processor 2401 and a memory 2402.

The memory 2402 is configured to store a computer program, and may be further configured to store intermediate data.

The processor 2401 is configured to execute the computer program stored in the memory, to implement the steps in the foregoing encoding methods. For details, refer to related description in the foregoing method embodiments.

Optionally, the memory 2402 may be independent, or may be integrated with the processor 2401. In some implementations, the memory 2402 may even be located outside the encoding apparatus 2400.

When the memory 2402 is a component independent of the processor 2401, the encoding apparatus 2400 may further include a bus 2403 configured to connect the memory 2402 and the processor 2401.

Optionally, the encoding apparatus 2400 may further include a transmitter. For example, the transmitter is configured to send an encoded bit.

The encoding apparatus 2400 provided in this embodiment may be a terminal device or a network device, and may be configured to perform the foregoing encoding methods. Implementations and technical effects thereof are similar to those of the encoding methods. Details are not described herein again in this embodiment.

Figure 25:
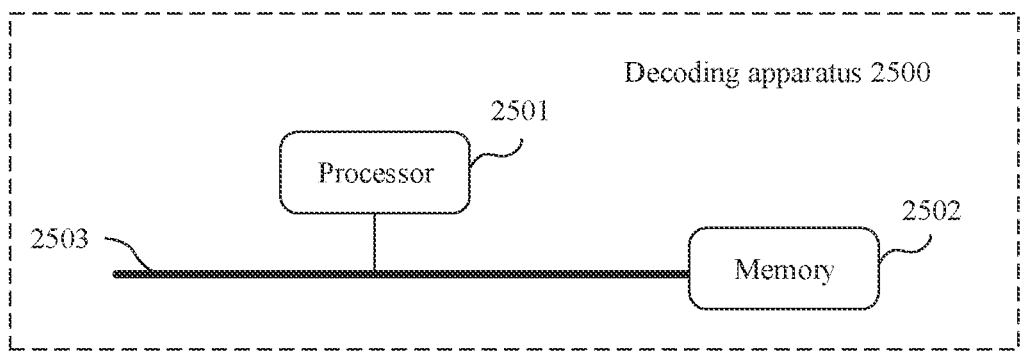
FIG. 25 is a schematic diagram of a structure of another decoding apparatus according to an embodiment of this application.

FIG. 25 is a schematic diagram of a hardware structure of a decoding apparatus according to an embodiment of this application. Refer to FIG. 25. The decoding apparatus 2500 may include a processor 2501 and a memory 2502.

The memory 2502 is configured to store a computer program, and may be further configured to store intermediate data.

The processor 2501 is configured to execute the computer program stored in the memory, to implement the steps in the foregoing decoding methods. For details, refer to related description in the foregoing method embodiments.

Optionally, the memory 2502 may be independent, or may be integrated with the processor 2501. In some implementations, the memory 2502 may even be located outside the decoding apparatus 2500.

When the memory 2502 is a component independent of the processor 2501, the decoding apparatus 2500 may further include a bus 2503 configured to connect the memory 2502 and the processor 2501.

Optionally, the decoding apparatus 2500 may further include a receiver. For example, the receiver is configured to receive polar encoded bit information.

The decoding apparatus 2500 provided in this embodiment may be a terminal device or a network device, and may be configured to perform the foregoing decoding methods. Implementations and technical effects thereof are similar to those of the decoding methods. Details are not described herein again in this embodiment.

Figure 26:
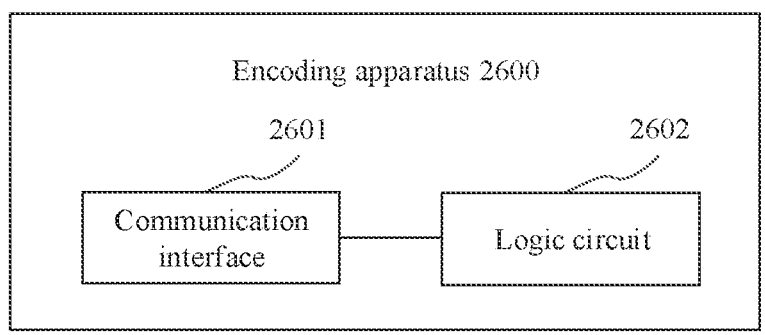
FIG. 26 is a schematic diagram of a structure of another encoding apparatus according to an embodiment of this application.

FIG. 26 is a schematic diagram of a structure of another encoding apparatus according to an embodiment of this application. Refer to FIG. 26. The encoding apparatus 2600 may include a communication interface 2601 and a logic circuit 2602.

Optionally, the communication interface 2601 may have a function of the obtaining unit 2203 in the embodiment shown in FIG. 22. The logic circuit 2602 may have functions of the generation unit 2201, the encoding unit 2202, and the determining unit 2204 in the embodiment shown in FIG. 22.

Optionally, the logic circuit 2602 may have a function of the processor 2401 in the embodiment shown in FIG. 24.

The logic circuit 2602 may be configured to perform the steps in the foregoing encoding method.

Optionally, the communication interface is further configured to output an encoded bit.

The encoding apparatus 2600 provided in this embodiment of this application may implement the technical solutions shown in the foregoing method embodiments.

Implementation principles and beneficial effects thereof are similar to those of the method embodiments. Details are not described herein again.

Figure 27:
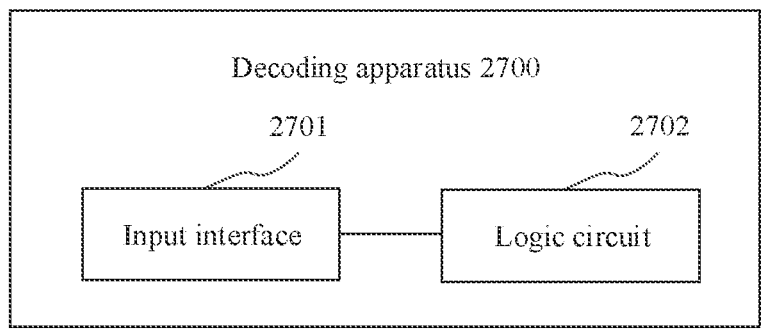
FIG. 27 is a schematic diagram of a structure of another decoding apparatus according to an embodiment of this application.

FIG. 27 is a schematic diagram of a structure of another decoding apparatus according to an embodiment of this application. Refer to FIG. 27. The decoding apparatus 2700 may include an input interface 2701 and a logic circuit 2702.

Optionally, the input interface 2701 may have a function of the receiving unit 2301 in the embodiment shown in FIG. 23. The logic circuit 2702 may have a function of the decoding unit 2302 in the embodiment shown in FIG. 23.

Optionally, the logic circuit 2702 may have a function of the processor 2501 in the embodiment in FIG. 25. The logic circuit 2702 may be configured to perform the steps in the foregoing decoding method.

Optionally, the decoding apparatus 2700 may further include an output interface. For example, the output interface may output a decoded bit.

The decoding apparatus 2700 provided in this embodiment of this application may implement the technical solutions shown in the foregoing method embodiments.

Implementation principles and beneficial effects thereof are similar to those of the method embodiments. Details are not described herein again.

An embodiment of this application further provides a storage medium. The storage medium includes a computer program, and the computer program is used to perform the foregoing encoding methods.

An embodiment of this application further provides a storage medium. The storage medium includes a computer program, and the computer program is used to perform the foregoing decoding method.

An embodiment of this application further provides a chip or an integrated circuit, including a memory and a processor.

The memory is configured to store program instructions, and may be further configured to store intermediate data.

The processor is configured to invoke the program instructions stored in the memory, to perform the foregoing encoding methods.

Optionally, the memory may be independent, or may be integrated with the processor. In some implementations, the memory may alternatively be located outside the chip or the integrated circuit.

An embodiment of this application further provides a chip or an integrated circuit, including a memory and a processor.

The memory is configured to store program instructions, and may be further configured to store intermediate data.

The processor is configured to invoke the program instruction stored in the memory, to perform the foregoing decoding methods.

Optionally, the memory may be independent, or may be integrated with the processor. In some implementations, the memory may alternatively be located outside the chip or the integrated circuit.

An embodiment of this application further provides a program product. The program product includes a computer program, the computer program is stored in a storage medium, and the computer program is used to perform the foregoing encoding methods.

An embodiment of this application further provides a program product. The program product includes a computer program, the computer program is stored in a storage medium, and the computer program is used to perform the foregoing decoding methods.

Methods or algorithm steps described in combination with the content disclosed in this embodiment of this application may be implemented by hardware, or may be implemented by a processor by executing software instructions. The software instruction may include a corresponding software module. The software module may be stored in a random access memory (Random Access Memory, RAM), a flash memory, a read-only memory (Read Only Memory, ROM), an erasable programmable read-only memory (Erasable Programmable ROM, EPROM), an electrically erasable programmable read-only memory (Electrically EPROM, EEPROM), a register, a hard disk, a removable hard disk, a compact disc read-only memory (CD-ROM), or any other form of storage medium that is well known in the art. For example, a storage medium is coupled to a processor, so that the processor can read information from the storage medium or write information into the storage medium. Certainly, the storage medium may be a component of the processor. The processor and the storage medium may be disposed in an ASIC. In addition, the ASIC may be located in a base station or a terminal. Certainly, the processor and the storage medium may exist in a receiving device as discrete components.

It should be understood that the processor may be a central processing unit (English: Central Processing Unit, CPU for short), or may be another general-purpose processor, a digital signal processor (English: Digital Signal Processor, DSP for short), an application-specific integrated circuit (English: Application Specific Integrated Circuit, ASIC for short), or the like. The general-purpose processor may be a microprocessor, or the processor may be any conventional processor or the like. The steps of the methods disclosed with reference to this application may be directly implemented by a hardware processor, or may be implemented by a combination of hardware and a software module in a processor.

The memory may include a high-speed RAM memory, or may include a non-volatile memory NVM such as at least one magnetic disk memory, or may include a USB flash drive, a removable hard disk, a read-only memory, a magnetic disk, an optical disc, or the like.

The bus may be an industry standard architecture (Industry Standard Architecture, ISA) bus, a peripheral component interconnect (Peripheral Component, PCI) bus, an extended industry standard architecture (Extended Industry Standard Architecture, EISA) bus, or the like. Buses may be classified into an address bus, a data bus, a control bus, and the like. For ease of representation, the bus in the accompanying drawings in this application is not limited to only one bus or only one type of bus.

The storage medium may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium accessible to a general-purpose or special-purpose computer.

In this application, "at least one" means one or more, and "a plurality of" means two or more. The term "and/or"

describes an association relationship for describing associated objects and indicates that three relationships may exist. For example, A and/or B may indicate the following cases: Only A exists, both A and B exist, and only B exists, where A and B may be singular or plural. The character "/" generally indicates an "or" relationship between the associated objects. "At least one of the following items (pieces)" or a similar expression thereof refers to any combination of these items, including a single item (piece) or any combination of a plurality of items (pieces). For example, at least one item (piece) of a, b, or c may indicate a, b, c, a and b, a and c, b and c, or a, b, and c, where a, b, and c may be singular or plural.

A person skilled in the art should be aware that in the foregoing one or more examples, functions described in embodiments of this application may be implemented by hardware, software, firmware, or any combination thereof. When the functions are implemented by software, the foregoing functions may be stored in a computer-readable medium or transmitted as one or more instructions or code in a computer-readable medium. The computer-readable medium includes a computer storage medium and a communication medium. The communication medium includes any medium that enables a computer program to be transmitted from one place to another. The storage medium may be any available medium accessible to a general-purpose or special-purpose computer.

In the several embodiments provided in this application, it should be understood that the disclosed device and method may be implemented in other manners. For example, the described device embodiment is merely an example. For example, division into the modules is merely logical function division and may be other division in an actual implementation. For example, a plurality of modules may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

The modules described as separate parts may or may not be physically separate, and parts displayed as modules may or may not be physical units, may be located in one location, or may be distributed on a plurality of network units. Some or all the modules may be selected based on an actual requirement to achieve the objectives of the solutions of embodiments.

In addition, function modules in embodiments of this application may be integrated into one processing unit, each of the modules may exist alone physically, or two or more modules are integrated into one unit. The unit formed by the modules may be implemented in a form of hardware, or may be implemented in a form of hardware in addition to a software functional unit.

What is claimed is:

1. A polar code encoding method, wherein the method comprises:
   generating, by a communications apparatus, an input vector, wherein the input vector comprises T subblocks, a first information bit of a first subblock is obtained by replicating a second information bit of a second subblock, the first subblock and the second subblock are comprised in the T subblocks, a sequence number of the first subblock is after a sequence number of the second subblock, and T is an integer greater than or equal to 2, wherein generating the input vector comprises:
   determining, based on a first code rate allocation table, a quantity of first information bits carried by the first subblock; and
   determining, based on a preset first reliability sequence, a sequence number of a subchannel that is comprised in the first subblock and that carries the first information bit, wherein the preset first reliability sequence comprises a reliability ranking of subchannels of the first subblock; and
   performing, by the communications apparatus, polar encoding on the input vector to obtain encoded bits.

2. The method according to claim 1, wherein the first information bit of the first subblock is obtained by replicating the second information bit of the second subblock according to a mapping relationship, and the mapping relationship is between a subchannel that is comprised in the first subblock and that carries the first information bit and a subchannel that is comprised in the second subblock and that carries the second information bit.

3. The method according to claim 1, wherein the method further comprises:
   determining, based on a second code rate allocation table, a quantity of information bits that are carried by a first coupling subblock and that are related to a second coupling subblock, wherein the first coupling subblock and the second coupling subblock each comprises at least two subblocks, the first coupling subblock is obtained by performing an exclusive OR operation on encoded bit sequences corresponding to the at least two subblocks comprised in the first coupling subblock, and the second coupling subblock is obtained by performing the exclusive OR operation on encoded bit sequences corresponding to the at least two subblocks comprised in the second coupling subblock; and
   determining, based on a preset second reliability sequence, a sequence number of a subchannel of an information bit that is carried by the first coupling subblock and that is related to the second coupling subblock, wherein the second reliability sequence comprises a reliability ranking of subchannels of the first coupling subblock.

4. The method according to claim 3, wherein the second subblock comprises a third subblock, the first information bit of the first subblock is obtained by replicating an information bit of the third subblock, the first coupling subblock and the second coupling subblock comprise the same third subblock, and the third subblock comprises a first subchannel, and wherein the method further comprises:
   when the first subchannel corresponds to a plurality of reliabilities, determining reliability of the first subchannel based on a first preset rule, wherein:
   that the first subchannel corresponds to a plurality of reliabilities comprises:
   the first subchannel corresponds to first reliability in the first coupling subblock, and the first subchannel corresponds to second reliability in the second coupling subblock; and
   the first preset rule comprises:
   when the first reliability is greater than or equal to the second reliability, the first reliability is used as the reliability of the first subchannel;
   when a sequence number of the first coupling subblock is after a sequence number of the second coupling subblock, the first reliability is used as the reliability of the first subchannel;
when the first reliability is less than or equal to the second reliability, the second reliability is used as the reliability of the first subchannel; or
when a sequence number of the first coupling subblock is before a sequence number of the second coupling subblock, the second reliability is used as the reliability of the first subchannel.

5. The method according to claim 1, wherein the method further comprises:
determining, based on a preset third reliability sequence, a sequence number of a subchannel that is comprised in the first subblock and that carries the first information bit, wherein the third reliability sequence comprises a reliability ranking of subchannels of the T subblocks.

6. The method according to claim 1, wherein the second subblock comprises a fourth subblock and a fifth subblock, the first information bits of the first subblock are obtained by replicating an information bit of the fourth subblock and an information bit of the fifth subblock, the preset first reliability sequence indicates a reliability ranking of subchannels of each subblock, the fourth subblock comprises a second subchannel, and the fifth subblock comprises a third subchannel, and wherein the method further comprises:
when the second subchannel and the third subchannel have same reliability, determining the reliability of the second subchannel and the reliability of the third subchannel based on a second preset rule, wherein:
that the second subchannel and the third subchannel have same reliability comprises:
the second subchannel corresponds to third reliability in the preset first reliability sequence, and the third subchannel corresponds to the third reliability in the preset first reliability sequence; and
the second preset rule comprises:
when a sequence number of the fourth subblock is after a sequence number of the fifth subblock, the reliability of the second subchannel is greater than the reliability of the third subchannel; or
when a sequence number of the fourth subblock is before a sequence number of the fifth subblock, the reliability of the third subchannel is greater than the reliability of the second subchannel.

7. The method according to claim 1, wherein the second subblock comprises M subblocks that are adjacent to the first subblock, or the second subblock comprises M subblocks that are not adjacent to the first subblock, wherein M is an integer greater than or equal to 1 and less than T−1.

8. The method according to claim 7, wherein the method further comprises:
determining the M subblocks based on a preset mapping sequence, wherein the first information bit of the first subblock is obtained by directly replicating an information bit of the M subblocks, and the mapping sequence indicates a mapping relationship between the T subblocks.

9. The method according to claim 1, wherein the performing, by the communications apparatus, polar encoding on the input vector to obtain encoded bits comprises:
performing the polar encoding on the input vector by using a first generator matrix;
wherein the first generator matrix is generated based on a second generator matrix, the second generator matrix includes at least two matrix blocks distributed based on a preset location relationship, a matrix block of the at least two matrix blocks includes a plurality of first generator matrix cores, the first generator matrix includes A matrix blocks, a location relationship between two adjacent matrix blocks in the A matrix blocks is determined based on the preset location relationship, and A is a positive integer.

10. A communications apparatus, wherein the communications apparatus comprises:
at least one processor; and
one or more memories coupled to the at least one processor and storing programming instructions, which when executed by the at least one processor, cause the communications apparatus to:
generate an input vector, wherein the input vector comprises T subblocks, a first information bit of a first subblock is obtained by replicating a second information bit of a second subblock, the first subblock and the second subblock are comprised in the T subblocks, a sequence number of the first subblock is after a sequence number of the second subblock, and T is an integer greater than or equal to 2, wherein generating the input vector comprises:
determining, based on a first code rate allocation table, a quantity of first information bits carried by the first subblock; and
determining, based on a preset first reliability sequence, a sequence number of a subchannel that is comprised in the first subblock and that carries the first information bit, wherein the preset first reliability sequence comprises a reliability ranking of subchannels of the first subblock; and
perform polar encoding on the input vector to obtain encoded bits.

11. The communications apparatus according to claim 10, wherein the first information bit of the first subblock is obtained by replicating the second information bit of the second subblock according to a mapping relationship, and the mapping relationship is between a subchannel that is comprised in the first subblock and that carries the first information bit and a subchannel that is comprised in the second subblock and that carries the second information bit.

12. The communications apparatus according to claim 10, wherein when programming instructions are executed by the at least one processor, cause the communications apparatus to:
determine, based on a second code rate allocation table, a quantity of information bits that are carried by a first coupling subblock and that are related to a second coupling subblock, wherein the first coupling subblock and the second coupling subblock each comprises at least two subblocks, the first coupling subblock is obtained by performing an exclusive OR operation on encoded bit sequences corresponding to the at least two subblocks comprised in the first coupling subblock, and the second coupling subblock is obtained by performing the exclusive OR operation on encoded bit sequences corresponding to the at least two subblocks comprised in the second coupling subblock; and
determine, based on a preset second reliability sequence, a sequence number of a subchannel of an information bit that is carried by the first coupling subblock and that is related to the second coupling subblock, wherein the second reliability sequence comprises a reliability ranking of subchannels of the first coupling subblock.

13. The communications apparatus according to claim 10, wherein when programming instructions are executed by the at least one processor, cause the communications apparatus to:

determine, based on a preset third reliability sequence, a sequence number of a subchannel that is comprised in the first subblock and that carries the first information bit, wherein the third reliability sequence comprises a reliability ranking of subchannels of the T subblocks.

14. The communications apparatus according to claim 10, wherein the second subblock comprises M subblocks that are adjacent to the first subblock, or the second subblock comprises M subblocks that are not adjacent to the first subblock, wherein M is an integer greater than or equal to 1 and less than T−1.

15. The communications apparatus according to claim 10, wherein performing the polar encoding on the input vector to obtain encoded bits comprises:
    performing the polar encoding on the input vector by using a first generator matrix;
    wherein the first generator matrix is generated based on a second generator matrix, the second generator matrix includes at least two matrix blocks distributed based on a preset location relationship, a matrix block of the at least two matrix blocks includes a plurality of first generator matrix cores, the first generator matrix includes A matrix blocks, a location relationship between two adjacent matrix blocks in the A matrix blocks is determined based on the preset location relationship, and A is a positive integer.

16. A non-transitory computer-readable storage medium, wherein the computer-readable storage medium comprises a computer program, and when the computer program is executed by a communication apparatus, cause the communication apparatus to:
    generate an input vector, wherein the input vector comprises T subblocks, a first information bit of a first subblock is obtained by replicating a second information bit of a second subblock, the first subblock and the second subblock are comprised in the T subblocks, a sequence number of the first subblock is after a sequence number of the second subblock, and T is an integer greater than or equal to 2, wherein generating the input vector comprises:
        determining, based on a first code rate allocation table, a quantity of first information bits carried by the first subblock; and
        determining, based on a preset first reliability sequence, a sequence number of a subchannel that is comprised in the first subblock and that carries the first information bit, wherein the preset first reliability sequence comprises a reliability ranking of subchannels of the first subblock; and
    perform polar encoding on the input vector to obtain encoded bits.

17. The non-transitory computer-readable storage medium according to claim 16, wherein the first information bit of the first subblock is obtained by replicating the second information bit of the second subblock according to a mapping relationship, and the mapping relationship is between a subchannel that is comprised in the first subblock and that carries the first information bit and a subchannel that is comprised in the second subblock and that carries the second information bit.

18. The non-transitory computer-readable storage medium according to claim 16, wherein when programming instructions are executed by the communication apparatus, cause the communication apparatus to:
    determine, based on a second code rate allocation table, a quantity of information bits that are carried by a first coupling subblock and that are related to a second coupling subblock, wherein the first coupling subblock and the second coupling subblock each comprises at least two subblocks, the first coupling subblock is obtained by performing an exclusive OR operation on encoded bit sequences corresponding to the at least two subblocks comprised in the first coupling subblock, and the second coupling subblock is obtained by performing the exclusive OR operation on encoded bit sequences corresponding to the at least two subblocks comprised in the second coupling subblock; and
    determine, based on a preset second reliability sequence, a sequence number of a subchannel of an information bit that is carried by the first coupling subblock and that is related to the second coupling subblock, wherein the second reliability sequence comprises a reliability ranking of subchannels of the first coupling subblock.

19. The non-transitory computer-readable storage medium according to claim 16, wherein when programming instructions are executed by the communication apparatus, cause the communication apparatus to:
    determine, based on a preset third reliability sequence, a sequence number of a subchannel that is comprised in the first subblock and that carries the first information bit, wherein the third reliability sequence comprises a reliability ranking of subchannels of the T subblocks.

20. The non-transitory computer-readable storage medium according to claim 16, wherein performing the polar encoding on the input vector to obtain encoded bits comprises:
    performing the polar encoding on the input vector by using a first generator matrix;
    wherein the first generator matrix is generated based on a second generator matrix, the second generator matrix includes at least two matrix blocks distributed based on a preset location relationship, a matrix block of the at least two matrix blocks includes a plurality of first generator matrix cores, the first generator matrix includes A matrix blocks, a location relationship between two adjacent matrix blocks in the A matrix blocks is determined based on the preset location relationship, and A is a positive integer.

* * * * *

UNITED STATES PATENT AND TRADEMARK OFFICE
CERTIFICATE OF CORRECTION

| | | |
|---|---|---|
| PATENT NO. | : 12,074,713 B2 | Page 1 of 1 |
| APPLICATION NO. | : 18/067513 | |
| DATED | : August 27, 2024 | |
| INVENTOR(S) | : Huazi Zhang et al. | |

It is certified that error appears in the above-identified patent and that said Letters Patent is hereby corrected as shown below:

On the Title Page

In Column 2 (Item (57) Abstract), In Line 1, After "disclose" delete "a".

Signed and Sealed this
Nineteenth Day of November, 2024

Katherine Kelly Vidal
*Director of the United States Patent and Trademark Office*